US007535042B2

(12) United States Patent
Rhodes

(10) Patent No.: US 7,535,042 B2
(45) Date of Patent: May 19, 2009

(54) PIXEL CELL WITH A CONTROLLED OUTPUT SIGNAL KNEE CHARACTERISTIC RESPONSE

(75) Inventor: Howard E. Rhodes, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 421 days.

(21) Appl. No.: 10/881,525

(22) Filed: Jul. 1, 2004

(65) Prior Publication Data

US 2006/0001060 A1 Jan. 5, 2006

(51) Int. Cl.
*H01L 31/113* (2006.01)

(52) U.S. Cl. ......................... 257/290; 257/292; 257/80; 257/291; 257/293; 257/461; 257/463; 257/458

(58) Field of Classification Search ................. 257/290, 257/292, 80, 291, 293, 461, 462, 463, 458
See application file for complete search history.

(56) References Cited

U.S. PATENT DOCUMENTS 6,140,630 A 10/2000 Rhodes
6,204,524 B1 3/2001 Rhodes
6,310,366 B1 10/2001 Rhodes et al.
6,326,652 B1 12/2001 Rhodes
6,333,205 B1 12/2001 Rhodes
6,376,868 B1 4/2002 Rhodes
2006/0071254 A1* 4/2006 Rhodes ....................... 257/292

* cited by examiner

*Primary Examiner*—Lynne A. Gurley
*Assistant Examiner*—Samuel A Gebremariam
(74) *Attorney, Agent, or Firm*—Dickstein Shapiro LLP

(57) ABSTRACT

A pixel cell with controlled leakage is formed by modifying the location and gate profile of a high dynamic range (HDR) transistor. The HDR transistor may have the gate profile of a transfer gate or a reset gate. The HDR transistor may be located on a side of the photodiode that is the same, opposite to, or perpendicular to the transfer gate. The leakage through the HDR transistor may be controlled by modifying the photodiode implants around the transistor. The photodiode implants at the HDR transistor may be placed similarly to the implants at the transfer gate. However, when the photodiode implants are moved away from the HDR transistor, leakage is reduced. When the photodiode implants are moved farther under the HDR transistor, leakage is increased to the extent desirable. The leakage through the HDR transistor may also be controlled by applying a voltage across the transistor.

57 Claims, 56 Drawing Sheets

PIXEL CELL WITH A CONTROLLED OUTPUT SIGNAL KNEE CHARACTERISTIC RESPONSE

FIELD OF THE INVENTION

The present invention relates to the field of semiconductor devices and, in particular, to a pixel cell transistor that improves dynamic range, and provides anti-blooming properties for the cell.

BACKGROUND OF THE INVENTION

A CMOS imager circuit includes a focal plane array of pixel cells, each cell includes a photosensor, for example, a photogate, photoconductor or a photodiode overlying a substrate for producing a photo-generated charge in a doped region of the substrate. A readout circuit is provided for each pixel cell and includes at least a source follower transistor and a row select transistor for coupling the source follower transistor to a column output line. The pixel cell also typically has a floating diffusion node, connected to the gate of the source follower transistor. Charge generated by the photosensor is sent to the floating diffusion region. The imager may also include a transistor for transferring charge from the photosensor to the floating diffusion node and another transistor for resetting the floating diffusion region node to a predetermined charge level prior to charge transference.

In a CMOS imager, the active elements of a pixel cell, for example a four transistor pixel, perform the necessary functions of (1) photon to charge conversion; (2) transfer of charge to the floating diffusion node; (3) resetting the floating diffusion node to a known state before the transfer of charge to it; (4) selection of a pixel cell for readout; and (5) output and amplification of a signal representing a reset voltage and a pixel signal voltage based on the photo converted charges. The charge at the floating diffusion node is converted to a pixel output voltage by a source follower output transistor.

FIG. 1 illustrates a block diagram of a CMOS imager device 308 having a pixel array 240 with each pixel cell being constructed as described above. Pixel array 240 comprises a plurality of pixels arranged in a predetermined number of columns and rows. The pixels of each row in array 240 are all turned on at the same time by a row select line, and the pixels of each column are selectively output by respective column select lines. A plurality of rows and column lines are provided for the entire array 240. The row lines are selectively activated by the row driver 245 in response to row address decoder 255 and the column select lines are selectively activated by the column driver 260 in response to column address decoder 270. Thus, a row and column address is provided for each pixel.

The CMOS imager is operated by the control circuit 250 which controls address decoders 255, 270 for selecting the appropriate row and column lines for pixel readout, and row and column driver circuitry 245, 260 which apply driving voltage to the drive transistors of the selected row and column lines. The pixel column signals, which typically include a pixel reset signal Vrst and a pixel image signal Vsig for each pixel are read by sample and hold circuitry 261, 262 associated with the column device 260. A differential signal Vrst-Vsig is produced for each pixel which is amplified and digitized by analog-to-digital converter 275. The analog to digital converter 275 converts the analog pixel signals received from the column driver 260 in its associated sample/hold circuits 261, 262 to digital signals which are fed to an image processor 280 to form a digital image.

Exemplary CMOS imaging circuits, processing steps thereof, and detailed descriptions of the functions of various CMOS elements of an imaging circuit are described, for example, in U.S. Pat. No. 6,140,630 to Rhodes, U.S. Pat. No. 6,376,868 to Rhodes, U.S. Pat. No. 6,310,366 to Rhodes et al., U.S. Pat. No. 6,326,652 to Rhodes, U.S. Pat. No. 6,204,524 to Rhodes, and U.S. Pat. No. 6,333,205 to Rhodes. The disclosures of each of the forgoing are hereby incorporated by reference herein in their entirety.

A schematic diagram of an exemplary CMOS pixel four-transistor (4T) pixel cell 10 is illustrated in FIG. 2. The four transistors include a reset transistor 32, a source follower transistor 34, a row select transistor 36 and a transfer gate 30. A photosensor 26 converts incident light into a charge. A floating diffusion region 28 receives charge from the photosensor 26 through the transfer gate 30 and is connected to the reset transistor 32 and the source follower transistor 34. The source follower transistor 34 outputs a signal proportional to the charge accumulated in the floating diffusion region 28 to a sampling circuit when the row select transistor 36 is turned on. The reset transistor 32 resets the floating diffusion region 28 to a known potential prior to transfer of charge from the photosensor 26. The photosensor 26 may be a photodiode, a photogate, or a photoconductor. If a photodiode is employed, the photodiode may be formed below a surface of the substrate and may be a buried p-n-p photodiode, buried n-p-n photodiode, a buried p-n photodiode, or a buried n-p photodiode, among others.

Image sensors, such as an image sensor employing the conventional pixel cell 10, have a characteristic light dynamic range. Light dynamic range refers to the range of incident light that can be accommodated by an image sensor in a single frame of pixel data. It is desirable to have an image sensor with a high light dynamic range to image scenes that generate high light dynamic range incident signals, such as indoor rooms with windows to the outside, outdoor scenes with mixed shadows and bright sunshine, night-time scenes combining artificial lighting and shadows, and many others.

The electrical dynamic range for an image sensor is commonly defined as the ratio of its largest non-saturating signal to the standard deviation of the noise under dark conditions. The electrical dynamic range is limited on an upper end by the charge saturation level of the sensor, and on a lower end by noise imposed limitations and/or quantization limits of the analog to digital converter used to produce the digital image. When the light dynamic range of an image sensor is too small to accommodate the variations in light intensities of the imaged scene, e.g. by having a low light saturation level, the full range of the image scene is not reproduced. The illumination-voltage profile of the conventional pixel 10 is typically linear as shown in FIG. 40A, which illustrates an illumination v. voltage graph of a prior art pixel cell. A pixel cell's maximum voltage $V_{max}$ may be reached at a relatively low level of illumination $I_{max}$ which causes the pixel cell to be easily saturated, thus limiting the dynamic range of the pixel. The relationship between electrical dynamic range and light dynamic range is shown in FIGS. 40A and 40B.

When the incident light captured and converted into a charge by the photosensor during an integration period is greater than the capacity of the photosensor, excess charge may overflow and be transferred to adjacent pixels. This undesirable phenomenon is known as blooming and results in a bright spot in the output image. Thus, there is a desire and need for a pixel cell having improved saturation response and lower potential for blooming.

BRIEF SUMMARY OF THE INVENTION

Embodiments of the present invention provide a pixel cell capable of reaching a higher level of illumination before its maximum output voltage is reached. The pixel cell has controlled photosensor leakage due to an additional transistor in the pixel cell which drains some of the charge generated by the photosensor away from the photosensor during an integration period. This prevents the photosensor from becoming over-saturated and excess charges from overflowing to adjacent pixels.

The HDR transistor alters the pixel output signal characteristic curve and can increase the dynamic range of the pixel cell.

The HDR transistor may also be used as a global shutter gate which enables independent reseting of the photosensor.

The HDR transistor may have the same doping profile as a transfer gate of a pixel cell, or it may have a doping profile resembling a reset gate of a pixel cell. However, if the transistor is used as a global shutter, it may be desirable that it have a doping profile resembling a transfer gate.

In all aspects of the invention, the extent to which leakage occurs through the HDR transistor is controlled by modifying the location of the HDR transistor with respect to the photosensor and the implant conditions around the HDR transistor gate.

BRIEF DESCRIPTION OF THE DRAWINGS

These and other features and advantages of the invention will be better understood from the following detailed description, which is provided in connection with the accompanying drawings.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The term "substrate" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The term "pixel" refers to a picture element unit cell containing a photosensor and transistors for converting light radiation to an electrical signal. For purposes of illustration, a representative pixel is illustrated in the figures and description herein and, typically, fabrication of all pixels in an imager will proceed simultaneously in a similar fashion.

Figure 3:
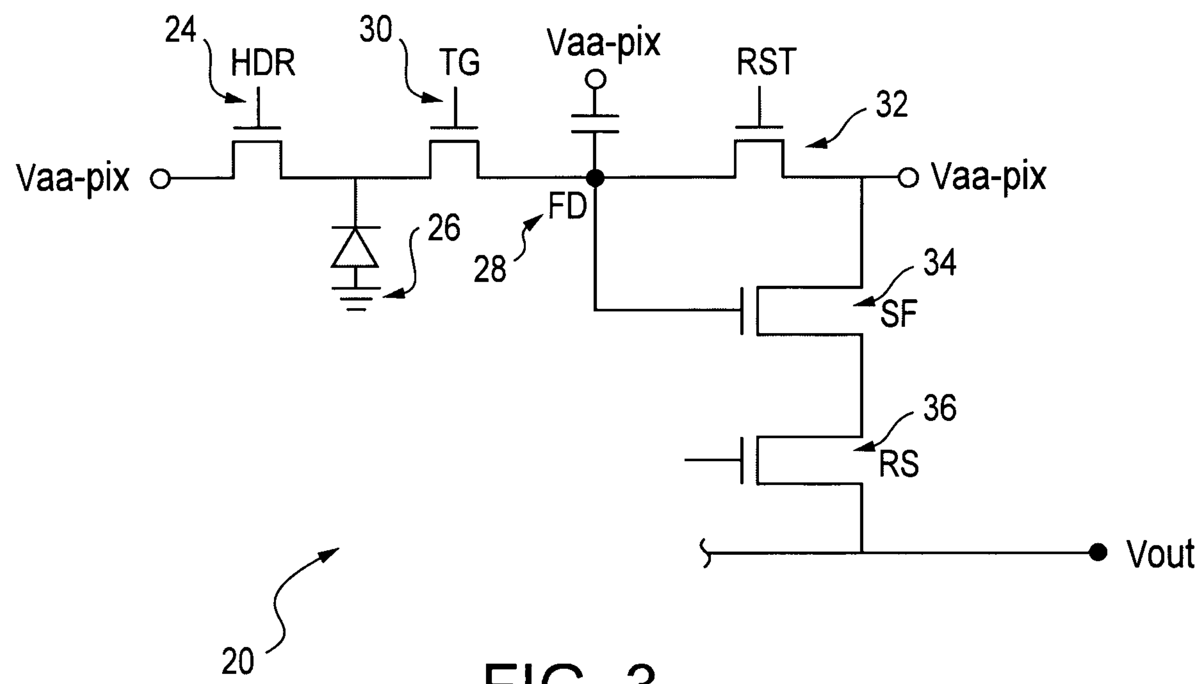
FIG. 3 is a schematic diagram of an exemplary five-transistor (5T) pixel of the present invention.

Referring now to the drawings, where like elements are designated by like reference numerals, FIG. 3 illustrates a schematic diagram of an exemplary five-transistor (5T) pixel 20 first circuit embodiment of the present invention. HDR transistor 24 is provided to leak away excess charge from the photosensor 26. A source terminal of the HDR transistor 24 is connected to the array pixel voltage $V_{aa-pix}$ and is designed to permit leakage from the photosensor 26 when the photosensor 26 is at or near saturation. The degree of leakage can be controlled by tailoring the leakage, the threshold voltage characteristics of transistor 24 or the voltage applied to the gate of the HDR transistor.

Figure 40A:
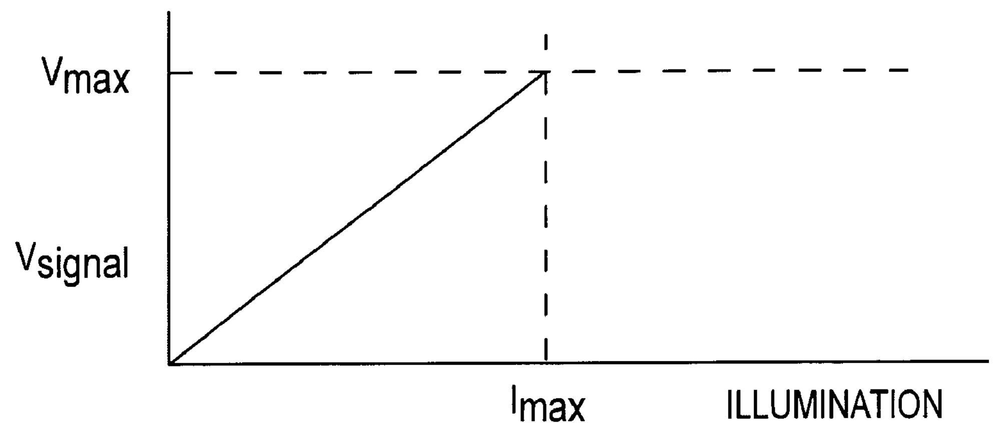
FIG. 40A is an illumination v. voltage graph of a pixel cell of prior art.
Figure 40B:
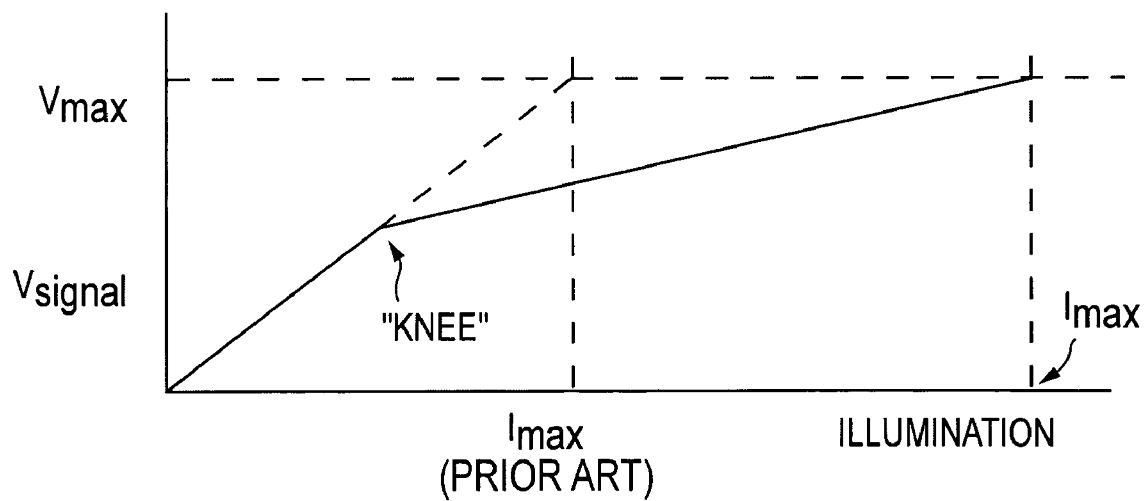
FIG. 40B is an illumination v. voltage graph of a pixel cell of the present invention.

In one operational aspect, the HDR transistor operates by creating a "knee" in the illumination-voltage profile of the device, increasing the light dynamic range of the pixel. FIG. 40B illustrates a pixel cell illumination v. output voltage graph in accordance with a first embodiment. The term "knee" reflects the fact that the "knee" creates an angle in the illumination-voltage profile, such that the maximum saturation voltage is reached at a greater level of illumination that of the pixel cell of prior art, as shown in FIG. 40A.

In another operational aspect, the HDR transistor acts as a shutter gate or anti-blooming gate. During an integration period, the HDR transistor is gated off. The HDR transistor may have a gate voltage above 0.0 V applied to it during this time to allow a small amount of charge to leak through it. At the end of the signal readout, a voltage of greater than 0.7 V, or the threshold voltage $V_t$ of the HDR transistor, is applied to it for a short pulse period, allowing any residual charge to be drained out of the photosensor, through the HDR transistor, and into a charge collection region.

Prior to integration of charge in the photodiode, the HDR transistor may be turned on by applying a voltage to the HDR gate which is greater than the $V_t$ of the HDR transistor. In this manner, charge can be drained out of the photodiode. At the start of the integration period, the HDR transistor is turned off, allowing charge to accumulate in the photodiode. In this manner, the HDR transistor can act as a global shutter controlling the integration of all photodiodes. The HDR transistor is turned off to allow integration of the photogenerated charge. If the off voltage applied to the HDR transistor is at zero volts or a positive voltage, typically less than the $V_t$ of the HDR transistor, then this transistor also acts as an anti-blooming gate. That is, under high illumination conditions, the photodiode will fill with charge and drain through the HDR transistor to the $V_{aa}$ drain.

The HDR transistor 24 may have a size and doping profile which is the same as a transfer transistor 30 or a reset transistor 32. The transfer transistor 30 operates in a known manner to transfer charges from a photosensor, shown as a photodiode 26, to a floating diffusion, shown as a charge storage node 28. The reset transistor 32 operates in a known manner to reset node 28 prior to a charge transfer. When the HDR transistor 24 has the same doping profile as either the transfer gate 30 or the reset transistor 32 of the same pixel cell, the benefit is ease of construction. That is, both the HDR transistor 24 and the transfer gate 30 or the HDR transistor 24 and the reset transistor 32 may be formed using the same masking steps. Therefore, a separate set of masking steps may not be necessary for the formation of the HDR transistor 24.

The doping profiles of the transfer gate 30 and the reset transistor 32 may include a "punch-through" protection implant on one side (or, in the case of the reset transistor 32, both sides) which allows the transistors to maintain better control of their channels. The doping profiles of the transfer gate 30 and the reset transistor 32 may also include a single lightly doped implant on one side of the gate stack (or, in the case of the reset transistor 32, both sides). The transfer gate 30 has an asymmetrical channel, with a floating diffusion region 28 comprising either a single lightly doped implant or a punch-through protection implant on one side of the gate stack and a photodiode 26 on the other side of the gate stack. The reset transistor 32 may have a symmetrical channel with either single lightly doped implants or punch-through protection implants on both sides of the gate stack. Alternatively, the reset transistor 32 may have an asymmetrical channel with a single lightly doped implant on one side of the gate stack and a punch-through protection implant on the other side of the gate stack. The remainder of the pixel 20 contains a source follower transistor 34 and a row select transistor 36, similar to the conventional four-transistor (4T) pixel.

Figure 4:
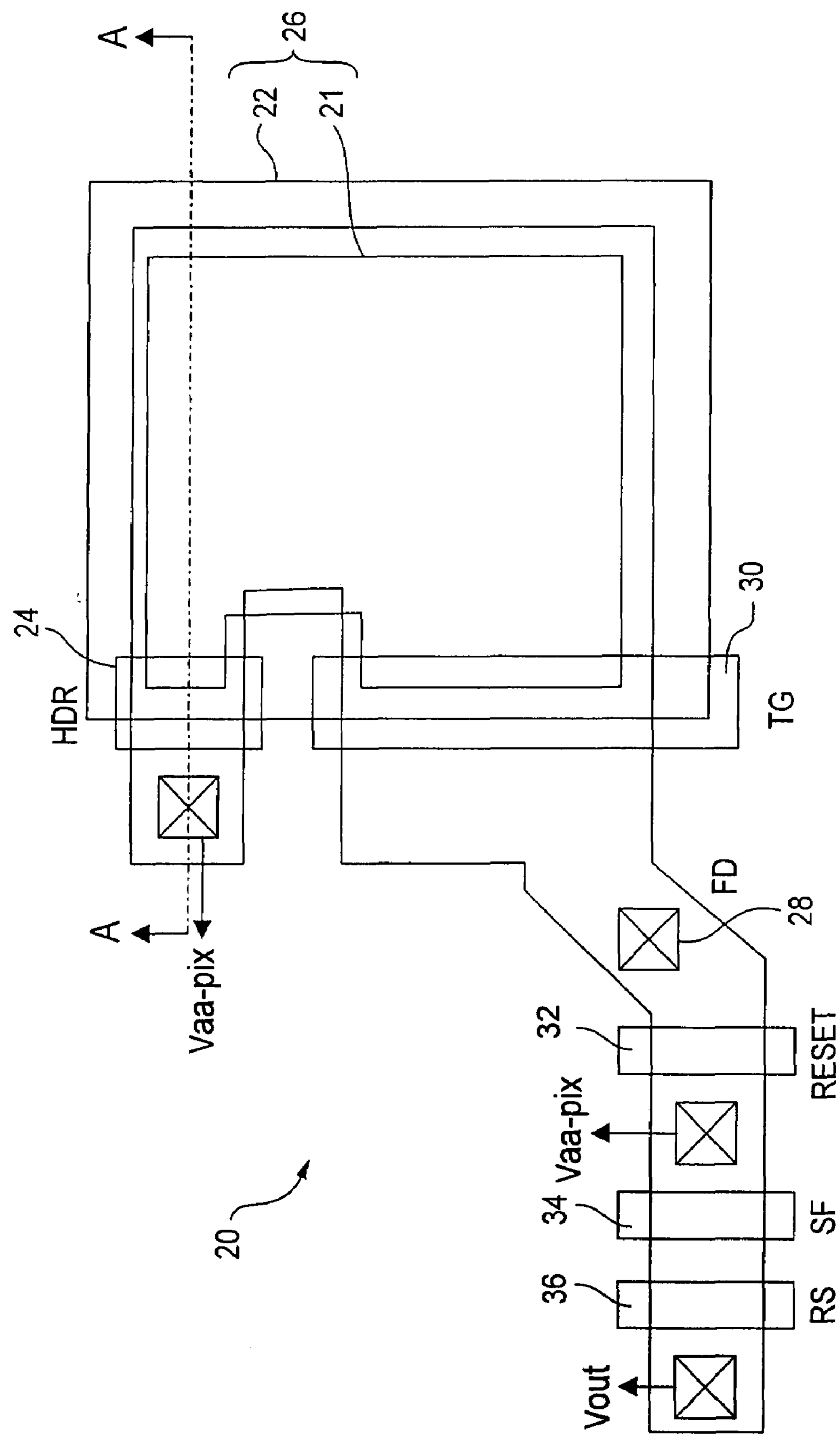
FIG. 4 is a plan view of a pixel cell according to an embodiment of the present invention.
Figure 5A:
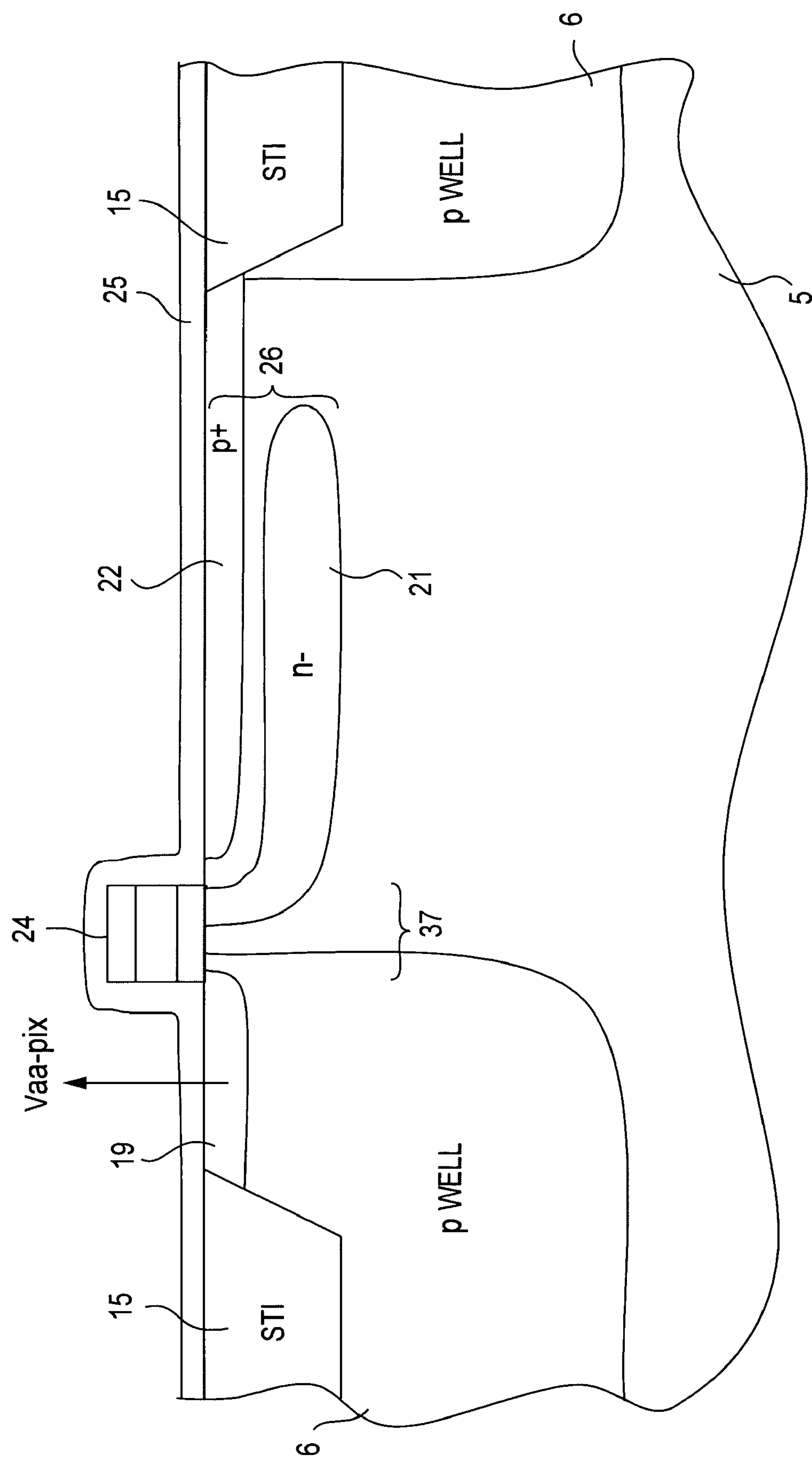
FIGS. 5*a-c* are cross sections of the pixel cells of FIGS. 4 and 35 having various implants and insulating layers, taken along line A-A and E-E, respectively.
Figure 5B:
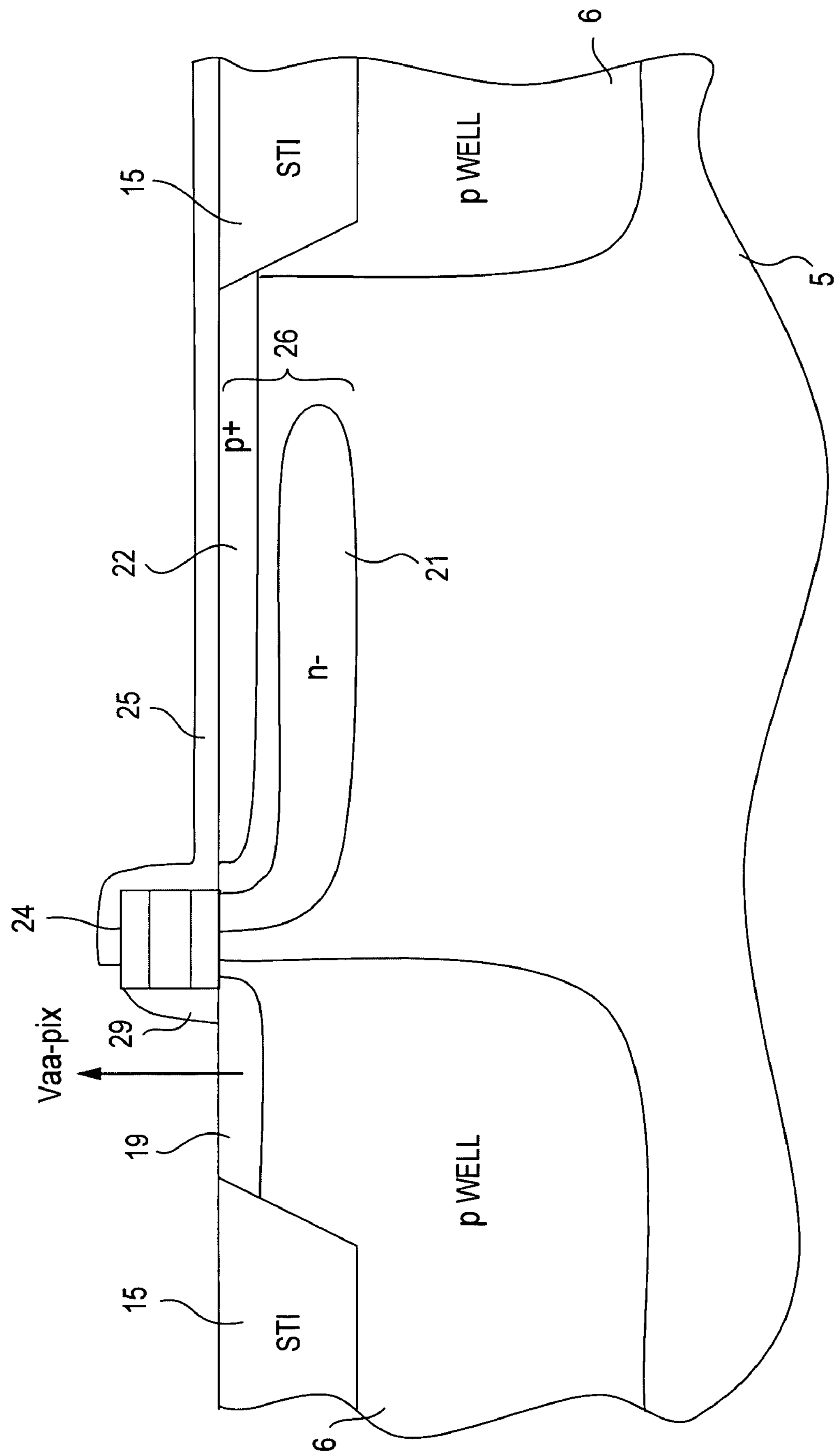
Figure 5C:
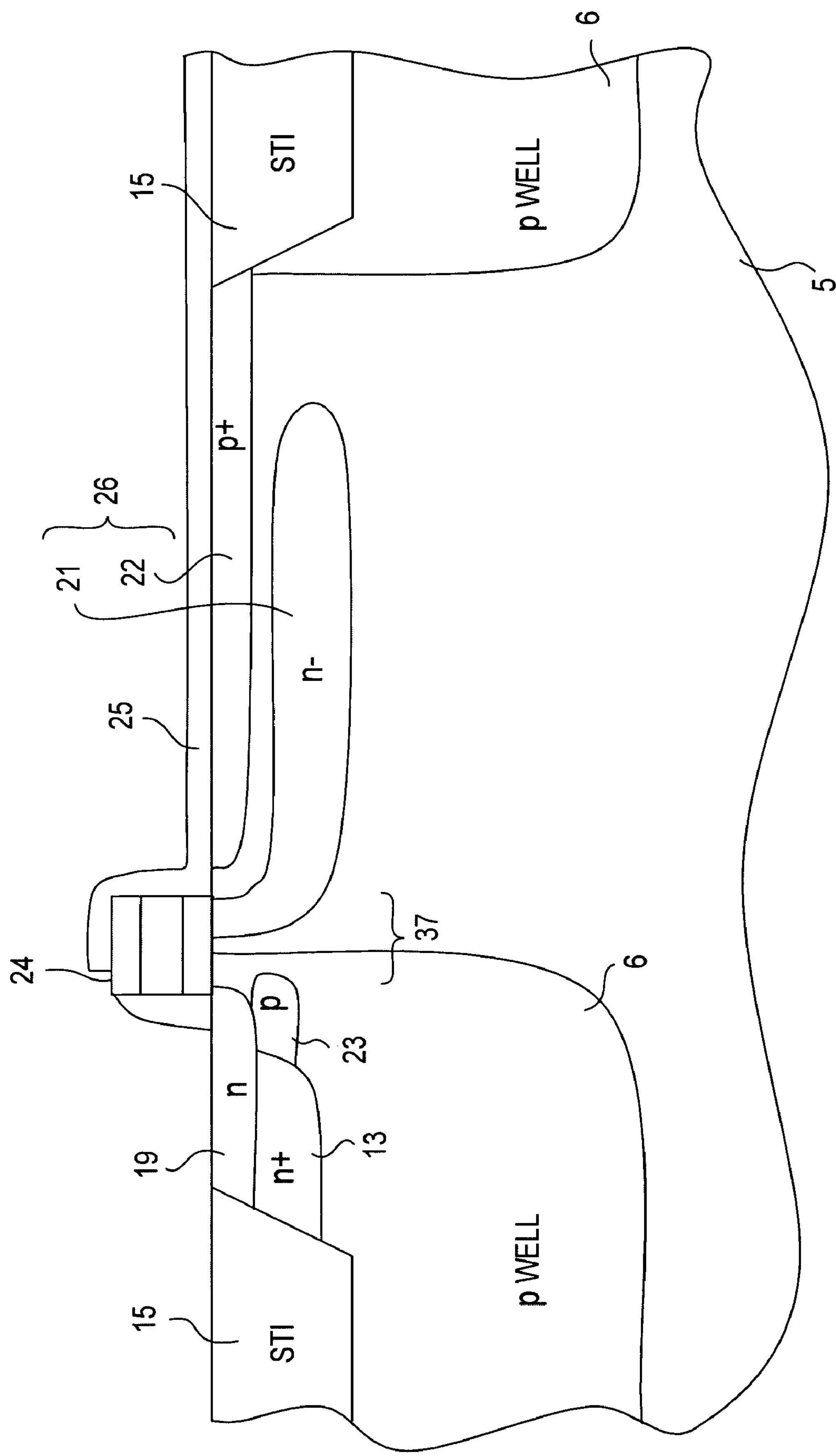

FIG. 4 illustrates a plan view of one embodiment of the present invention, pixel cell 20. In the illustrated embodiment, the HDR transistor 24 is located on the same side of the photosensor 26 as the transfer gate 30. Photosensor 26 comprises a n-layer 21 and an overlying layer 22. FIGS. 5*a* to 5*c* are cross sectional views of the pixel cell 20 taken along line A-A. FIGS. 5*a* to 5*c* depict various doping profiles that may be similar to the transfer gate 30 or the reset transistor 32, whichever profile provides the desired channel characteristics for the HDR transistor 24. The n-layer 21 of the photosensor 26 of FIG. 4 lies underneath the overlying layer 22, as shown in cross sections FIGS. 5*a* to 5*c*.

A substrate 5 is provided with a first conductivity type. For the purposes of illustration, the first conductivity type is p-type. Field oxide regions 15 surround and isolate the pixel cell 20, forming shallow trench isolation (STI) regions. As described above, photosensor 26 is a pinned buried photodiode comprising a n-layer 21 with a second conductivity type (e.g., n-type) and an overlying layer 22 with a first conductivity type (e.g., p-type).

Turning now to FIG. 5*a*, the HDR transistor 24 has the photosensor 26 on a first side of the gate stack and a charge collection region 19 of a second conductivity type (e.g., n-type) comprising a single lightly doped implant on a second side of the gate stack connects the HDR transistor 24 to the array pixel voltage $V_{aa-pix}$. The single lightly doped implant on the second side of the HDR transistor 24 may be the same implant as either the transfer gate 30 or the reset transistor 32 of the pixel cell 20, and thus may be simultaneously formed. The insulating layer 25 is blanket deposited over the photosensor 26, HDR transistor 24, and the charge collection region 19. FIG. 5*b* illustrates the HDR transistor 24 having a charge collection region 19 with a single lightly doped implant as illustrated in FIG. 5*a*. However the insulating layer 25 is first blanket deposited, and then etched over the HDR transistor 24. A spacer wall 29 is formed on the charge collection region 19 side of the HDR transistor 24.

Turning now to FIG. 5*c*, the HDR transistor 24 has the photosensor 26 comprising a n-type layer 21 and an overlying layer 22 on one side of the gate stack and a charge collection region 19 and a highly-doped drain region 13 of a second conductivity type (e.g., n-type), as well as a punch-through protection implant 23 of a first conductivity type (e.g., p-type), on a second side of the gate stack. The punch-through protection implant 23 lies between the photosensor 26 and the highly-doped drain region 13. The punch-through protection implant on the second side of the HDR transistor 24 may be the same implant as either the transfer gate 30 or the reset transistor 32 of the pixel cell 20, and thus may be simultaneously formed. The insulating layer 25 is blanket deposited over the photosensor 26, HDR transistor 24, and the charge collection region 19, and then etched over the HDR transistor 24. A spacer wall 29 is formed on the charge collection region 19 side of the HDR transistor 24.

FIGS. 6-10 illustrate the formation of HDR transistor 24 of the five transistor (5T) pixel cell 20 of FIGS. 5*a* and 5*b*, in the embodiments where the HDR transistor 24 has a charge collection region 19, comprising a single lightly doped implant, on one side of the gate stack. Field oxide regions 15 (STI) are formed in the substrate 5 by any known technique such as thermal oxidation of the underlying silicon in a LOCOS process, or by etching trenches and filling them with oxide in an STI process.

Figure 7:
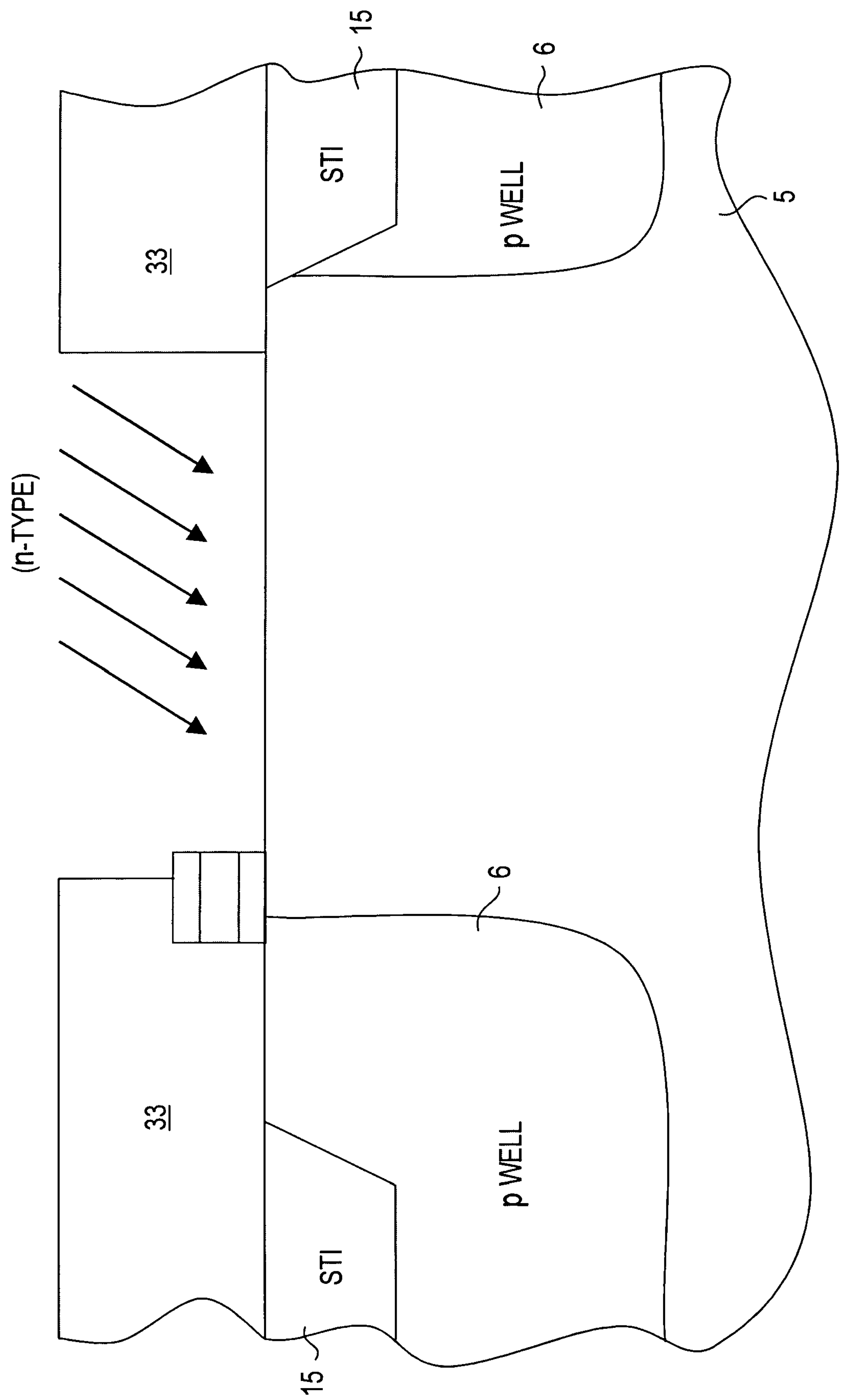
FIG. 7 illustrates the pixel cell of FIG. 6 at a subsequent stage of fabrication.

A gate stack of HDR transistor 24 is formed, and then a first mask 31 is placed over the area where the photosensor 26 will be fabricated. The substrate 5 is lightly doped with a dopant of the first conductivity type to form wells 6 (e.g., p-wells) in the substrate 5 (FIG. 7). The dopant concentration of the p-wells 6 is within the range of about $1\times10^{15}$ atoms per $cm^3$ to about $5\times10^{17}$ atoms per $cm^3$, and is preferably within the range of about $5\times10^{15}$ atoms per $cm^3$ to about $1\times10^{17}$ atoms per $cm^3$.

Figure 8:
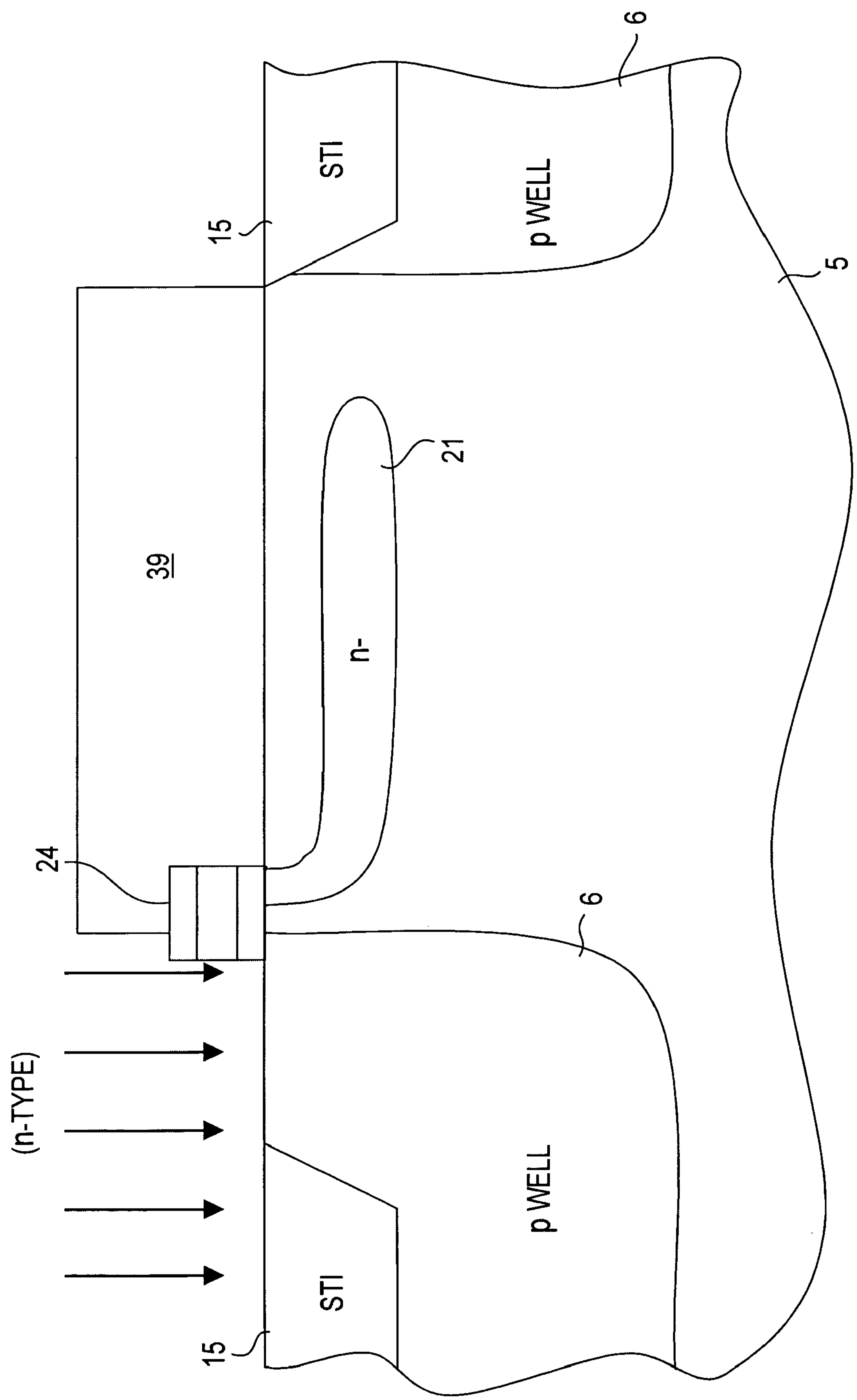
FIG. 8 illustrates the pixel cell of FIG. 7 at a subsequent stage of fabrication.
Figure 9:
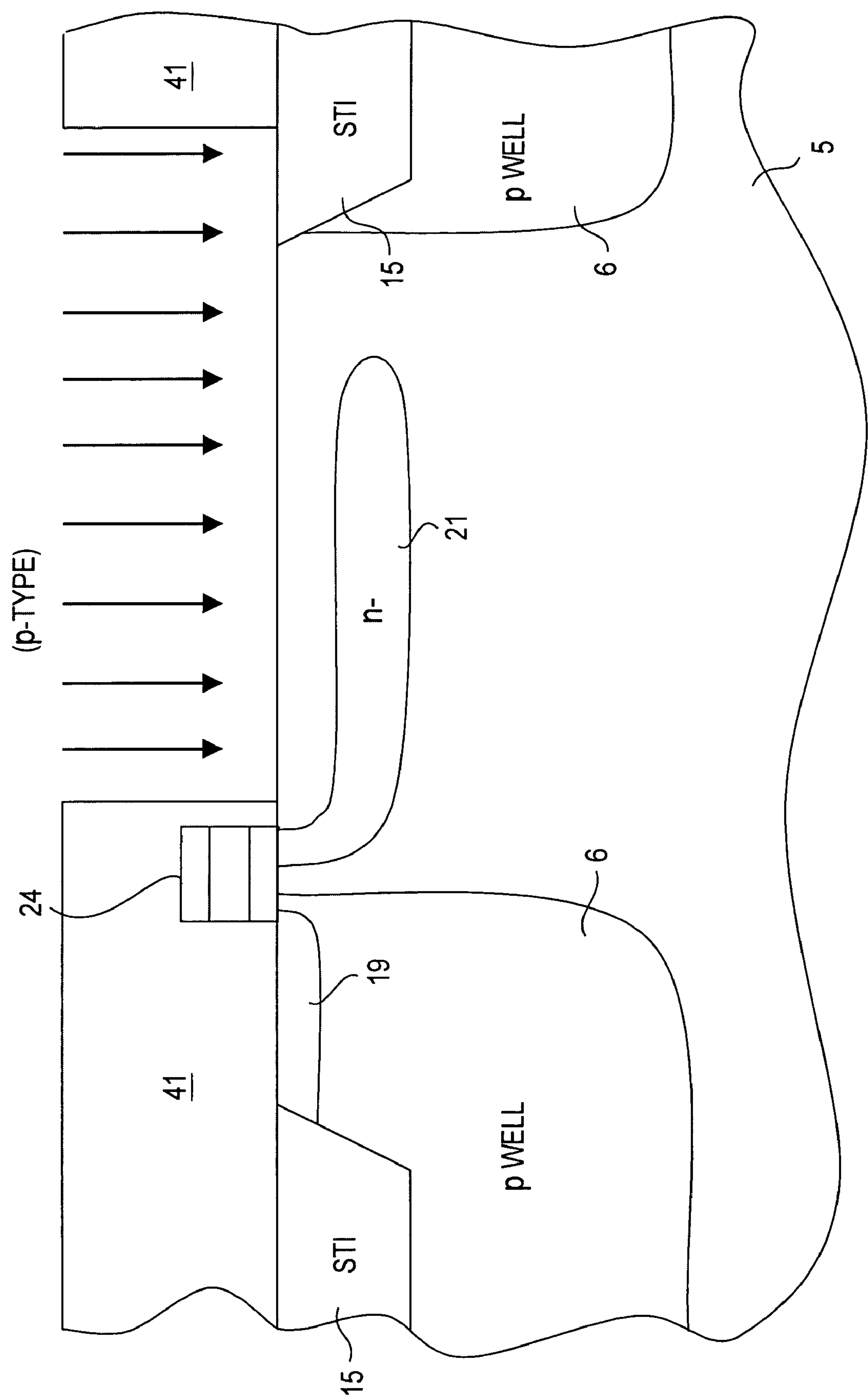
FIG. 9 illustrates the pixel cell of FIG. 8 at a subsequent stage of fabrication.

Next, the first mask 31 is removed and a second mask 33 is placed over the HDR transistor 24 gate stack and the side of the substrate 5 which will later comprise the charge collection region (i.e., region 19 illustrated in FIG. 9). An angled implant of a second conductivity type (e.g., n-type) is conducted to form the n-layer 21 of the photosensor 26 (FIG. 8). This implant may be conducted with an n-type doping, typically a phosphorous or arsenic doping. The dopant concentration in the n-layer 21 is within the range of about $1\times10^{16}$ atoms per $cm^3$ to about $3\times10^{18}$ atoms per $cm^3$, and is preferably within the range of about $5\times10^{16}$ atoms per $cm^3$ to about $5\times10^{17}$ atoms per $cm^3$.

The second mask 33 is removed and a third mask 39 is placed over the HDR transistor 24 and the n-layer 21 (FIG. 8). An implant of a second conductivity type (e.g., n-type) is conducted to form the charge collection region (i.e., region 19, illustrated in FIG. 9) on the unmasked side of the HDR transistor 24. This implant may be conducted with an n-type doping, typically a phosphorous or arsenic doping, at an implant dose of about $5\times10^{11}/cm^2$ to about $5\times10^{14}/cm^2$, more preferably about $2\times10^{12}/cm^2$ to about $1\times10^{14}/cm^2$. This implant is self-aligned to the gate stack of the HDR transistor 24.

Figure 10:
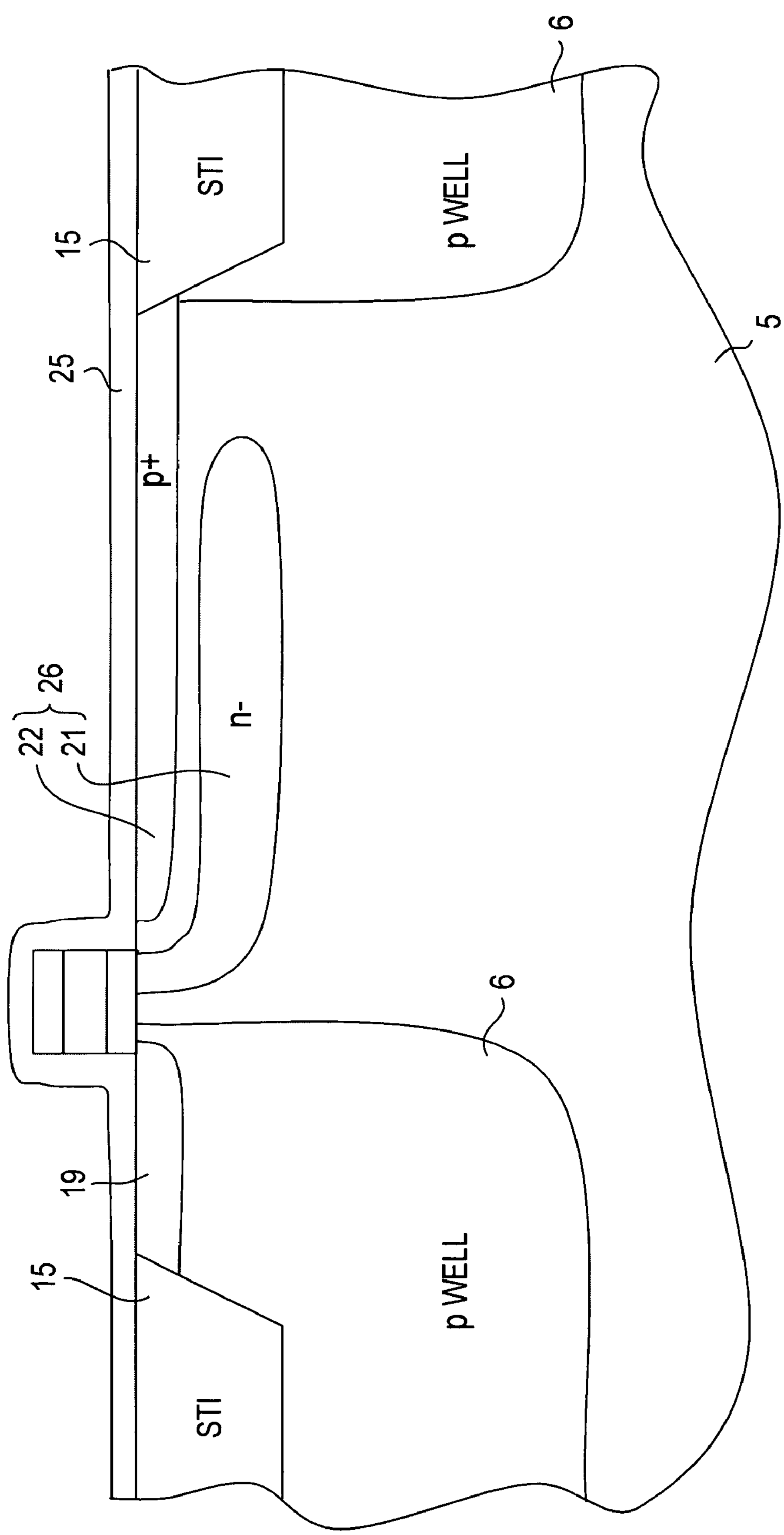
FIG. 10 illustrates the pixel cell of FIG. 9 at a subsequent stage of fabrication.

The third mask 39 is removed. A fourth mask 41 is placed over the HDR transistor 24 and the charge collection region 19 (FIG. 9). Subsequently, an implant of a first conductivity type (e.g., p-type) is conducted to form the overlying layer 22 of the photosensor 26, as shown in FIG. 10. The dopant concentration of the overlying layer 22 is within the range of $1\times10^{17}$ atoms per $cm^3$ to about $1\times10^{20}$ atoms per $cm^3$, preferably about $5\times10^{17}$ atoms per $cm^3$ to about $1\times10^{19}$ atoms per $cm^3$. The fourth mask 41 is removed. A spacer oxide layer 25 may be blanket deposited over the pixel cell 20, as shown in FIG. 5*a*, or the spacer oxide layer 25 may be etched back and a spacer 29 may be formed on the charge collection region 19 side of the HDR transistor 24, as shown in FIG. 5*b*. A blanket deposited oxide layer 25 is shown in FIG. 10.

Figure 6:
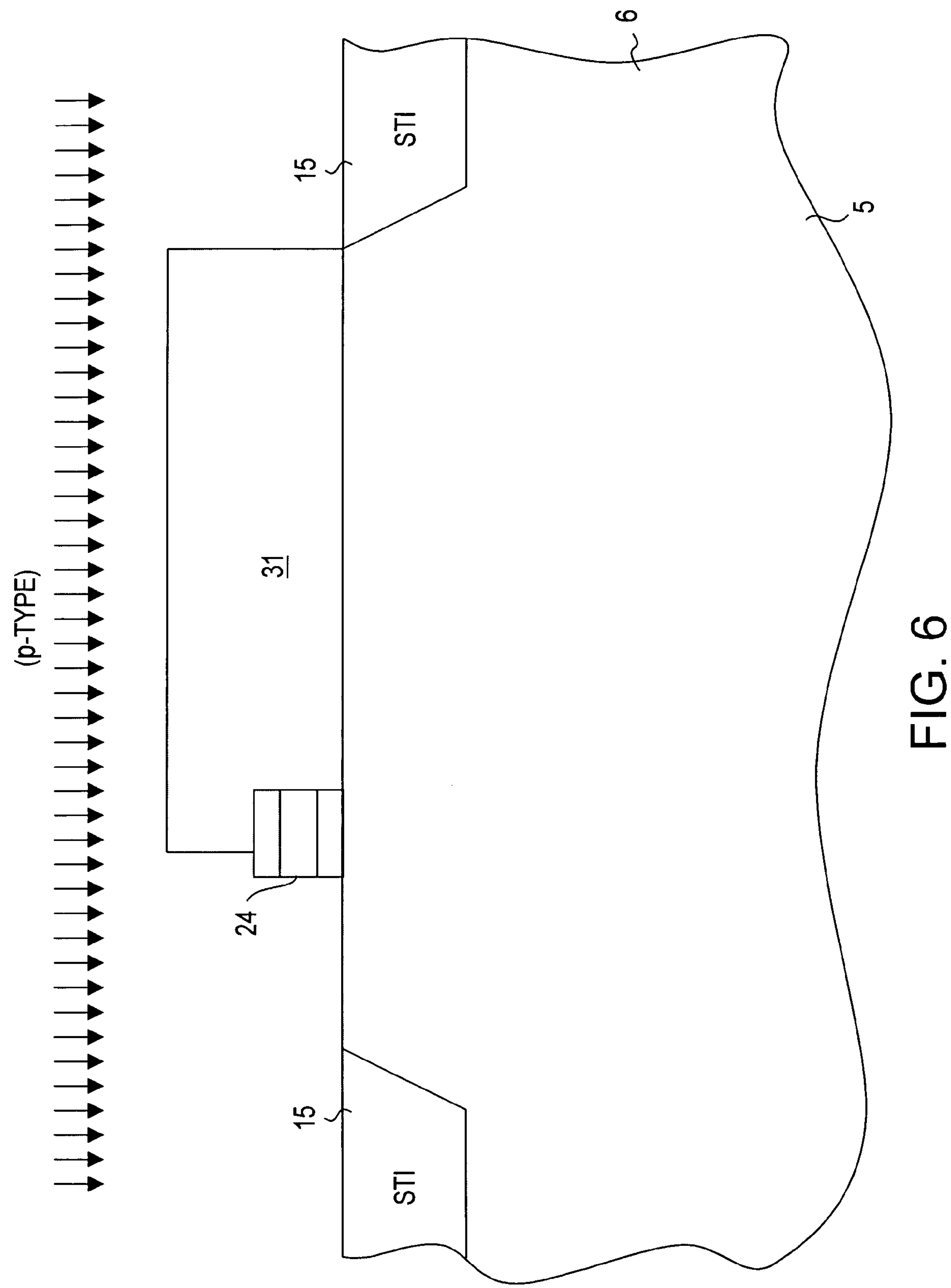
FIG. 6 illustrates the pixel cells of FIGS. 5*a-c* and 16*a-c* at an initial stage of fabrication.

FIGS. 6-8 and 11-14 illustrate the formation of HDR transistor 24 of the five transistor (5T) pixel cell 20 of FIG. 5*c* in the case where the HDR transistor 24 has a charge collection region 19, a highly doped region 13 and a punch-through protection implant 23 on the second side (i.e., the first side is the adjacent to the photosensor 26). The initial steps of fabrication of the pixel cell 20 of FIG. 5*c* are the same as the initial steps of the fabrication of the pixel cell 20 of FIGS. 5*a* and 5*b*. The formation of the field oxide regions 15, the p-wells 6, the n-layer 21 and the charge collection region 19 are identical (FIGS. 6-8).

Figure 11:
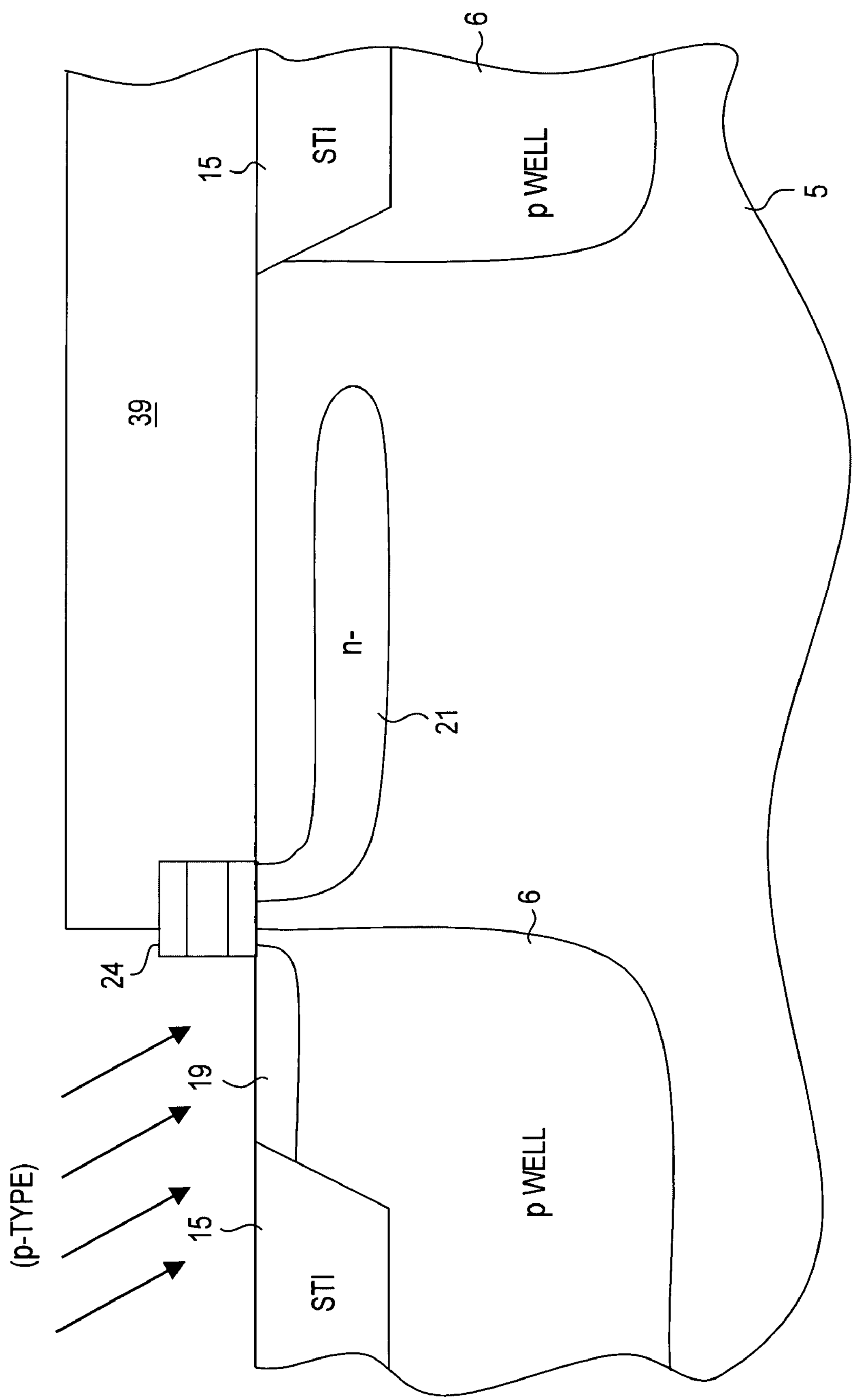
FIG. 11 illustrates the pixel cell of FIG. 8 at a subsequent stage of fabrication.
Figure 12:
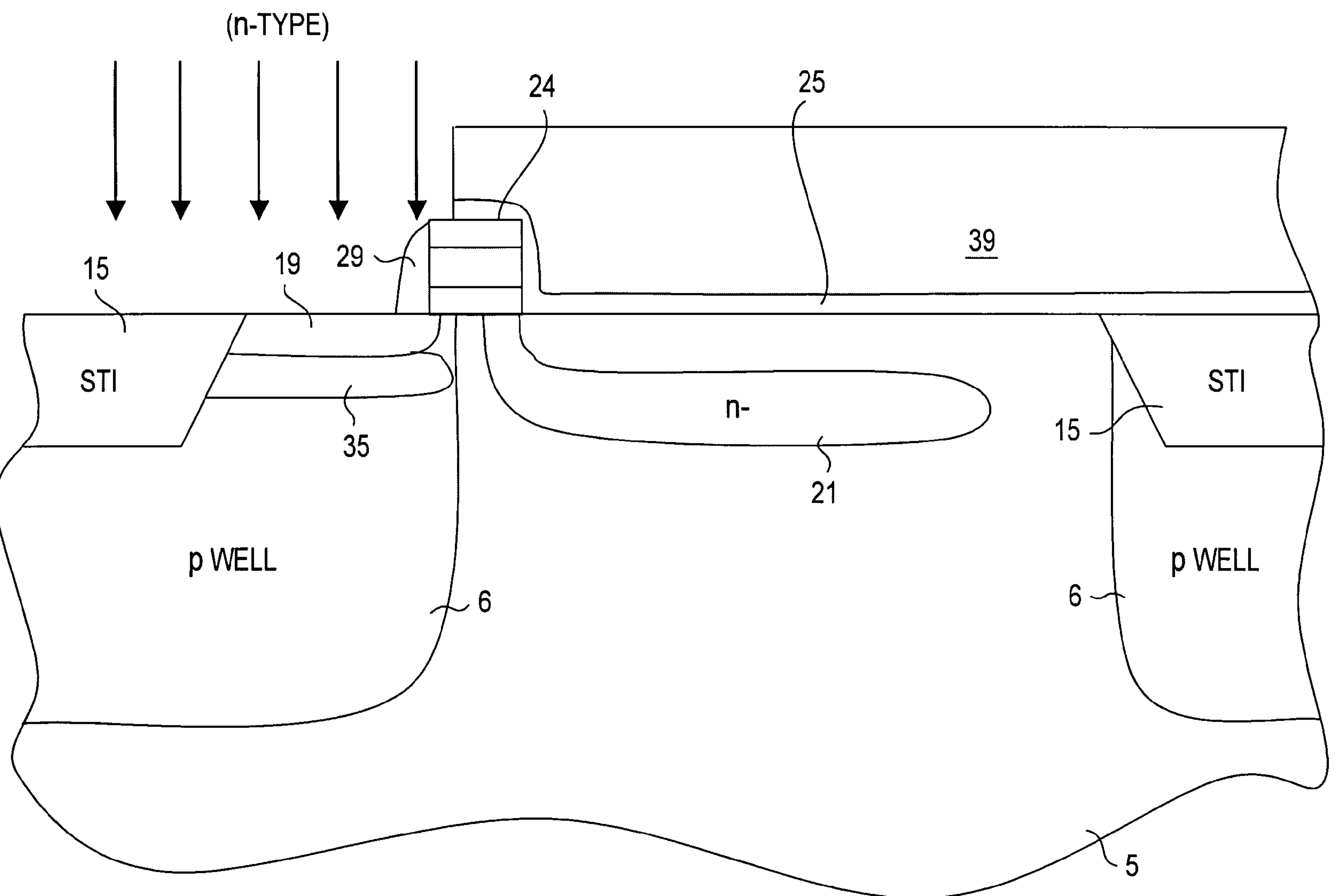
FIG. 12 illustrates the pixel cell of FIG. 11 at a subsequent stage of fabrication.

As shown in FIG. 11, the third mask 39 remains in place during a halo angled implant of a first conductivity type (e.g., p-type) to implant a halo implanted region 35 below the charge collection region 19, as illustrated on FIG. 12. The halo implant may be, for example, boron or boron difluoride. It is initially conducted on one side of the device. Upon completion, the device may be rotated 180 degrees and the halo implant process may then be repeated to form a halo implanted region 35 on the opposite side. In practice, the gate stack of the HDR transistor 24 may be subjected to four halo implants during processing. Four implants are typically performed because many of the transistors formed above the substrate are oriented at different angles relative to one another.

Figure 13:
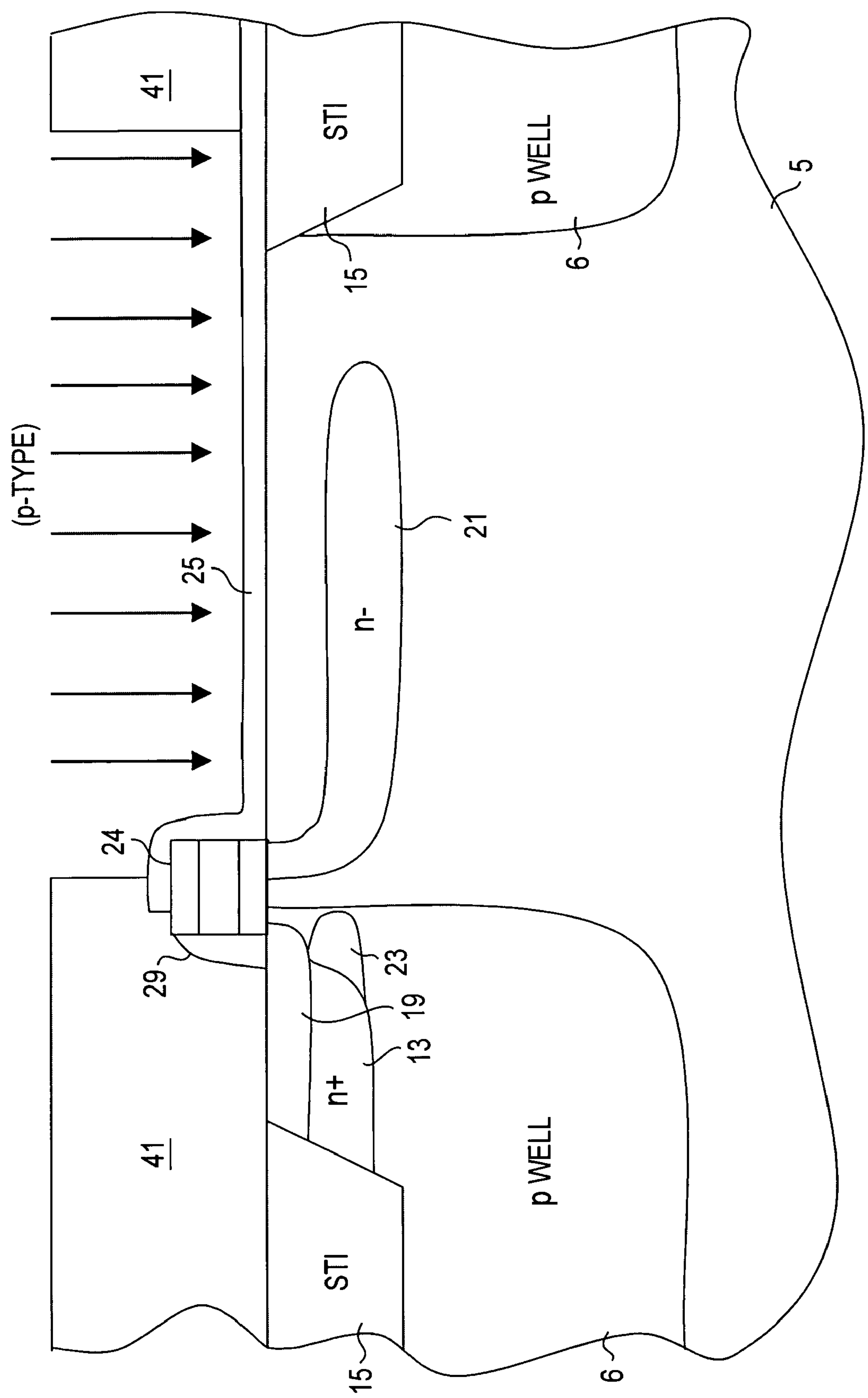
FIG. 13 illustrates the pixel cell of FIG. 12 at a subsequent stage of fabrication.

Subsequent to the halo implant, a sidewall spacer 29 is formed by known methods on a sidewall of the gate stack of the HDR transistor 24 and a heavier dose n-type implant is conducted to form the highly-doped drain region 13 (FIG. 13). This implant is self-aligned to the sidewall spacer 29. Highly-doped drain region 13 is deeper than the lightly doped charge collection region 19 and converts a portion of the p-type halo implant region 35 to a n-type portion, leaving only a p-type hole which is the punch-through protection implant 23. The implant dose in the highly-doped drain region 13 is within the range of about $5\times10^{14}$ atoms per $cm^2$ to about $5\times10^{16}$ atoms per $cm^2$.

Figure 14:
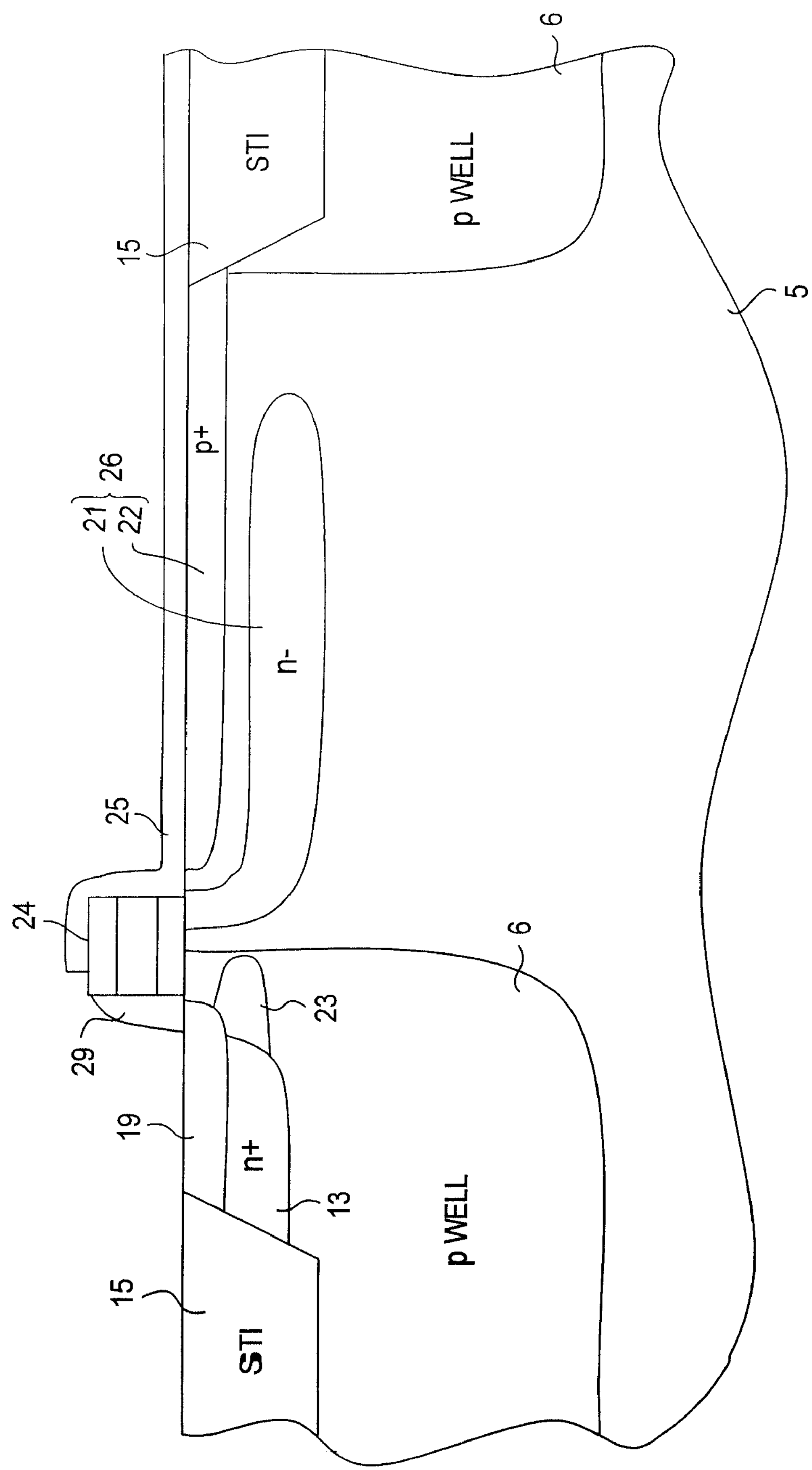
FIG. 14 illustrates the pixel cell of FIG. 13 at a subsequent stage of fabrication.

The third mask 39 is removed and a fourth mask 41 is placed over the HDR transistor 24 and the charge collection region 19 (FIG. 13). Subsequently, an implant of a first conductivity type (e.g., p-type) is conducted to form the overlying layer 22 of the photosensor 26, as shown in FIG. 14. The implant dose of the overlying layer 22 is within the range of $5\times10^{12}$ atoms per $cm^2$ to about $1\times10^{14}$ atoms per $cm^2$. The fourth mask 41 is removed. A spacer oxide layer 25 may be blanket deposited over the pixel cell 20, as shown in FIG. 5*a*, or the spacer oxide layer 25 may be etched back and a spacer wall 29 may be formed on the charge collection region 19 side of the HDR transistor 24, as shown in FIG. 5*c*.

The resulting photosensor 26 shown in FIGS. 5*a*-5*c* has a n-layer 21 which lies partially within the channel 37 under the HDR transistor 24. When the photosensor 26 has received an amount of incident light which exceeds the capacity of the n-layer 21, some of the charge will leak out from the n-layer 21 to the charge collection region 19 through the HDR transistor 24, rather than spill over to adjacent cells.

Figure 15:
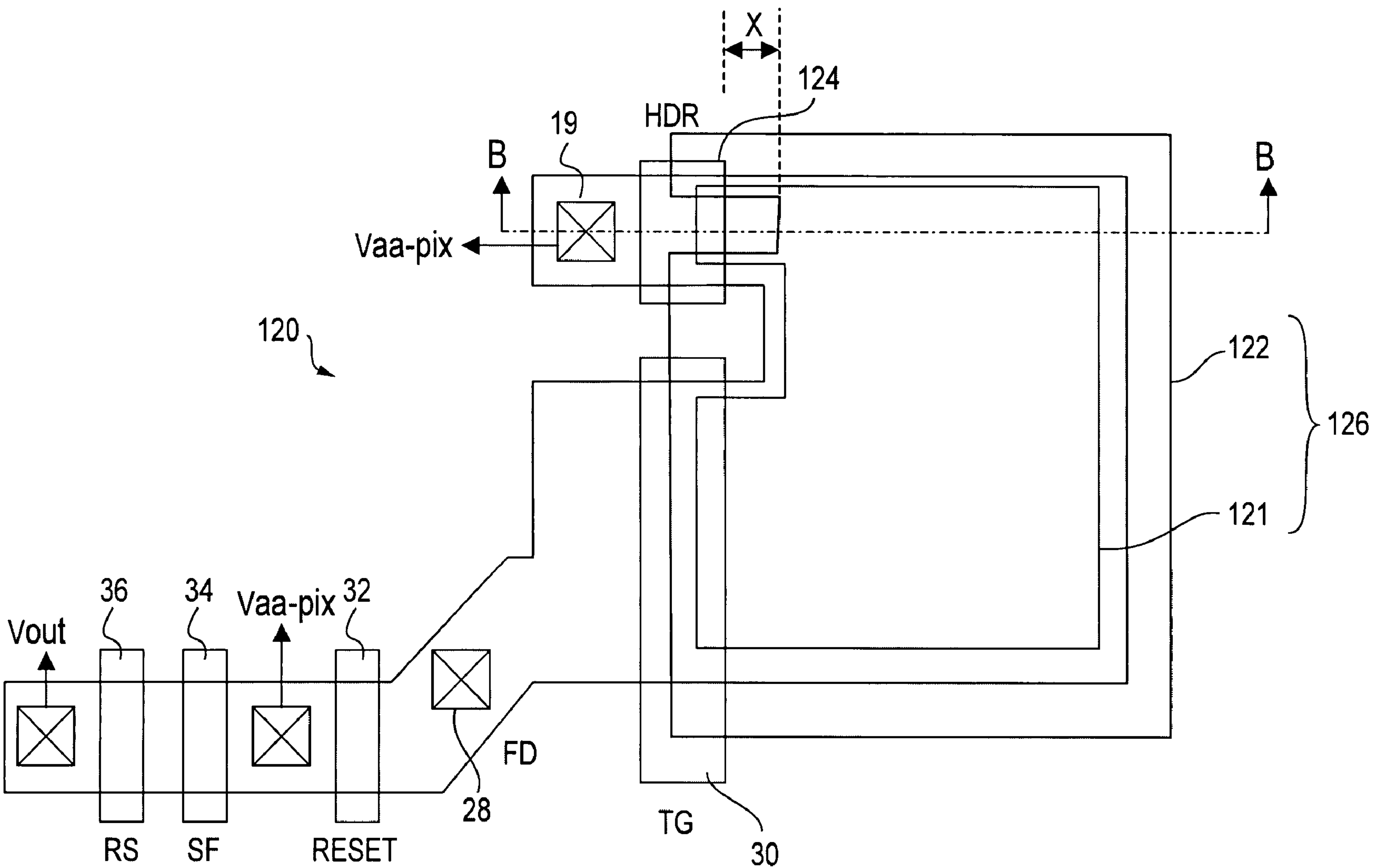
FIG. 15 is a plan view of an exemplary pixel cell according to another embodiment of the present invention.
Figure 16A:
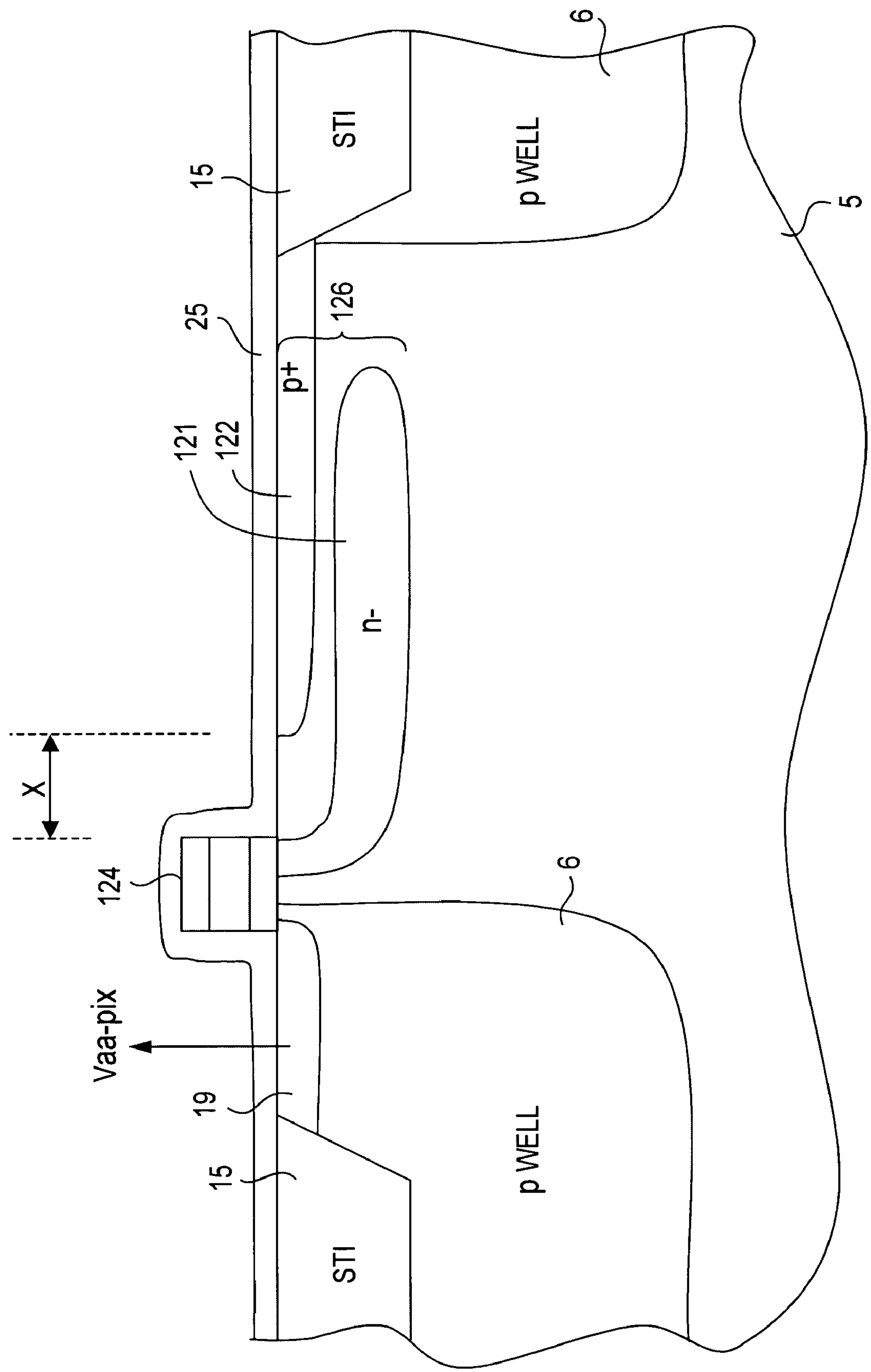
FIGS. 16*a-c* are cross sections of the pixel cell of FIGS. 15 and 36 having various implants and insulating layers, taken along line B-B and F-F, respectively.
Figure 16B:
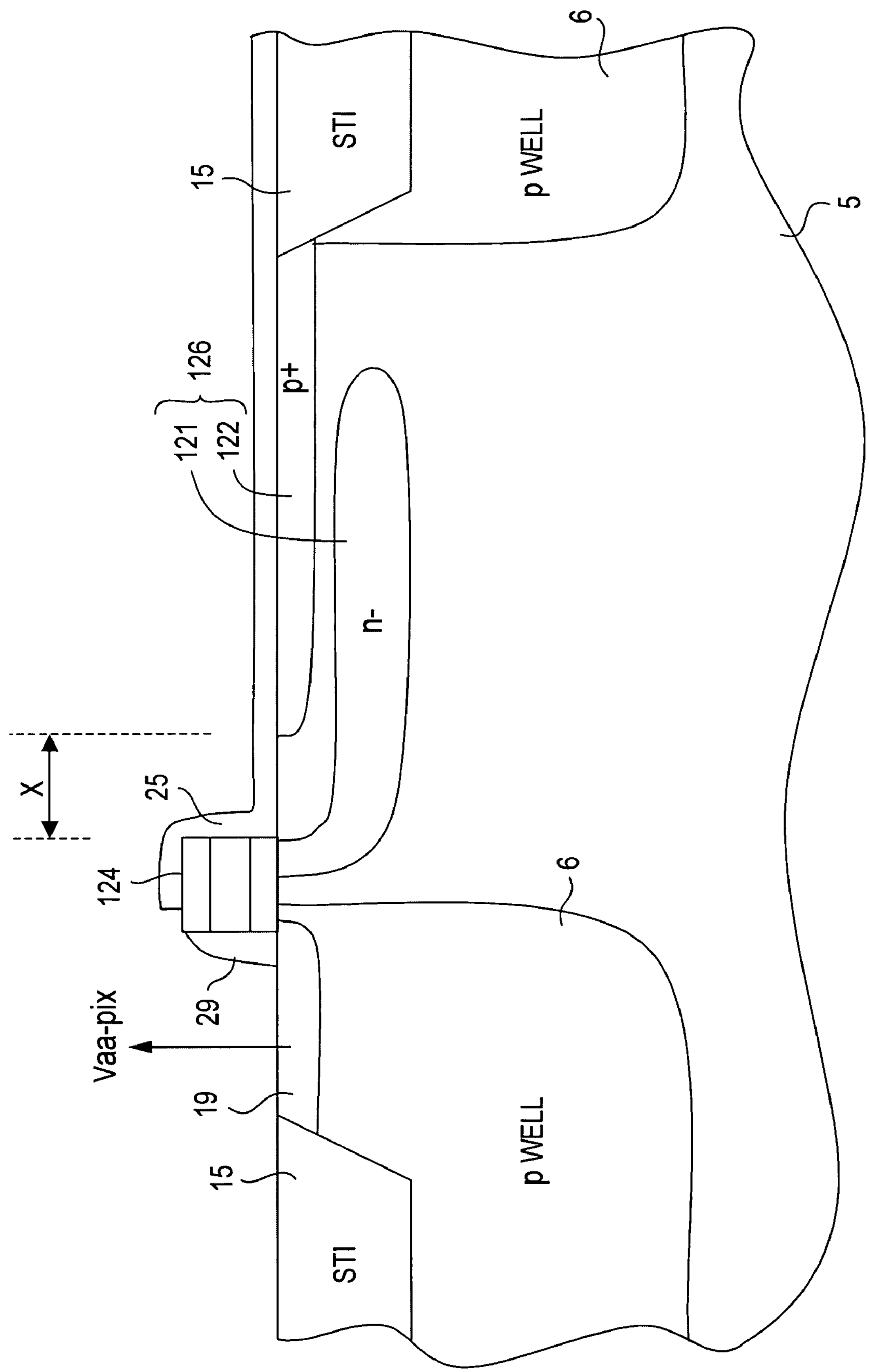
Figure 16C:
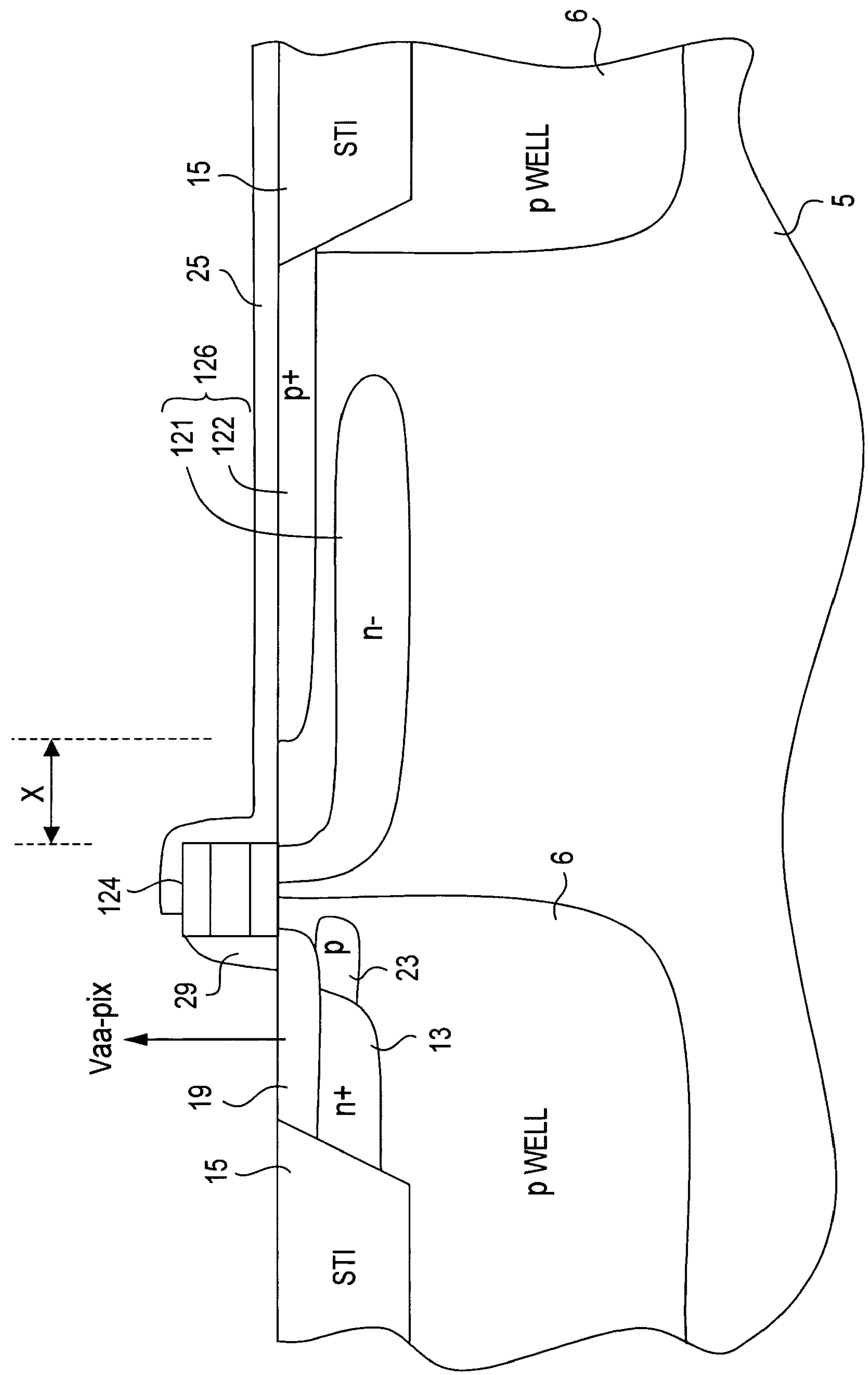

FIG. 15 illustrates a plan view of another pixel 120 of the present invention. In the illustrated embodiment, the HDR transistor 124 is still located on the same side of the photosensor 126 as the transfer gate 30, however, the overlying layer 122 is pulled back from the HDR transistor 124 by a distance X. This operates to reduce leakage through the HDR transistor 124. FIGS. 16*a* to 16*c* are cross sectional views of the pixel cell 120 taken along line B-B. FIGS. 16*a*-16*c* depict various doping profiles of the pixel cell 120 that may be similar to the transfer gate 30 or the reset transistor 32, whichever is desired. The n-layer 121 of the photosensor 126 of FIG. 15 lies underneath the overlying layer 122, as shown in the cross sections of FIGS. 16*a* to 16*c*.

Turning now to FIG. 16*a*, the HDR transistor 124 has the photosensor 126 on one side and a charge collection region 19 of a second conductivity type (e.g., n-type). Therefore, the implant for the charge collection region 19 may still be the same implant as either the transfer gate 30 or the reset transistor 32 of the pixel cell 120 and thus, may be simultaneously formed. However, the overlying layer 122 of the photosensor 126 has been shifted away from the HDR transistor 124 by a distance X. This does not change the number of masks required; it only alters the location of the mask. The insulating layer 25 has been blanket deposited over the photosensor 126, HDR transistor 124, and the charge collection region 19.

FIG. 16*b* illustrates the HDR transistor 124 having a charge collection region 19 and a shifted overlying layer 122 as illustrated in FIG. 16*a*, however the insulating layer 25 is etched over the HDR transistor 124 and a spacer wall 29 is formed on the charge collection region 19 side of the HDR transistor 124.

Turning now to FIG. 16*c*, the HDR transistor 124 has the photosensor 126 on one side and a charge collection region 19 of a second conductivity type (e.g., n-type), a highly-doped drain region 13 of a second conductivity type and a punch-through protection implant 23 of a first conductivity type (e.g., p-type) on a second side. The punch-through protection implant 23 lies between the photosensor 126 and the highly-doped drain region 13. The punch-through protection implant 23 on the second side of the HDR transistor 124 may be the same implant as either the transfer gate 30 or the reset transistor 32 of the pixel cell 120, and thus may be formed simultaneously with the transfer gate 30 or the reset transistor 32. As in FIG. 16*a*, the overlying layer 122 of the photosensor 126 has been shifted away from the HDR transistor 124 by a distance X. The insulating layer 25 is blanket deposited over the photosensor 126, HDR transistor 124, and the charge collection region 19, and then etched over the HDR transistor 124 and a spacer wall 29 is formed on the charge collection region 19 side of the HDR transistor 124.

FIGS. 6-8, 17 and 18 illustrate the formation of HDR transistor 124 of the five transistor (5T) pixel cell 120 of FIGS. 16*a* and 16*b*, in the embodiments where the HDR transistor 124 has a charge collection region 19 comprising a single lightly doped implant on one side and a photosensor 126 with an overlying layer 122 that has been moved away from the other side of the HDR transistor 124. The formation of the STI regions 15, the gate stack of the HDR transistor 124, the p-wells 6, the n-layer 121, and the charge collection region 19 are formed as described above with respect to FIGS. 6-8.

Figure 17:
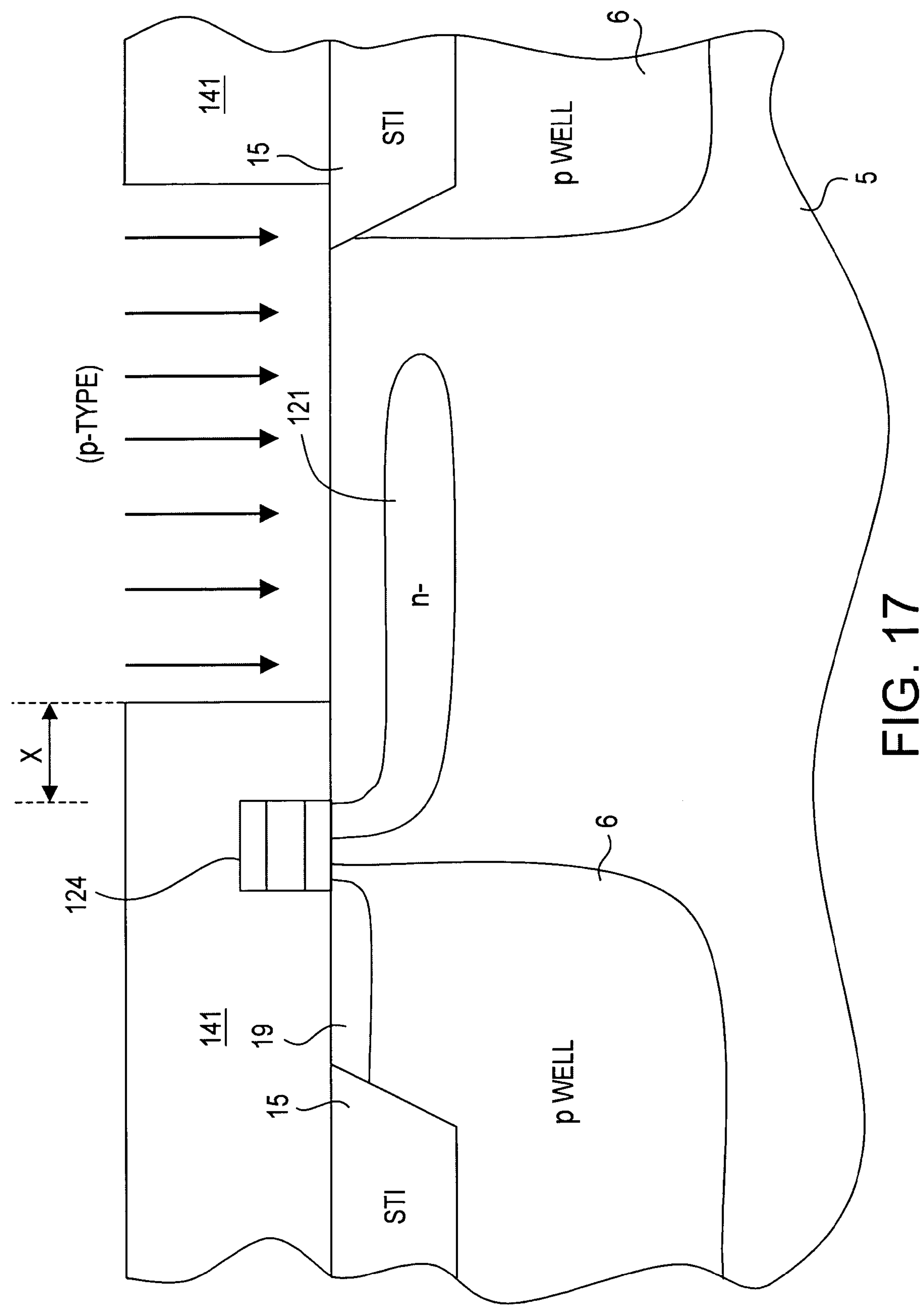
FIG. 17 illustrates the pixel cell of FIG. 8 at a subsequent stage of fabrication.
Figure 18:
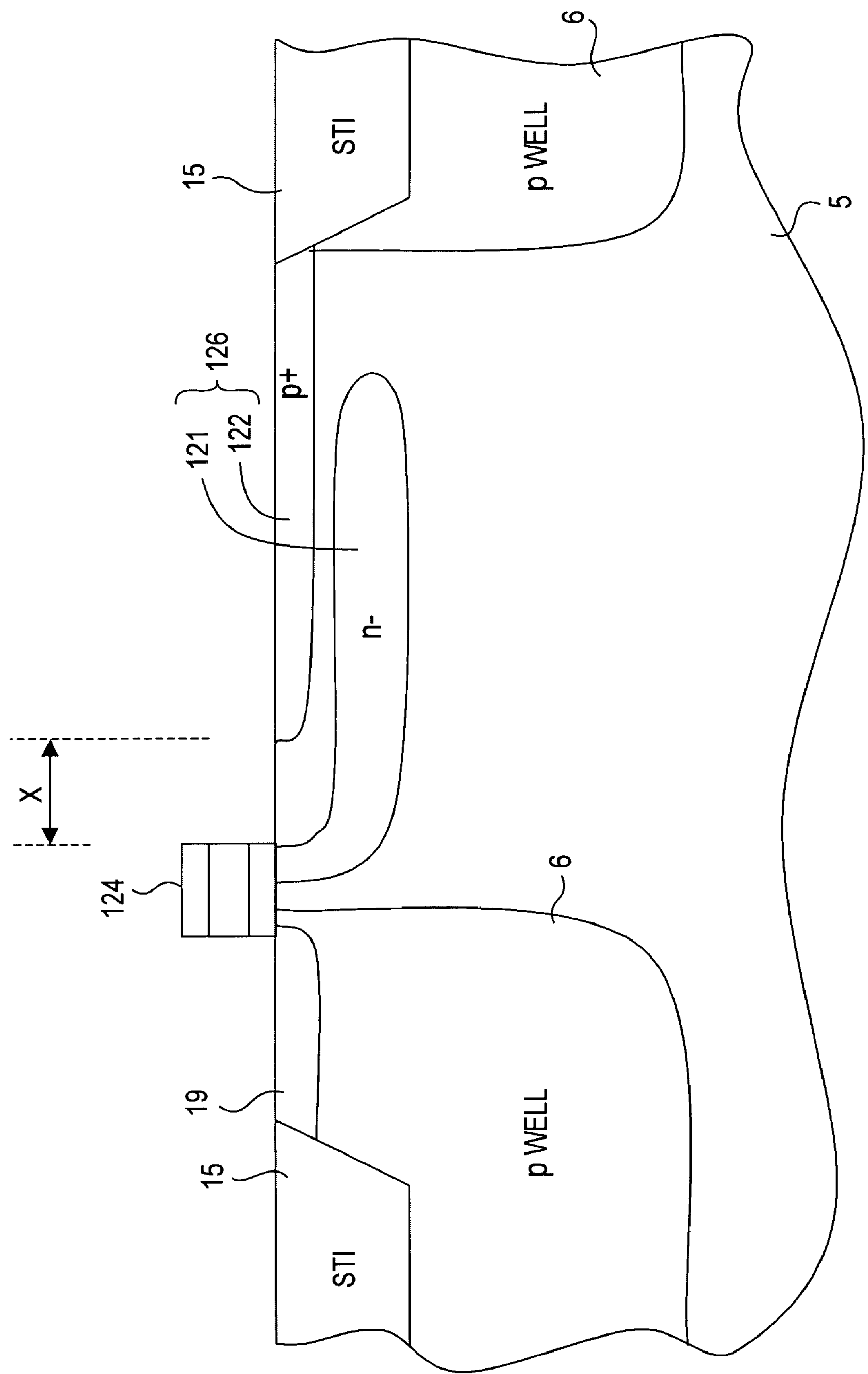
FIG. 18 illustrates the pixel cell of FIG. 17 at a subsequent stage of fabrication.

Referring to FIG. 17, the third mask 39 is removed and a fourth mask 141 is placed over the charge collection region 19 and the HDR transistor 124, and extends past the HDR transistor 124 to a portion of the n-layer 121 by a distance X. An implant of a first conductivity type is conducted to form the overlying layer 122 of the photosensor 126 as shown in FIG. 18. The fourth mask 141 is removed. A spacer oxide layer 25 may be blanket deposited over the pixel cell 120, as shown in FIG. 16*a*, or the spacer oxide layer 25 may be etched back and a spacer wall 29 may be selectively deposited on the charge collection region 19 side of the HDR transistor 124, as shown in FIG. 16*b*.

FIGS. 6-8, 11, 12, 19 and 20 are detailed illustrations of the formation of HDR transistor 124 of the five transistor (5T) pixel cell 120 of FIG. 16*c*, in the case where the HDR transistor 124 has a charge collection region 19, a highly doped region 13 and a punch-through protection implant 23 on one side and a photosensor 126 with an overlying layer 122 that has been pulled away from the other side of the HDR transistor 124. The formation of the STI regions 15, the gate stack of the HDR transistor 124, the p-wells 6, the n-layer 21, the charge collection region 19, the highly-doped region 13, and the punch-through region are formed as described above with respect to FIGS. 6-8, 11 and 12.

Figure 19:
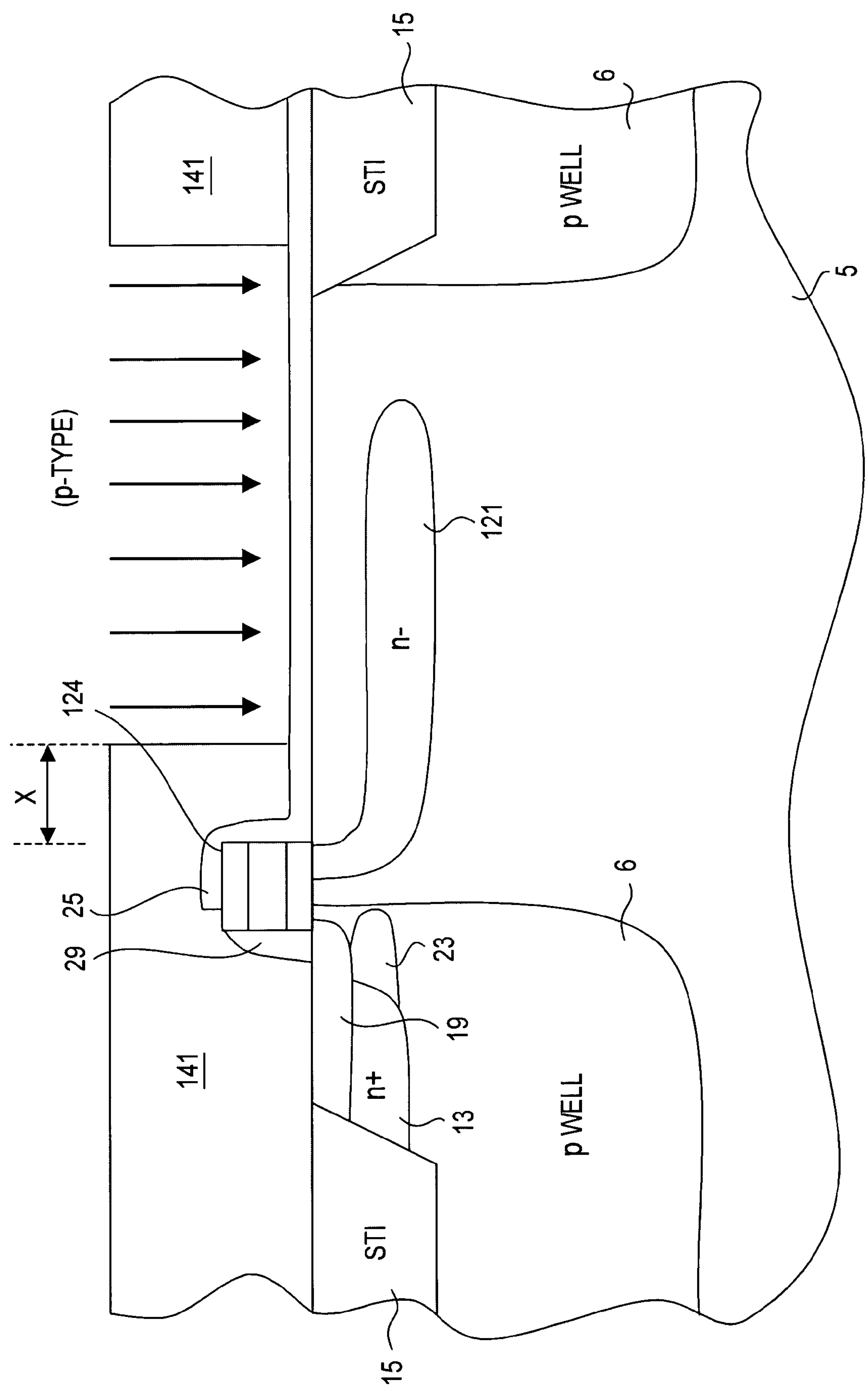
FIG. 19 illustrates the pixel cell of FIG. 12 at a subsequent stage of fabrication.
Figure 20:
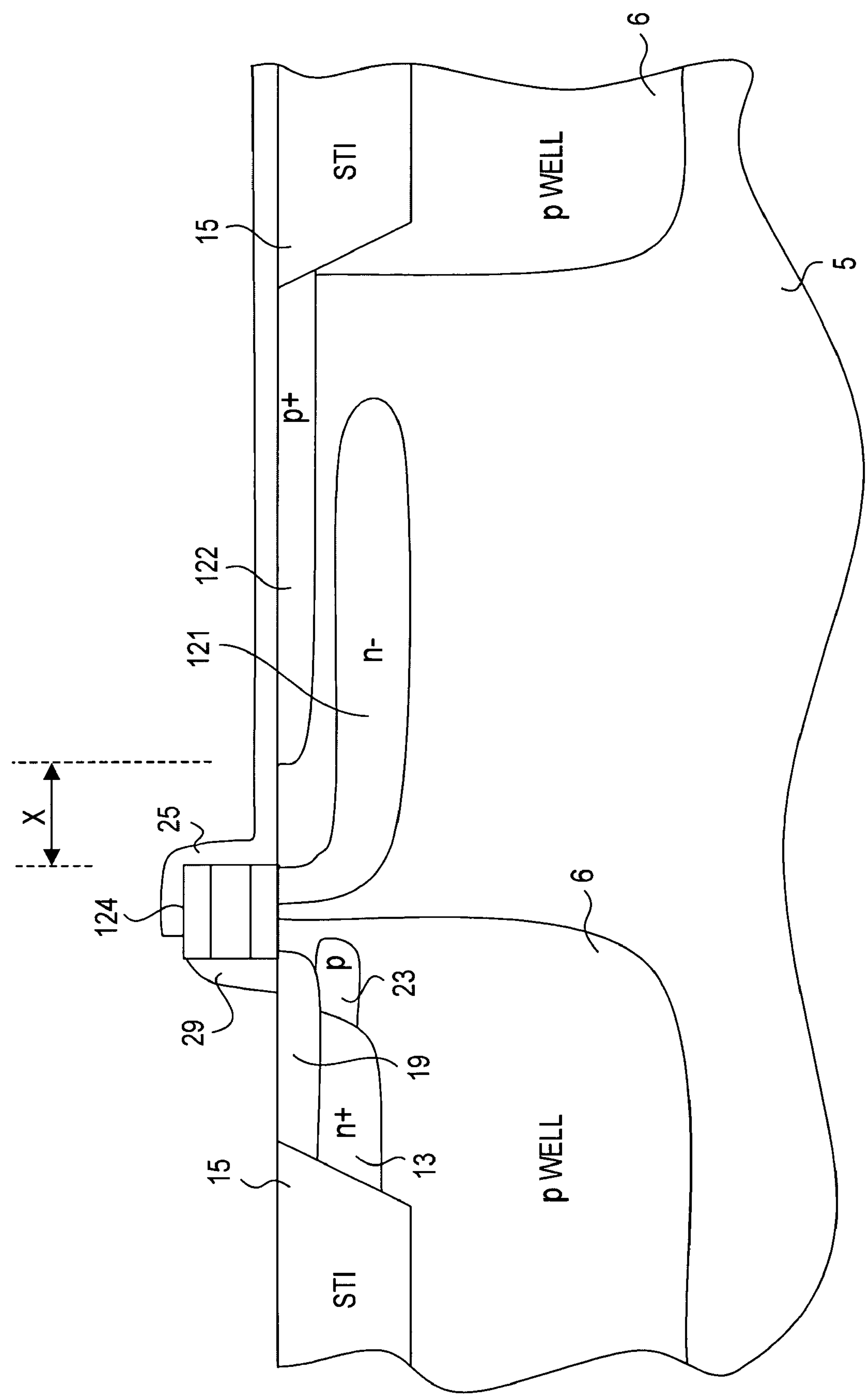
FIG. 20 illustrates the pixel cell of FIG. 19 at a subsequent stage of fabrication.

Referring to FIG. 19, the third mask 39 is removed and a fourth mask 141 is placed over the charge collection region 19 and the HDR transistor 124, and extends past the HDR transistor 124 to a portion of the n-layer 121 by a distance X (FIG. 19). An implant of a first conductivity type is conducted to form the overlying layer 122 of the photosensor 126 as shown in FIG. 20. The fourth mask 141 is removed. A spacer oxide layer 25 may be blanket deposited over the pixel cell 120, as shown in FIG. 16*a*, or the spacer oxide layer 25 may be etched back and a spacer wall 29 may be selectively deposited on the charge collection region 19 side of the HDR transistor 124, as shown in FIG. 16*c*.

Figure 21:
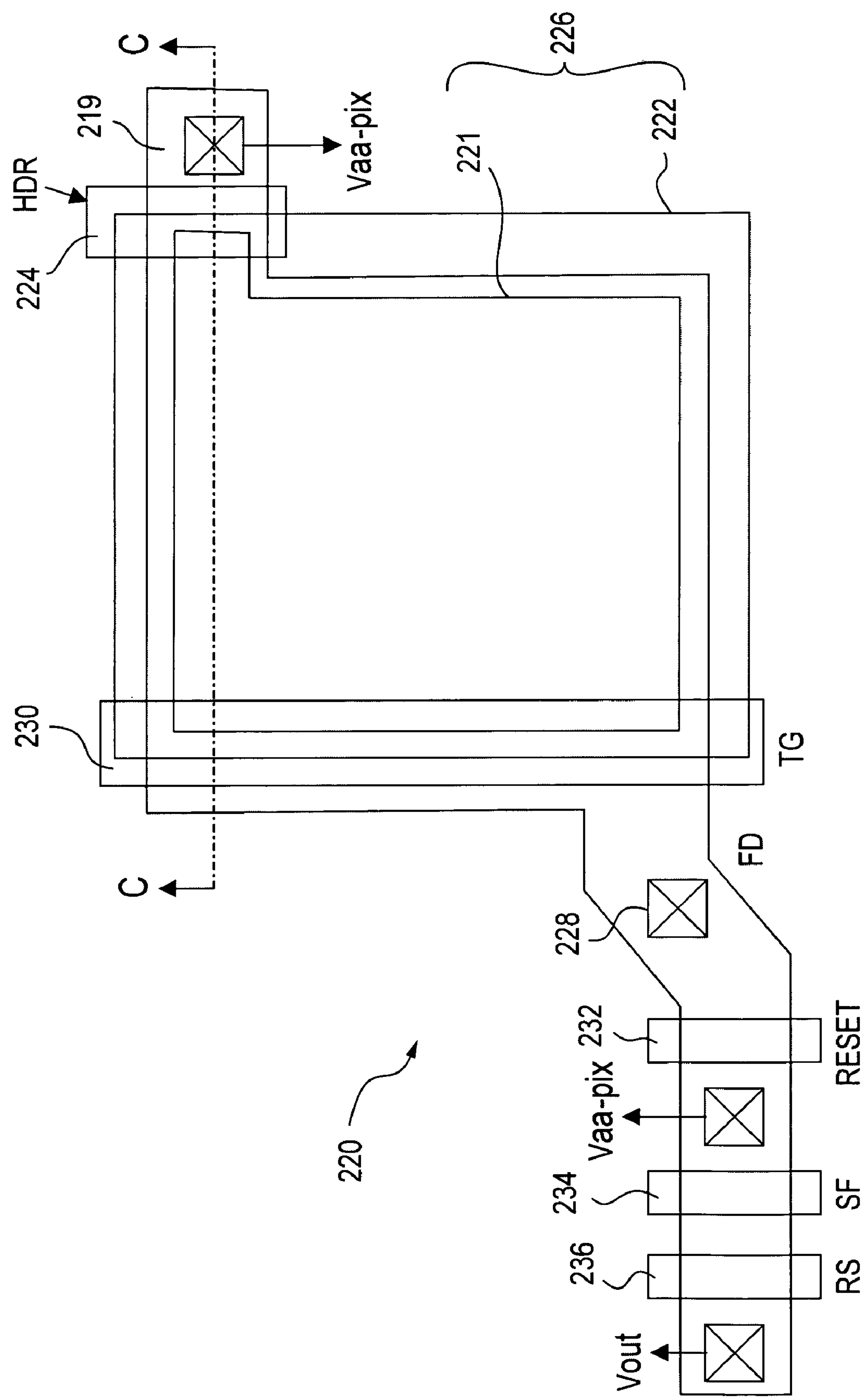
FIG. 21 is a plan view of an exemplary pixel cell according to another embodiment of the present invention.
Figure 22A:
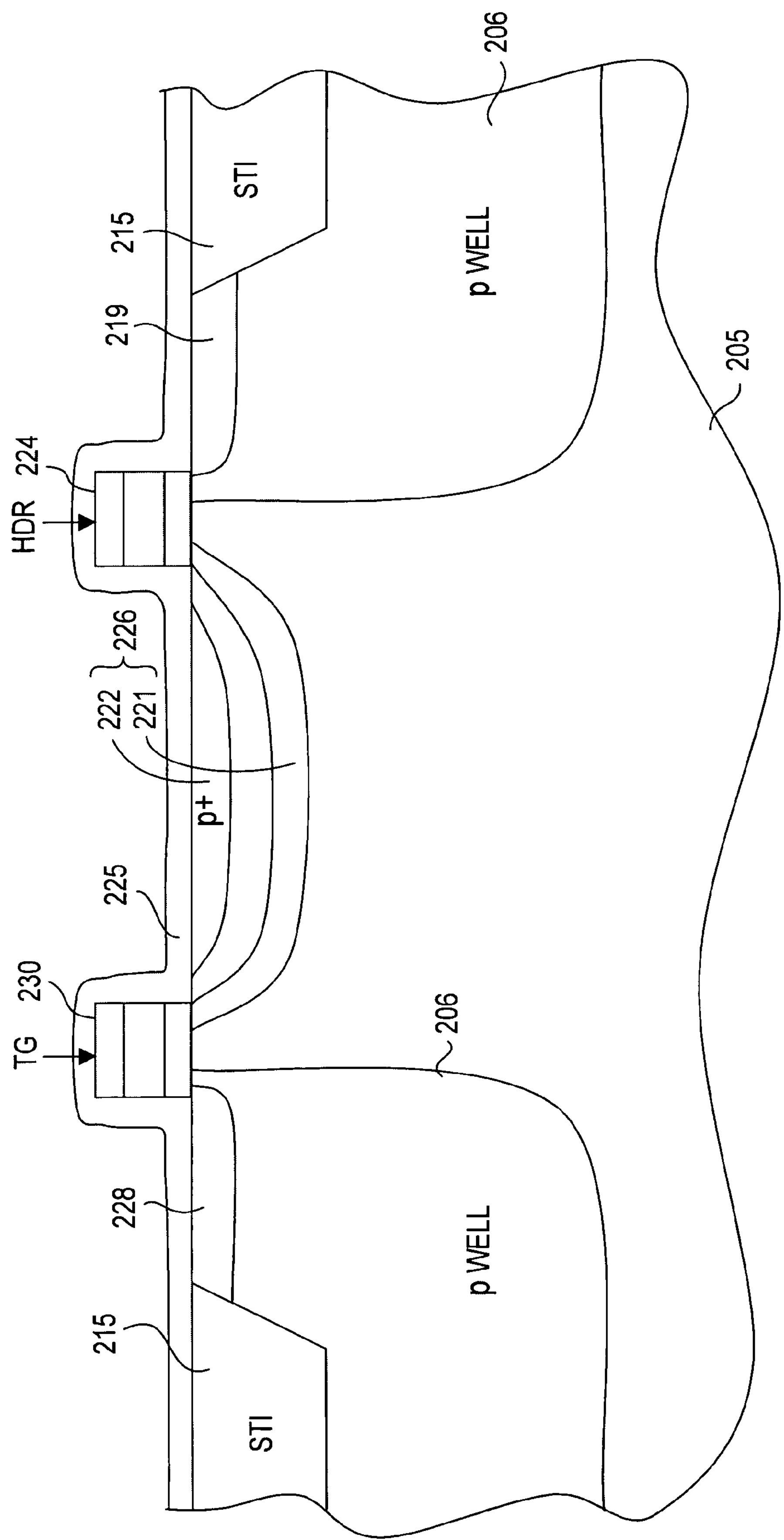
FIGS. 22*a-c* are cross sections of the pixel cell of FIG. 21, having various implants and insulating layers, taken along line C-C.
Figure 22B:
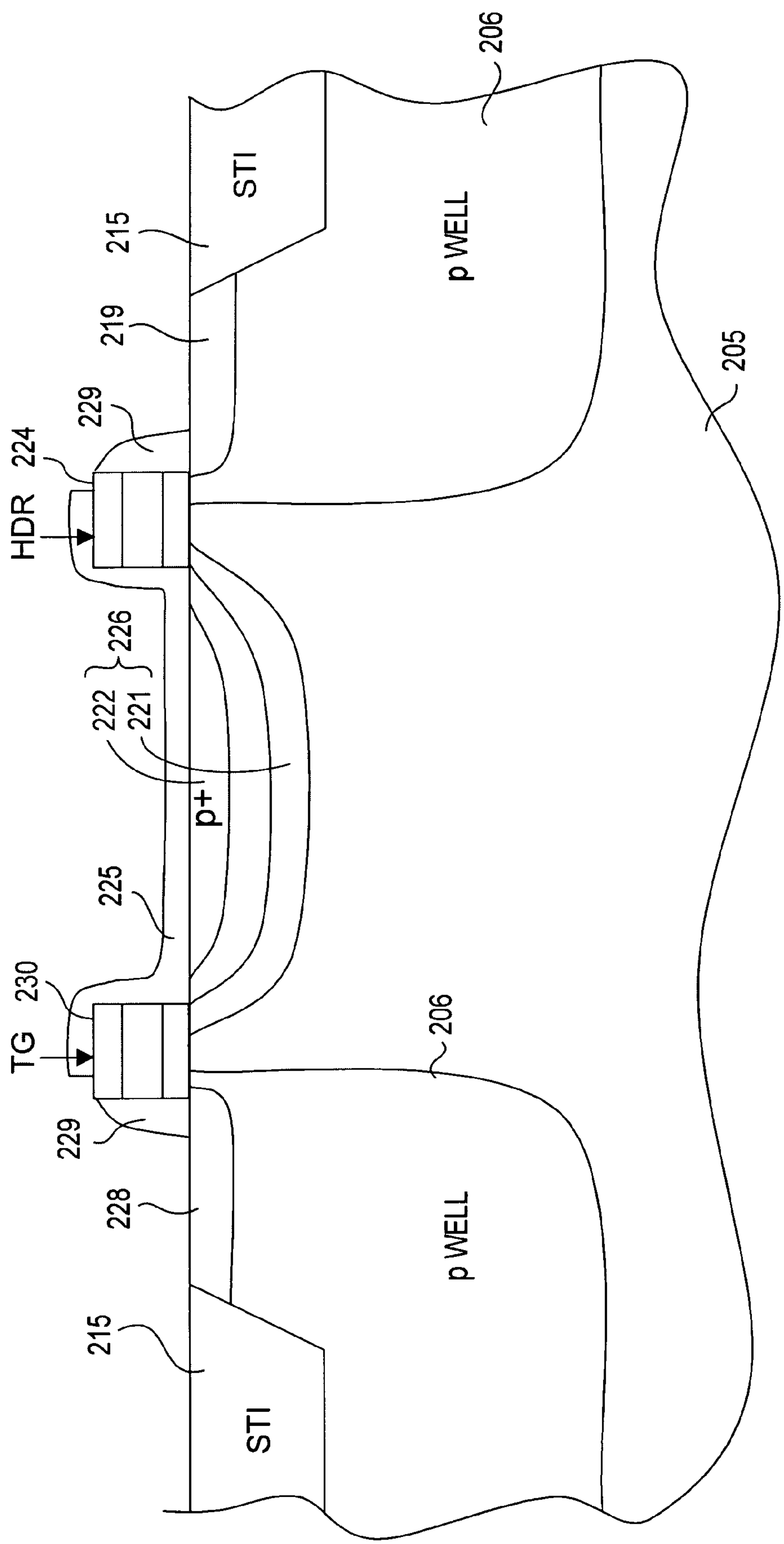
Figure 22C:
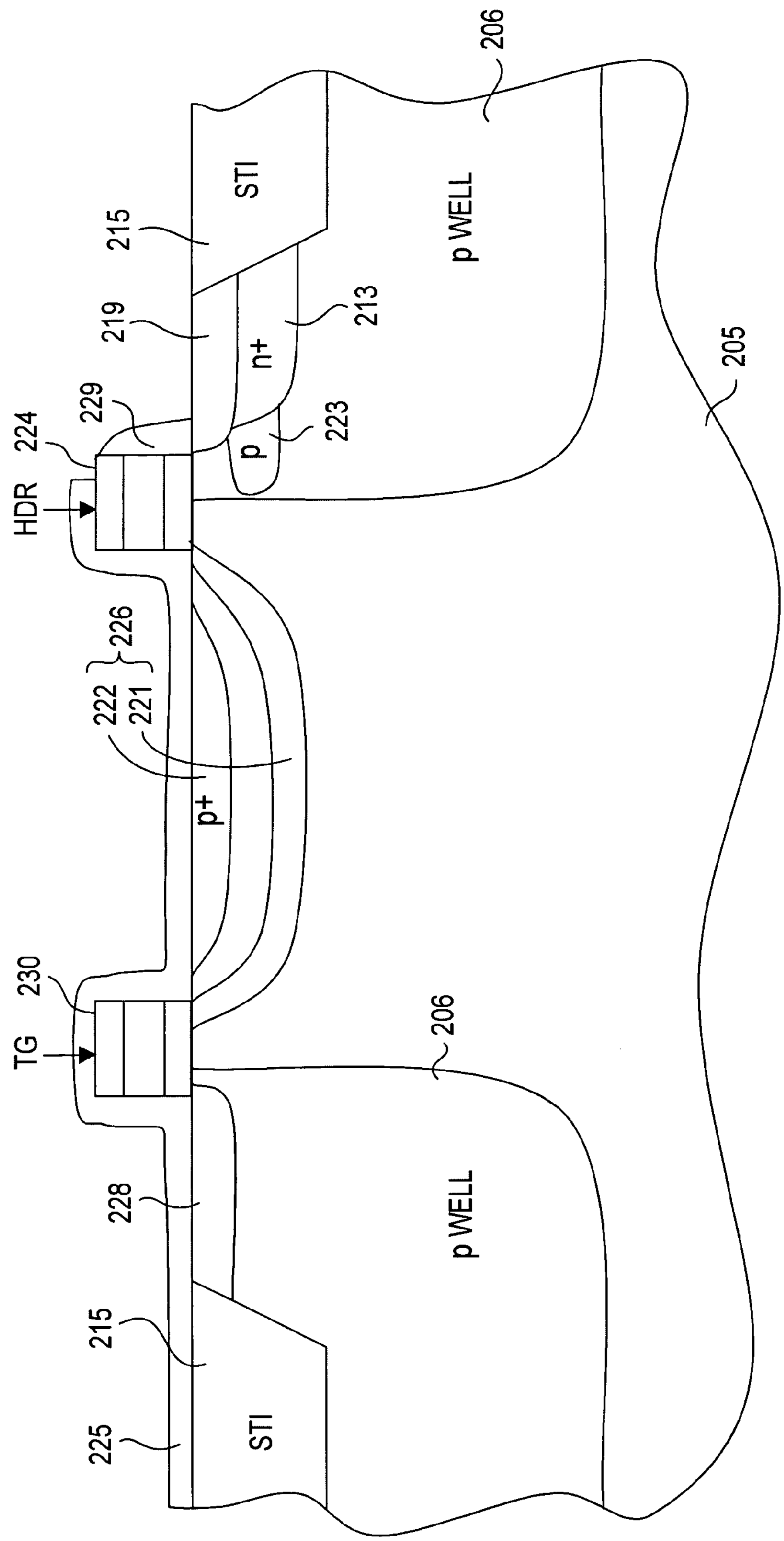

FIG. 21 is a plan view of another exemplary pixel cell 220 of the invention. In this illustrated embodiment, the HDR transistor 224 is located on a side of the photosensor 226 opposite the side where the transfer gate 230 is formed. Photosensor 226 comprises a n-layer 221 and an overlying layer 222. FIGS. 22*a* to 22*c* are cross sectional views of the pixel cell 220 taken along line C-C. FIGS. 22*a*-22*c* depict various doping profiles for the cell 220 that may be similar to the transfer gate 230 or the reset transistor 232, whichever profile provides the desired channel characteristics for the HDR transistor 224 of the pixel cell 220. The n-layer 221 of the photosensor 226 of FIG. 21 lies underneath the overlying layer 222, as shown in cross sections FIGS. 22*a* to 22*c*.

Turning now to FIG. 22*a*, a photosensor 226 has a transfer gate 230 and a floating diffusion region 228 of a second conductivity type (e.g. n-type) on one side of the gate stack and a HDR transistor 224 with a charge collection region 219 of a second conductivity type on the opposite side of the gate stack. Therefore, the implant for the charge collection region 219 may be the same implant as for the floating diffusion region 228 and thus, they may be formed at the same time as the floating diffusion region 228 is formed. The insulating layer 225 has been blanket deposited over the photosensor 226, the transfer gate 230, the floating diffusion region 228, the HDR transistor 224, and the charge collection region 219. The floating diffusion region 228 may also comprise a punch-through protection implant and a highly-doped drain region (not shown) as described above with respect to punch-through protection implant 23 and highly-doped region 13 in FIGS. 5*c* and 16*c*. In either case, the transfer gate 230 and floating diffusion region 228 may have an insulating layer 225 blanket deposited over them or an insulating layer which has been etched back over the transfer gate 230 and a spacer wall on the floating diffusion region side of the transfer gate 230 as described above. For simplicity, the floating diffusion region 228 shall be described herein as a single lightly doped implant and the insulating layer shall be described as a blanket insulating layer. In FIG. 22*a*, a single blanket insulating layer 225 is deposited over the HDR transistor 224 and the charge collection region 219 as well.

FIG. 22*b* illustrates the HDR transistor 224 having a charge collection region 219 as illustrated in FIG. 22*a*, however the insulating layer 225 is blanket deposited and etched over the HDR transistor 224 and the transfer gate transistor 230 and a spacer wall 229 is formed on the charge collection region 219 side of the HDR transistor 224 and the floating diffusion region 228 side of the transfer gate 230.

Turning now to FIG. 22*c*, the HDR transistor 224 has the photosensor 226 on a first side of the gate stack and a charge collection region 219 of a second conductivity type (e.g., n-type), a highly-doped drain region 213 of a second conductivity type, and a punch-through protection implant 223 of a first conductivity type (e.g., p-type) on a second side of the gate stack. The punch-through protection implant 223 lies between the photosensor 226 and the highly-doped drain region 213. In the illustrated embodiment, the insulating layer 225 has been blanket deposited over the photosensor 226, the transfer gate 230, the floating diffusion region 228, the HDR transistor 224, and the charge collection region 219 and then etched back to form spacers 229. As with the transfer gate described in FIG. 22*a*, the floating diffusion region 228 may also comprise a punch-through protection implant and a highly-doped drain region (not shown); however, for illustration purposes, the floating diffusion region 228 shall be described herein as a single lightly doped implant. Similarly, the transfer gate 230 and floating diffusion region 228 may have an insulating layer 225 blanket deposited over them or an insulating layer which has been etched back over the transfer gate 230 and a spacer wall on the floating diffusion region side of the transfer gate 230 as described above; however, for illustration purposes, the insulating layer shall be described herein as a blanket insulating layer 225 over the transfer gate 230.

FIGS. 23 to 28 illustrate the formation of HDR transistor 24 of the five transistor (5T) pixel cell 220 of FIGS. 22*a* and 22*b*, in the embodiments in which the HDR transistor 224 has a charge collection region 219 comprising a single lightly doped implant on one side.

Figure 23:
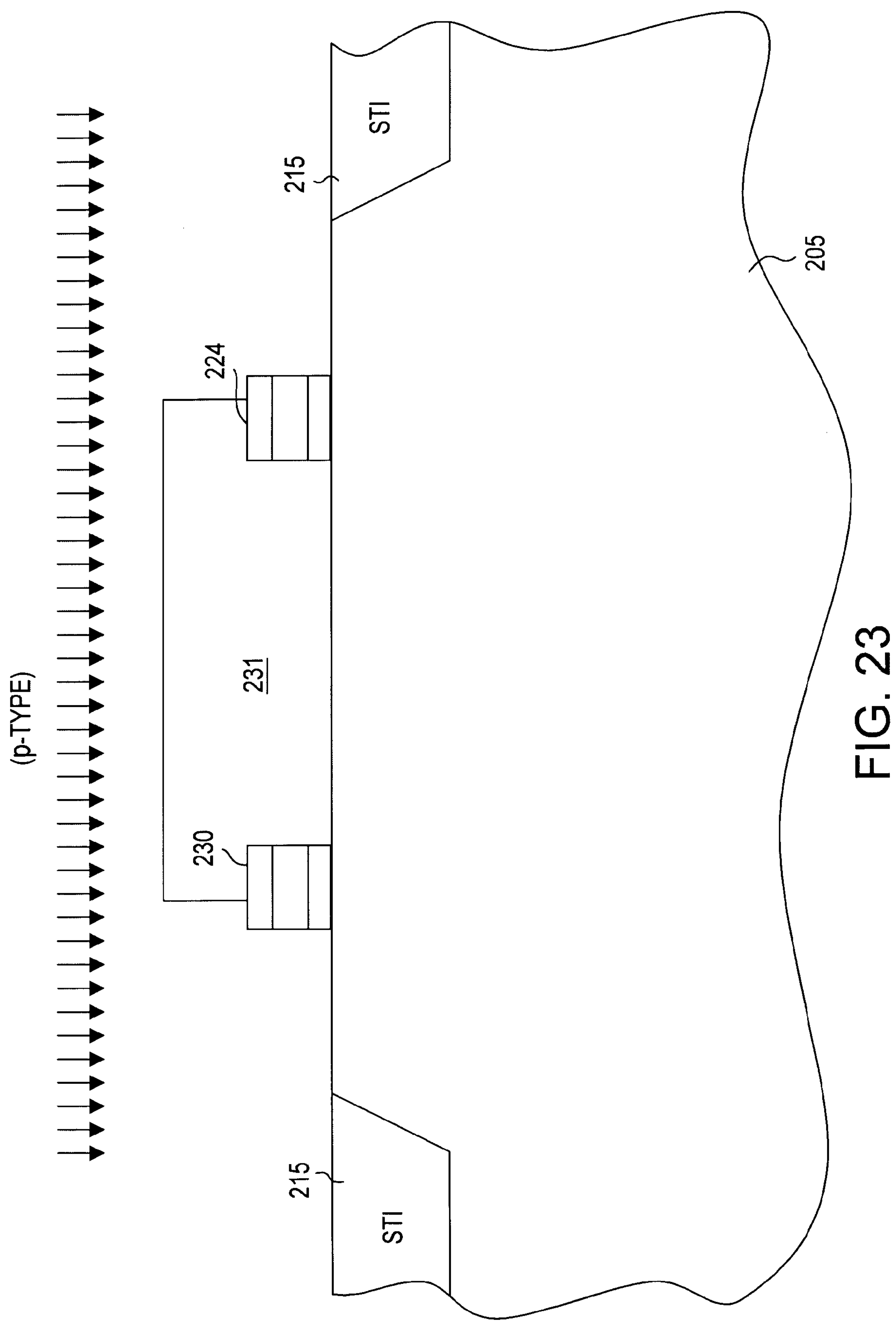
FIG. 23 illustrates the pixel cell of FIGS. 22*a-c* at an initial stage of fabrication.
Figure 24:
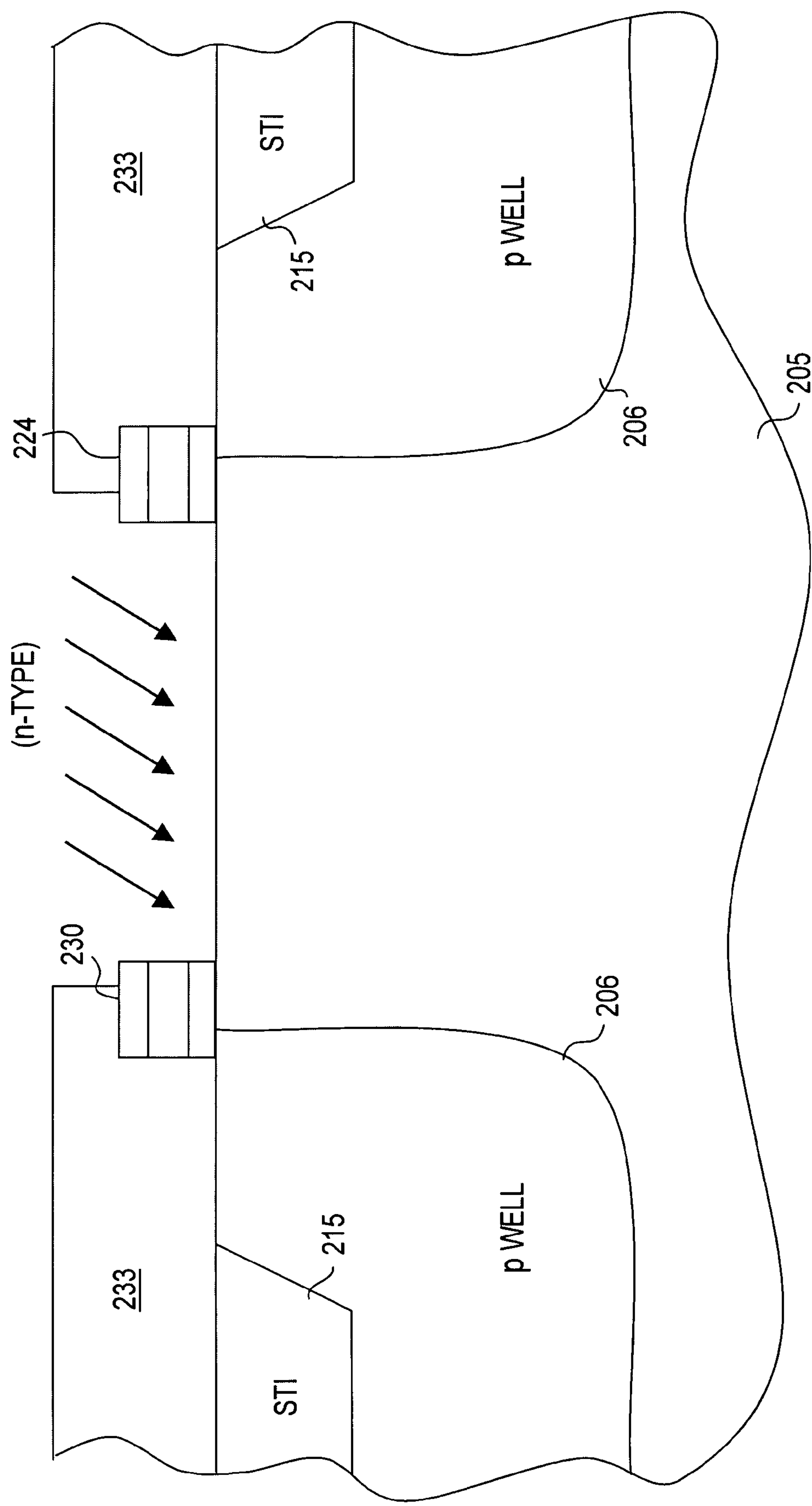
FIG. 24 illustrates the pixel cell of FIG. 23 at a subsequent stage of fabrication.
Figure 25:
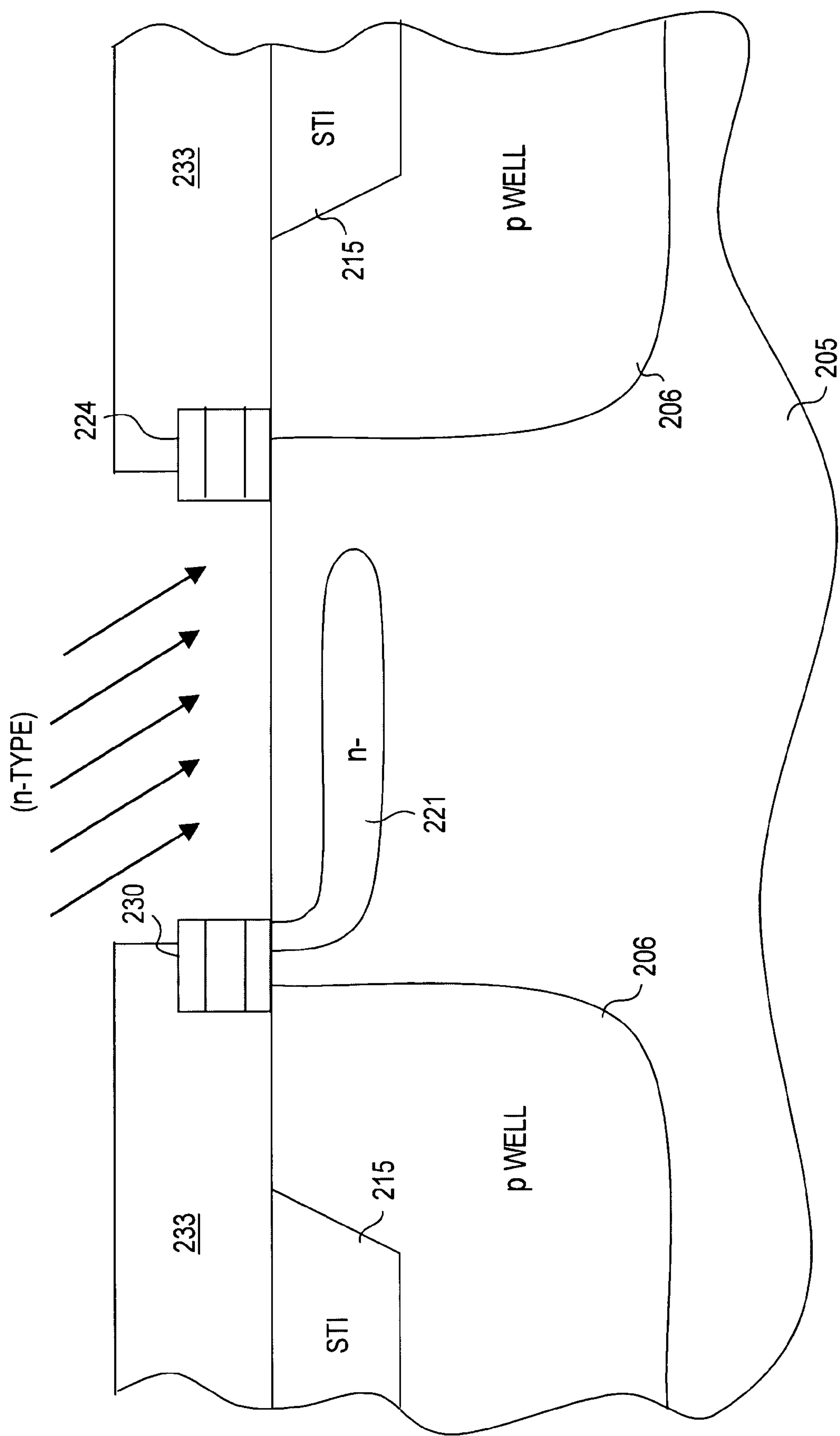
FIG. 25 illustrates the pixel cell of FIG. 24 at a subsequent stage of fabrication.

Field oxide regions 215 (STI) are formed in the substrate 205 by any known technique such as thermal oxidation of the underlying silicon in a LOCOS process, or by etching trenches and filling them with oxide in an STI process. The gate stacks of transfer gate 230 and HDR transistor 224 are formed, then a first mask 231 is placed over transfer gate 230, the HDR transistor 224 and the area where the photosensor 226 will be fabricated (FIG. 23). The substrate 205 is lightly doped with a dopant of the first conductivity type to form wells 206 (e.g., p-wells) in the substrate 205 (FIG. 24). Next, the first mask 231 is removed and a second mask 233 is placed over the HDR transistor 224, the side of the substrate 205 which will later comprise the charge collection region 219, the transfer gate 230 and the side of the substrate 205 that will later comprise the floating diffusion region 228 (FIG. 24). An angled implant of a second conductivity type (e.g., n-type) is conducted to form the n-layer 221 of the photosensor 226 (FIGS. 24 and 25). This implant may be conducted with an n-type doping, typically a phosphorous or arsenic doping. The implant may be a 2-way angled implant with one implant angled toward the transfer gate 30 and the second implant angled toward the HDR transistor 224. It can also be a 4-way angled implant.

Figure 26:
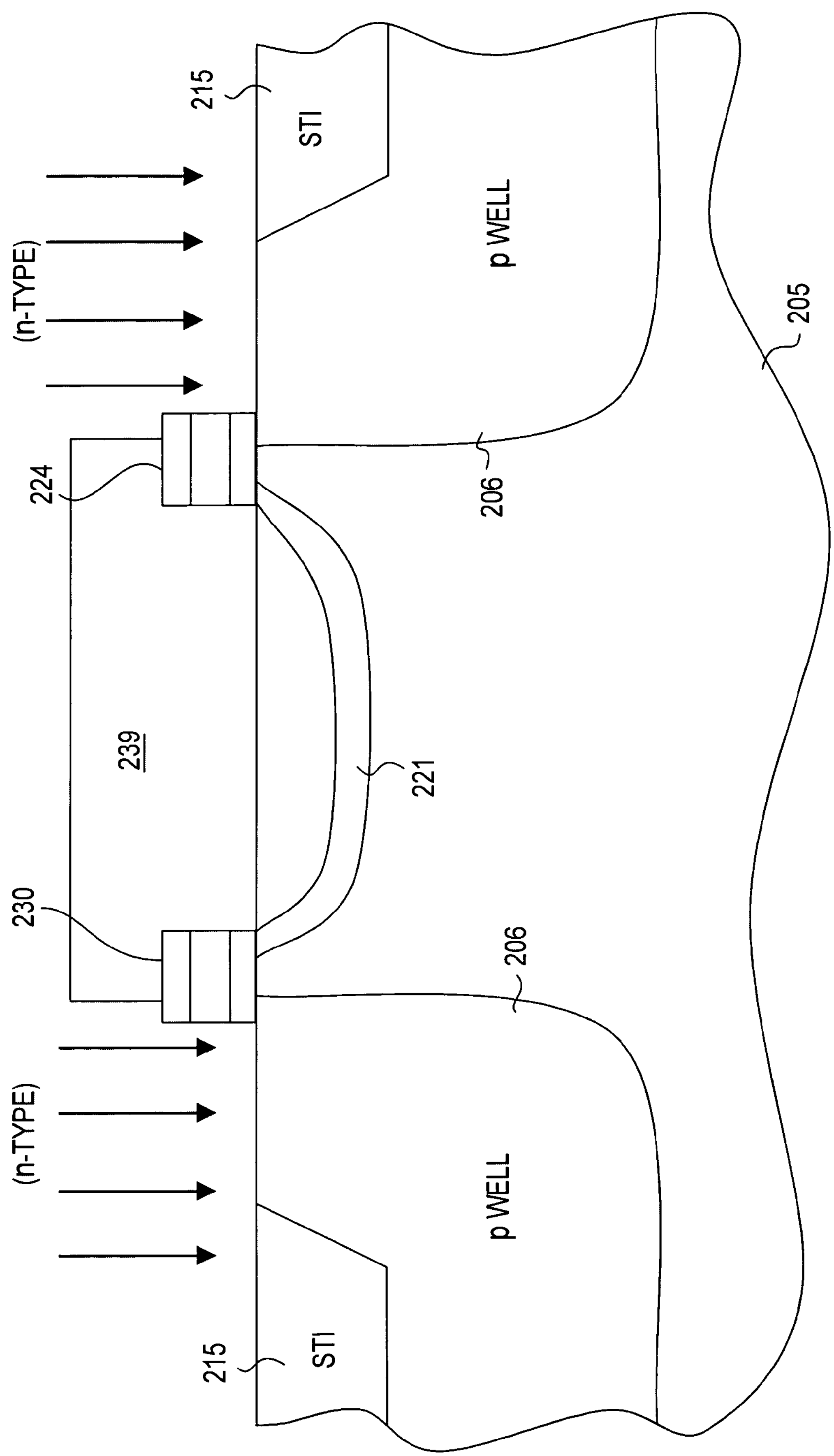
FIG. 26 illustrates the pixel cell of FIG. 25 at a subsequent stage of fabrication.

The second mask 233 is removed and a third mask 239 is placed over the transfer gate 230, the HDR transistor 224 and the n-layer 221 (FIG. 26). An implant of a second conductivity type (e.g., n-type) is conducted to form the charge collection region 219 on the unmasked side of the HDR transistor 224 and the floating diffusion region 228 on the unmasked side of the transfer gate 230. This implant is self-aligned to the gate stacks of the transfer gate 230 and the HDR transistor 224.

Figure 27:
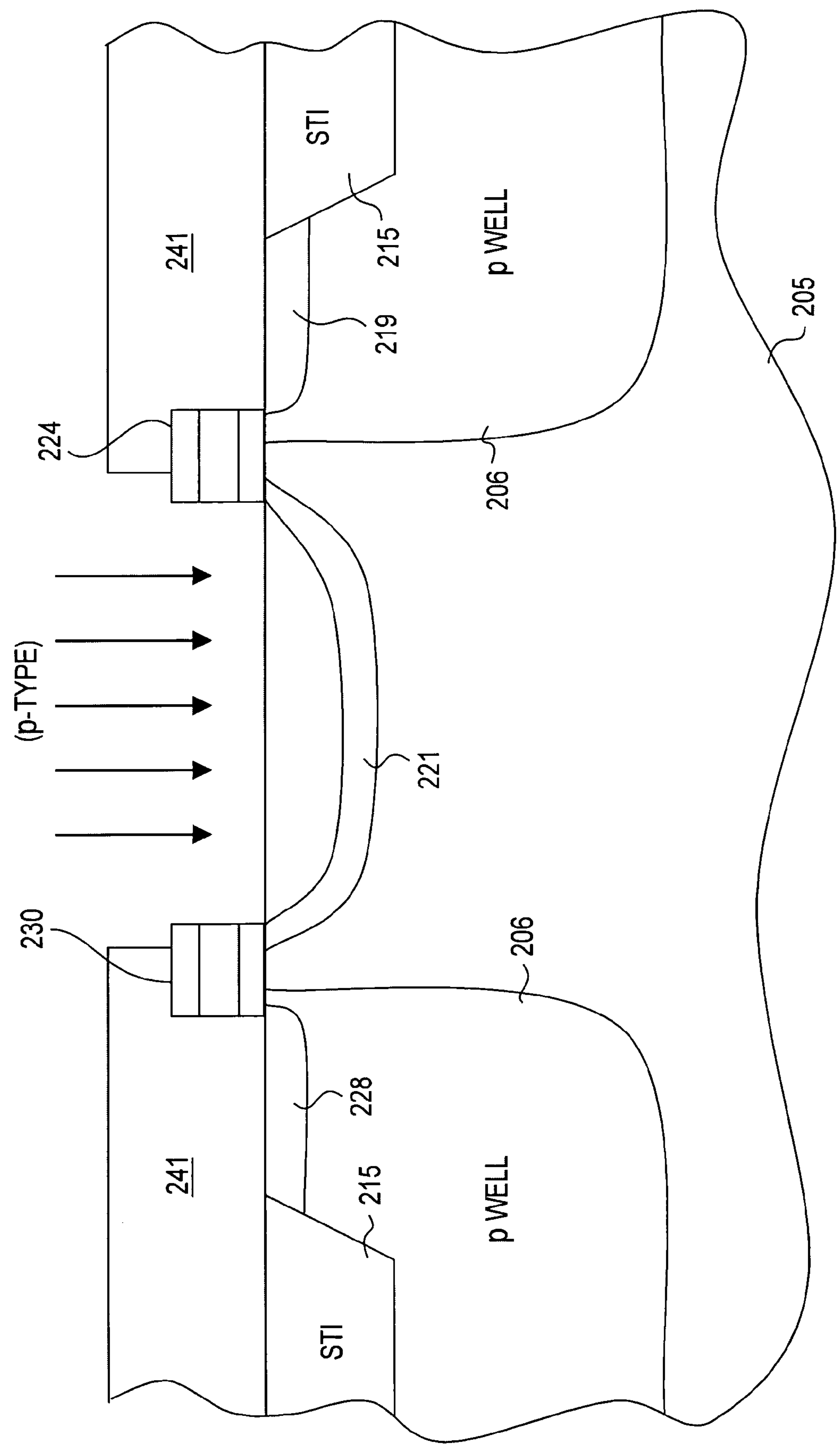
FIG. 27 illustrates the pixel cell of FIG. 26 at a subsequent stage of fabrication.
Figure 28:
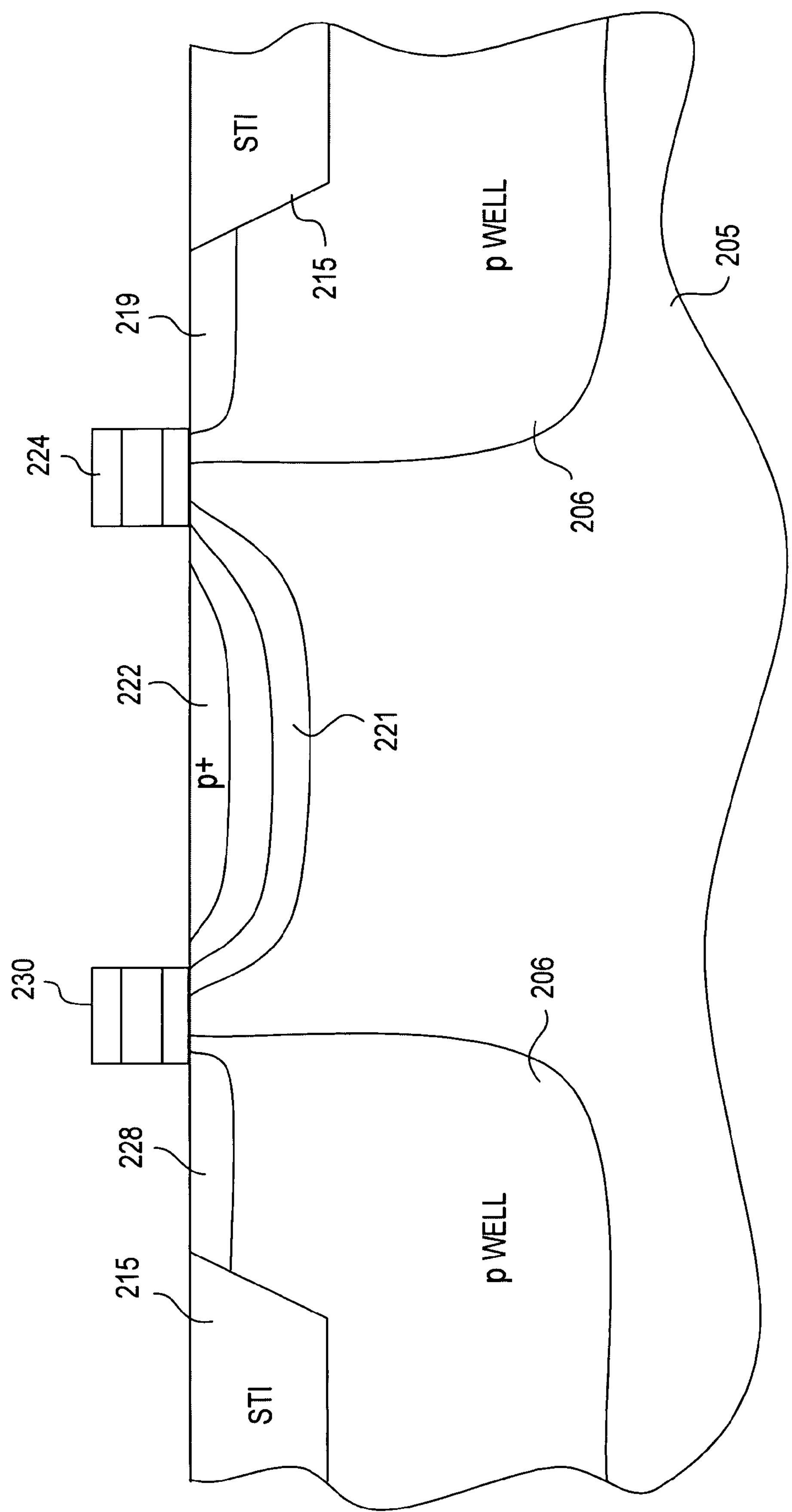
FIG. 28 illustrates the pixel cell of FIG. 27 at a subsequent stage of fabrication.

The third mask 239 is removed and a fourth mask 241 is placed over the floating diffusion region 228, the transfer gate 230, the HDR transistor 224 and the charge collection region 219, exposing only the area where the photosensor 226 will be formed (FIG. 27). Subsequently, an implant of a first conductivity type (e.g., p-type) is conducted to form the overlying layer 222 of the photosensor 226, as shown in FIG. 28. The fourth mask 241 is then removed. A spacer oxide layer 225 may be blanket deposited over the pixel cell 220, as shown in FIG. 22*a*, or the spacer oxide layer 225 may be etched back and a spacer wall 229 may be selectively deposited on the charge collection region 219 side of the HDR transistor 224 and the floating diffusion region 228 side of the transfer gate 230, as shown in FIG. 22*b*.

FIGS. 23-26 and 29-32 illustrate the formation of HDR transistor 224 of the five transistor (5T) pixel cell 220 of FIG. 22*c*, in the embodiment in which the HDR transistor 224 has a charge collection region 219, highly-doped region 213 and a punch-through protection implant 223. The formation of the STI regions 215, the gate stacks of the transfer gate 230 and the HDR transistor 224, the p-wells 206, the n-layer 221, the floating diffusion region 228 and the charge collection region 219 are formed as described above with respect to FIGS. 23-26.

Figure 29:
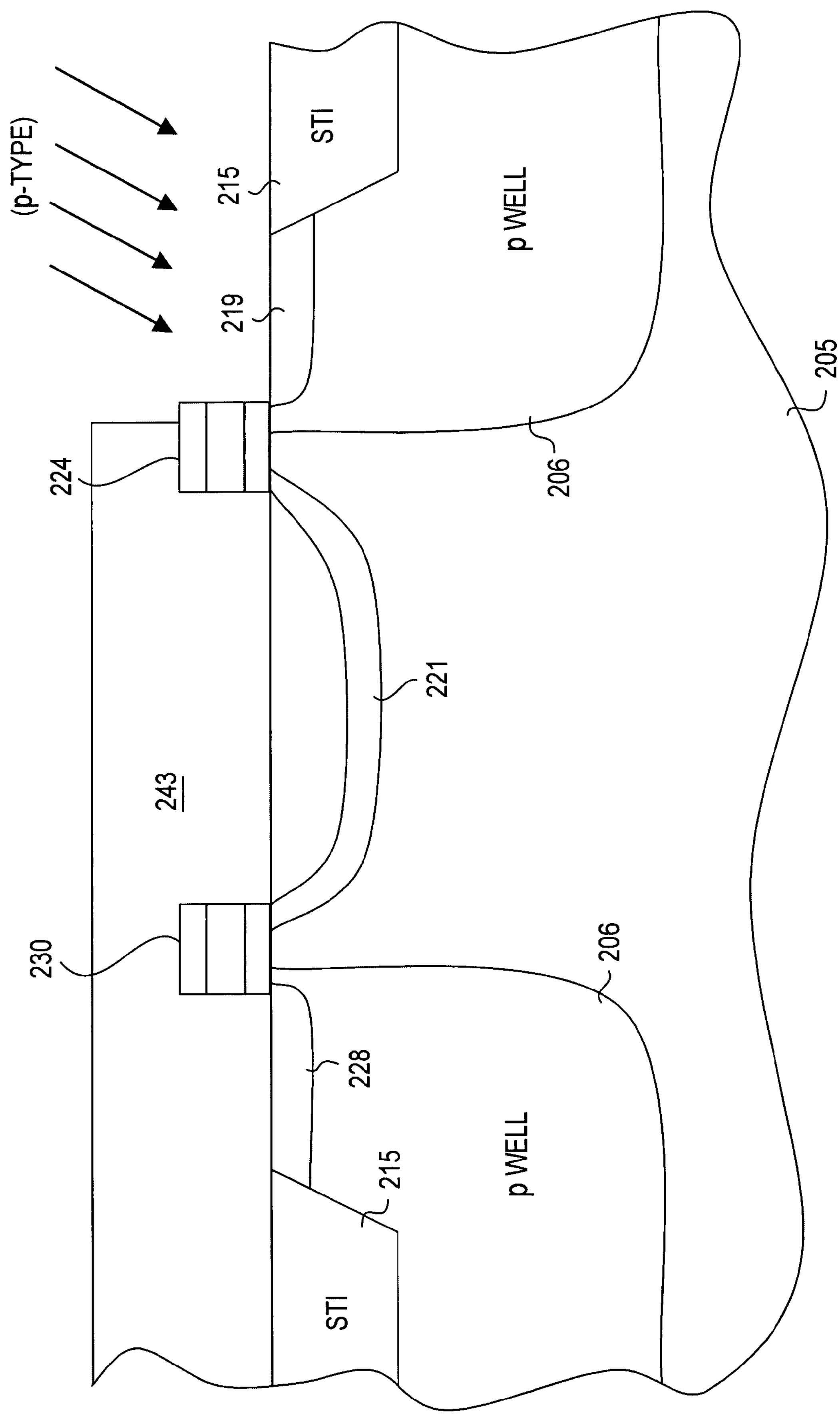
FIG. 29 illustrates the pixel cell of FIG. 26 at a subsequent stage of fabrication.
Figure 30:
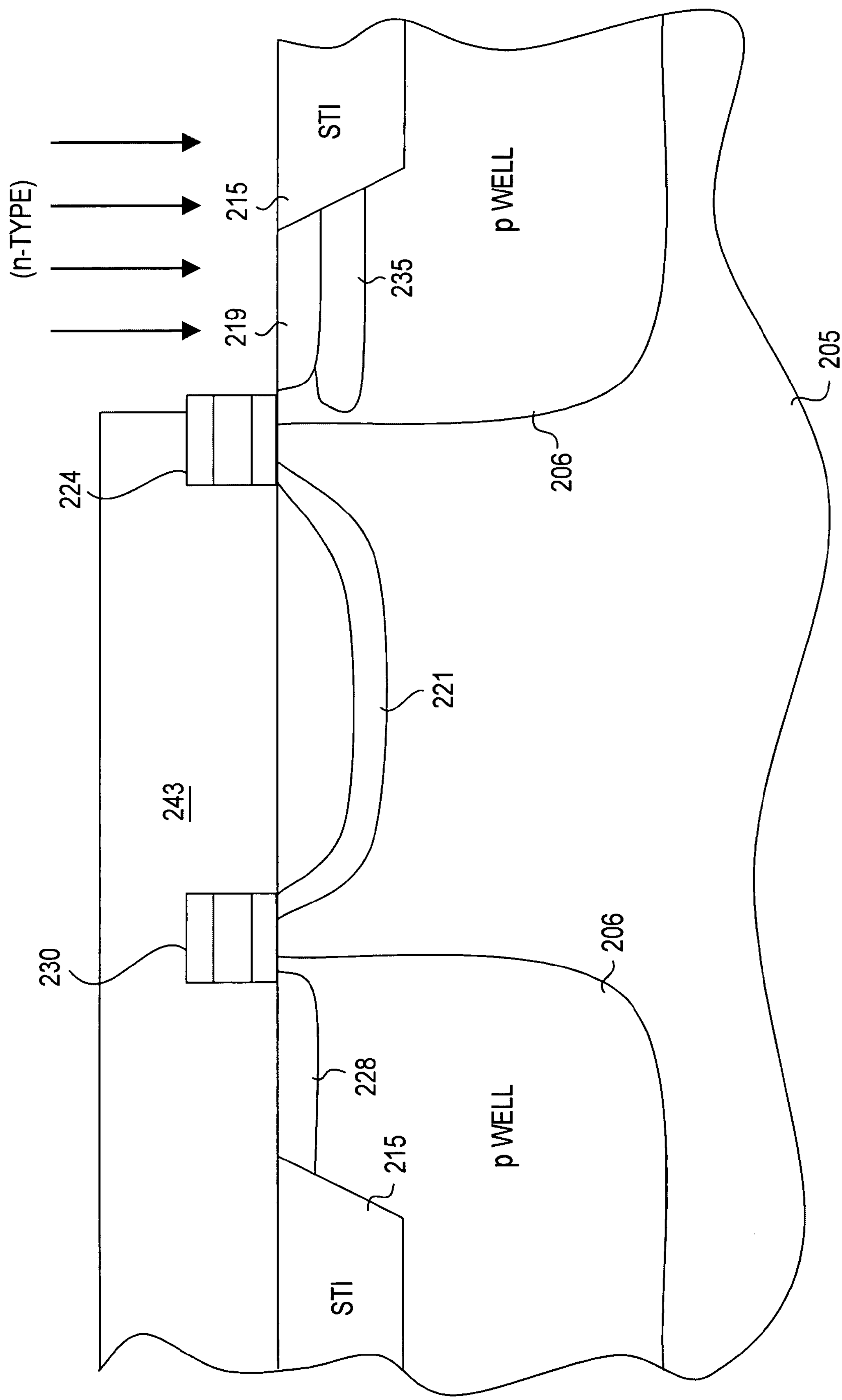
FIG. 30 illustrates the pixel cell of FIG. 29 at a subsequent stage of fabrication.

Turning to FIG. 29, the third mask 239 is removed and a fourth mask 243 is placed over the floating diffusion region 228, the transfer gate 230, the n-layer 221 and the HDR transistor 224. A halo angled implant of a first conductivity type (e.g., p-type) is conducted to implant a halo implanted region 235 below the charge collection region 219, as illustrated on FIG. 30. As mentioned above, the four halo implants may be conducted around the sides of the HDR transistor 224.

Subsequent to the halo implant, a heavier dose n-type implant (FIG. 30) is conducted. This implant forms the highly-doped region 213 and converts a portion of the p-type halo implant region 235 to an n-type portion, leaving only a p-type hole, which is the punch-through protection implant 223, as shown in FIG. 31.

Figure 31:
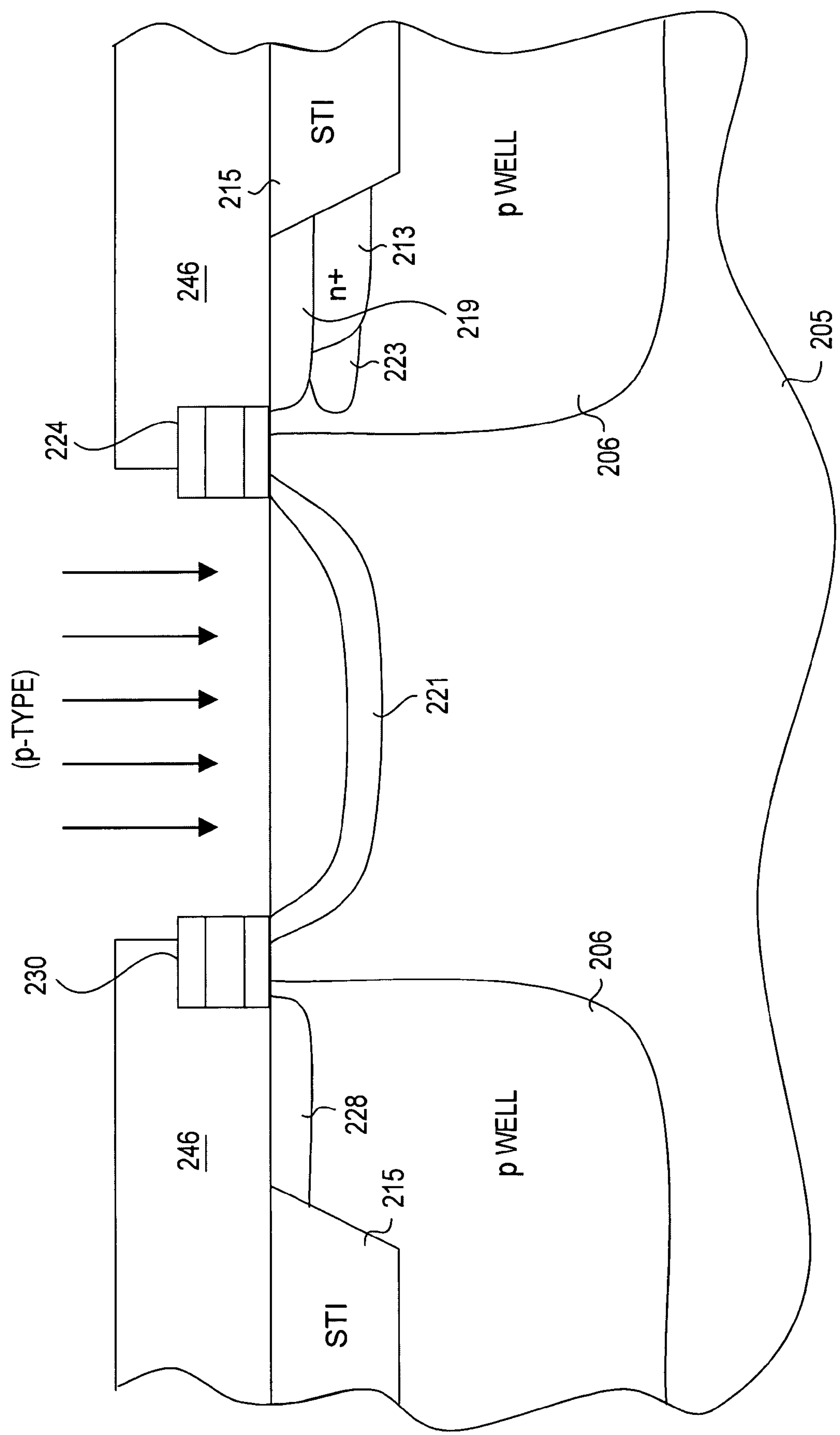
FIG. 31 illustrates the pixel cell of FIG. 30 at a subsequent stage of fabrication.
Figure 32:
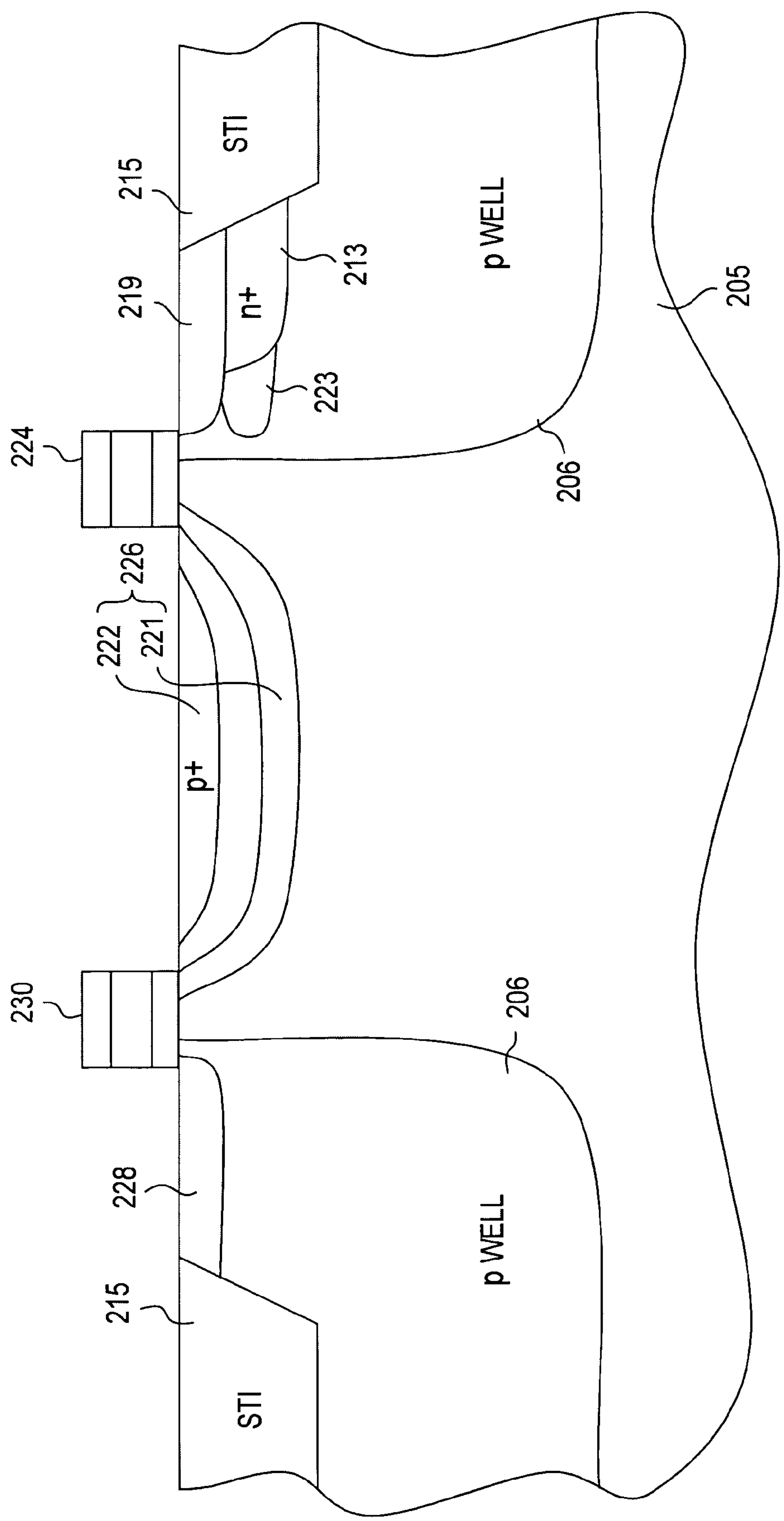
FIG. 32 illustrates the pixel cell of FIG. 31 at a subsequent stage of fabrication.

The fourth mask 243 is removed and a fifth mask 246 is placed over the floating diffusion region 228 and the transfer gate 230, as well as the HDR transistor 224 and the charge collection region 219, exposing only the area where the photosensor 226 will be formed (FIG. 31). Subsequently, an implant of a first conductivity type (e.g., p-type) is conducted to form the overlying layer 222 of the photosensor 226, as shown in FIG. 32. The fifth mask 246 is removed. A spacer oxide layer 225 may be blanket deposited over the pixel cell 220, as shown in FIG. 22*a*, or the spacer oxide layer 225 may be etched back and a spacer wall 229 may be formed on the charge collection region 219 side of the HDR transistor 224 and the floating diffusion region 228 side of the transfer gate 230, as shown in FIG. 22*b*.

Figure 33:
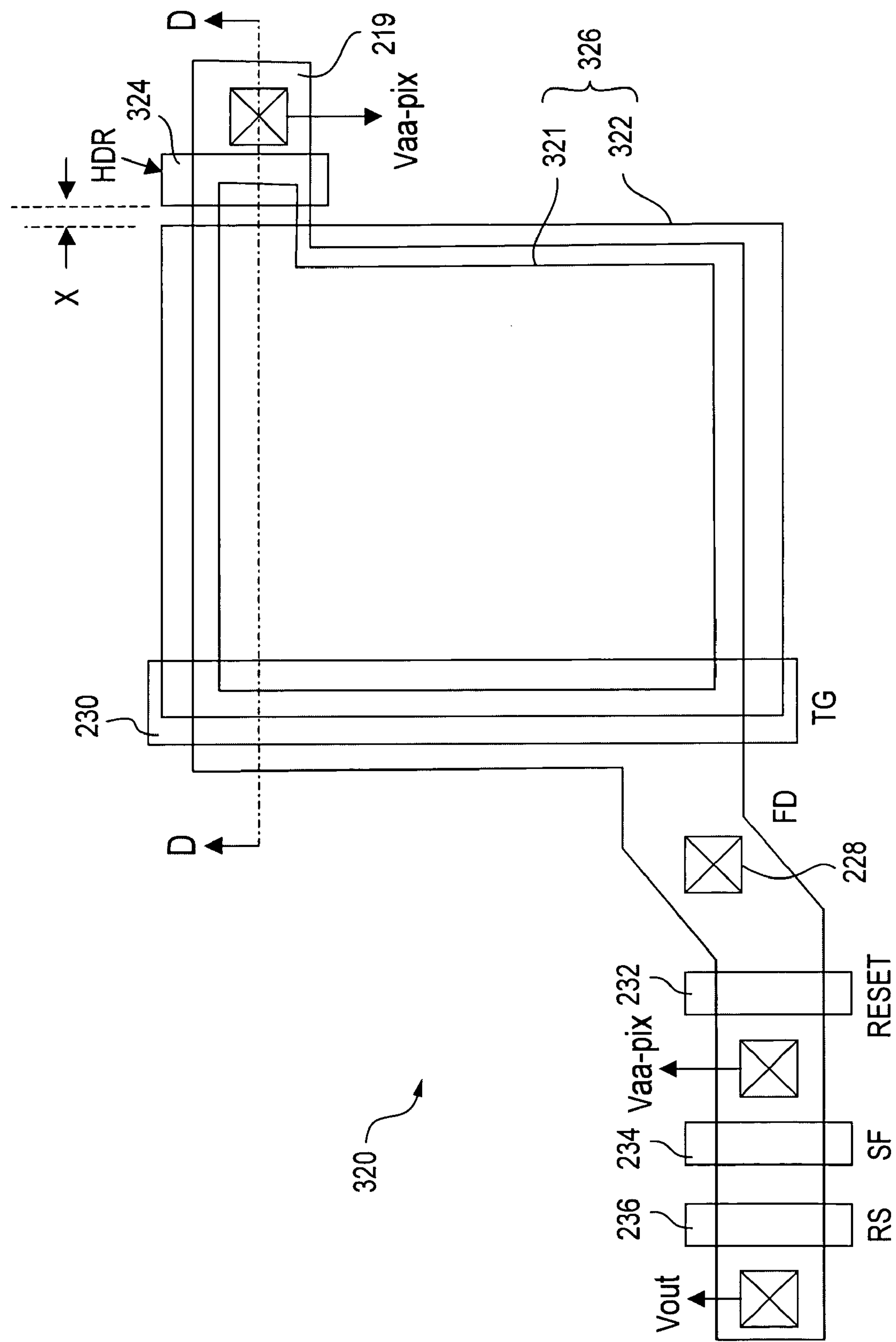
FIG. 33 is a plan view of an exemplary pixel cell according to another embodiment of the present invention.

FIG. 33 illustrates a plan view of another exemplary pixel cell 320 of the present invention. In the illustrated embodiment, the HDR transistor 324 is located on a side of the photosensor 326 opposite the side where the transfer gate 230 is located. However, the overlying layer 322 is pulled back from the HDR transistor 324 by a distance X. FIGS. 34*a* to 34*d* are cross sectional views of the pixel cell 320 taken along line D-D. FIGS. 34*a* to 34*d* depict various doping profiles that may be similar to the transfer gate 230 or the reset transistor 232, whichever profile provides the desired channel characteristics for the HDR transistor 324 of the pixel cell 320. The n-layer 321 of the photosensor 326 of FIG. 33 lies underneath the overlying layer 322, as shown in cross sections FIGS. 34*a* to 34*d*.

Figure 34A:
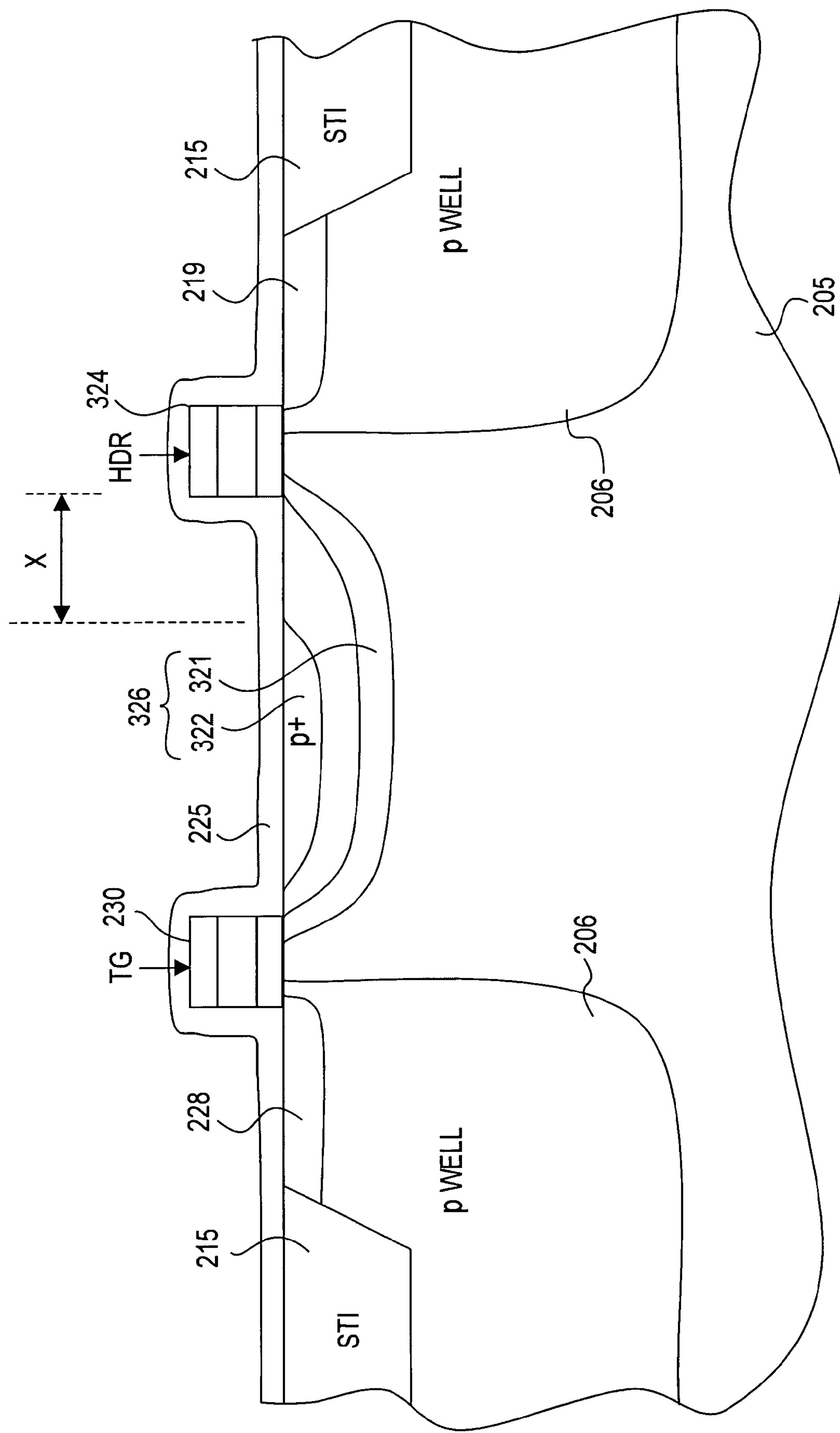
FIGS. 34*a-d* are cross sections of the pixel cell of FIG. 33 having various implants and insulating layers, taken along line D-D.

Turning now to FIG. 34*a*, a photosensor 326 has a transfer gate 230 with a floating diffusion region 228 on one side and a HDR transistor 324 with a charge collection region 219 on the opposite side. The implant for the charge collection region 219 may be the same implant as for the diffusion region 228, and thus may be simultaneously formed. The overlying layer 322 of the photosensor 326 has been shifted away from the HDR transistor 324 by a distance X. This shift does not change the number of masks required; it only alters the location of the mask. The insulating layer 225 has been blanket deposited over the photosensor 326, the transfer gate 230, the floating diffusion region 228, the HDR transistor 324, and the charge collection region 219. The floating diffusion region 228 may also comprise a punch-through protection implant and a highly-doped drain region (not shown) as described above with respect to punch-through protection implant 23 and highly-doped region 13 in FIGS. 5*c*, 16*c*, and 22*c*. In either case, the transfer gate 230 and floating diffusion region 228 may have an insulating layer 225 blanket deposited over them or an insulating layer which has been etched back over the transfer gate 230 and a spacer wall on the floating diffusion region side of the transfer gate 230 as described above. However, for illustration purposes, the floating diffusion region 228 shall be described herein as a single lightly doped implant and the insulating layer shall be described as a blanket insulating layer. In FIG. 34*a*, a single blanket insulating layer 225 is deposited over the HDR transistor 324 and the charge collection region 219 as well.

Figure 34B:
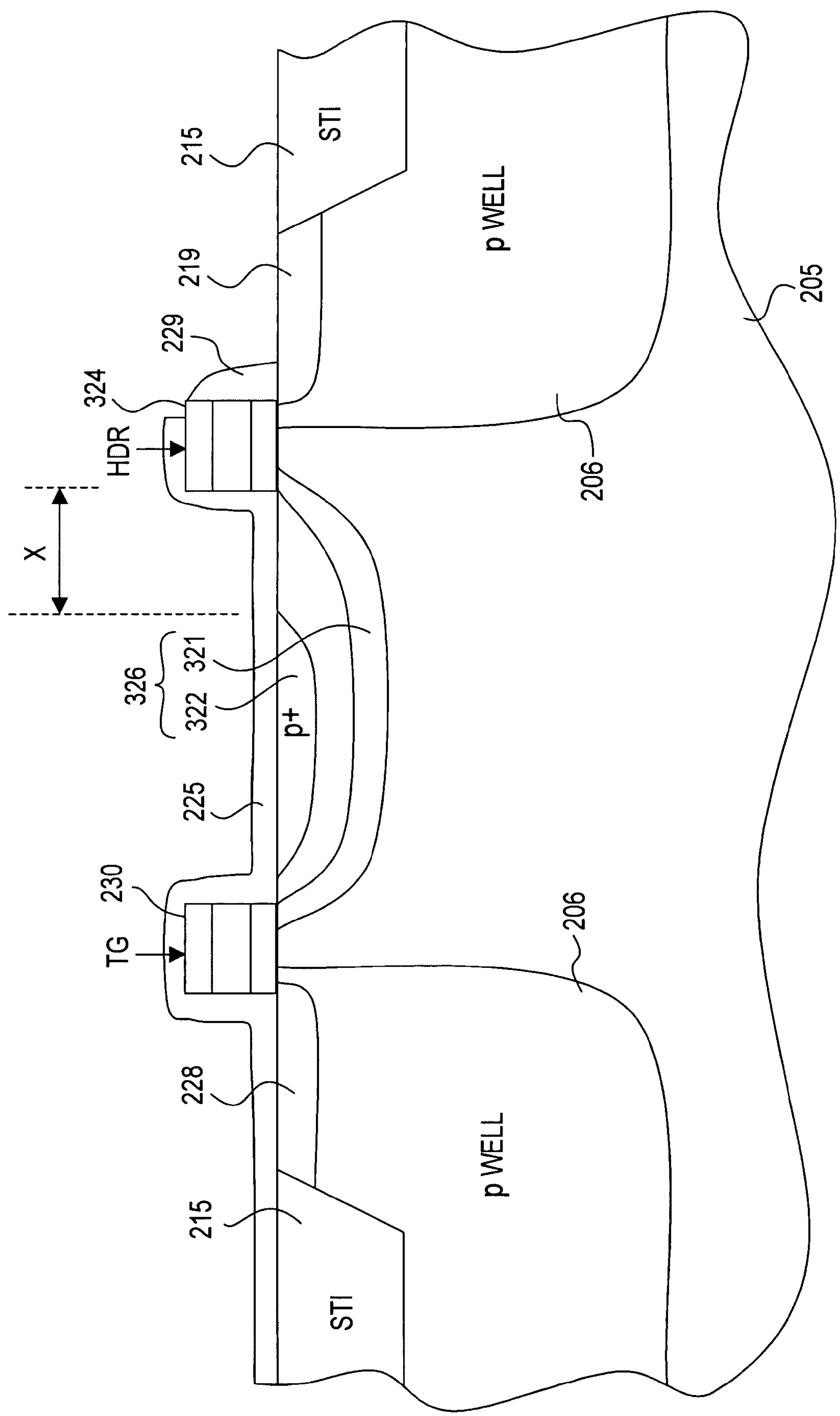

FIG. 34*b* illustrates the HDR transistor 324 having a charge collection region 219 as illustrated in 34*a*, however the insulting layer 225 is etched over the HDR transistor and a spacer wall 229 is formed on the charge collection region 219 side of the HDR transistor 324.

Figure 34C:
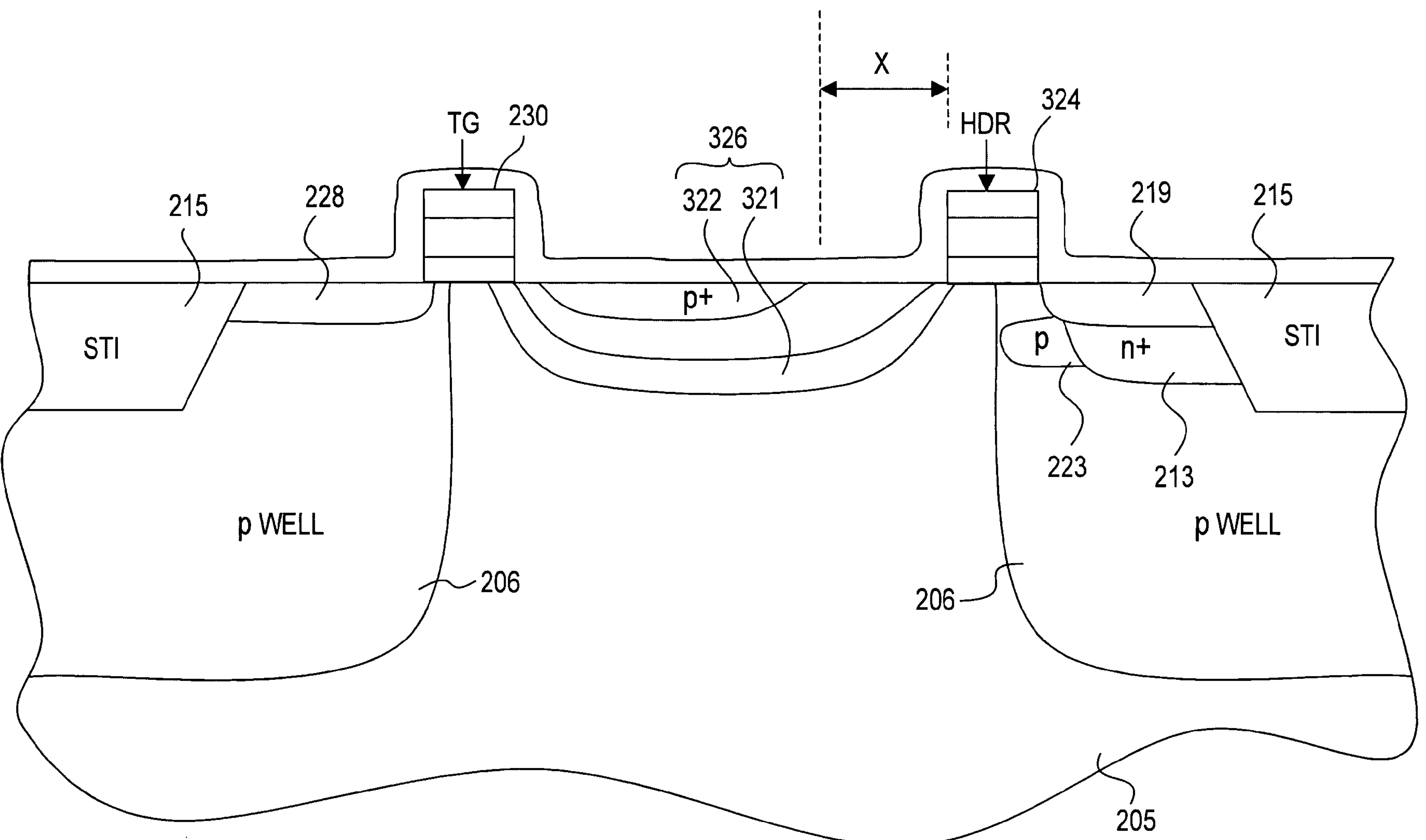

Turning now to FIG. 34*c*, the HDR transistor 324 has the photosensor 326 on one side and a charge collection region 219 of a second conductivity type (e.g., n-type), a highly-doped drain region 213 of a second conductivity type and a punch-through protection implant 223 of a first conductivity type (e.g., p-type) on a second side. The punch-through protection implant 223 lies between the photosensor 326 and the highly-doped drain region 213. However, as with the embodiments depicted in FIGS. 34*a* and 34*b*, the overlying layer 322 of the photosensor 326 has been shifted away from the HDR transistor 324 by a distance X. The insulating layer 225 has been blanket deposited over the photosensor 326, the transfer gate 230, the floating diffusion region 228, the HDR transistor 324, and the charge collection region 219. The floating diffusion region 228 may also comprise a punch-through protection implant and a highly-doped drain region (not shown) as described above. However, for simplicity, the floating diffusion region 228 shall be described in conjunction with this embodiment as a single lightly doped implant. Similarly, the transfer gate 230 and floating diffusion region 228 may have an insulating layer 225 blanket deposited over them or an insulating layer which has been etched back over the transfer gate 230 and a spacer wall on the floating diffusion region side of the transfer gate 230 as described above. However, for illustration purposes, the insulating layer shall be described herein as a blanket insulating layer.

Figure 34D:
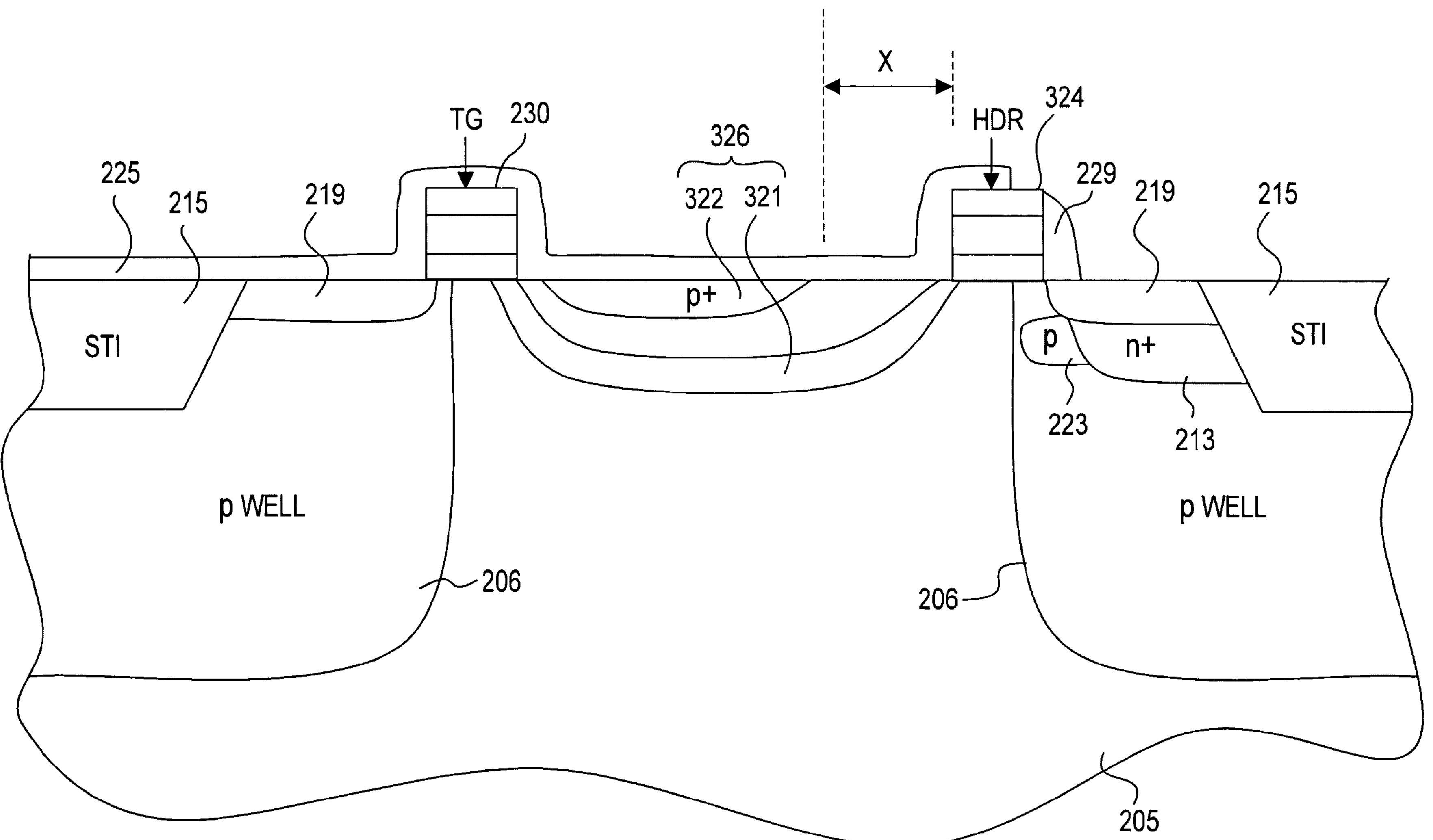

FIG. 34*d* illustrates the HDR transistor 324 having a charge collection region 219,a highly-doped drain region 213, and a punch-through protection implant 223, as illustrated in FIG. 34*c*. However the insulating layer 225 is etched over the HDR transistor 324 and a spacer wall 229 is formed on the charge collection region 219 side of the HDR transistor 324.

Figure 35:
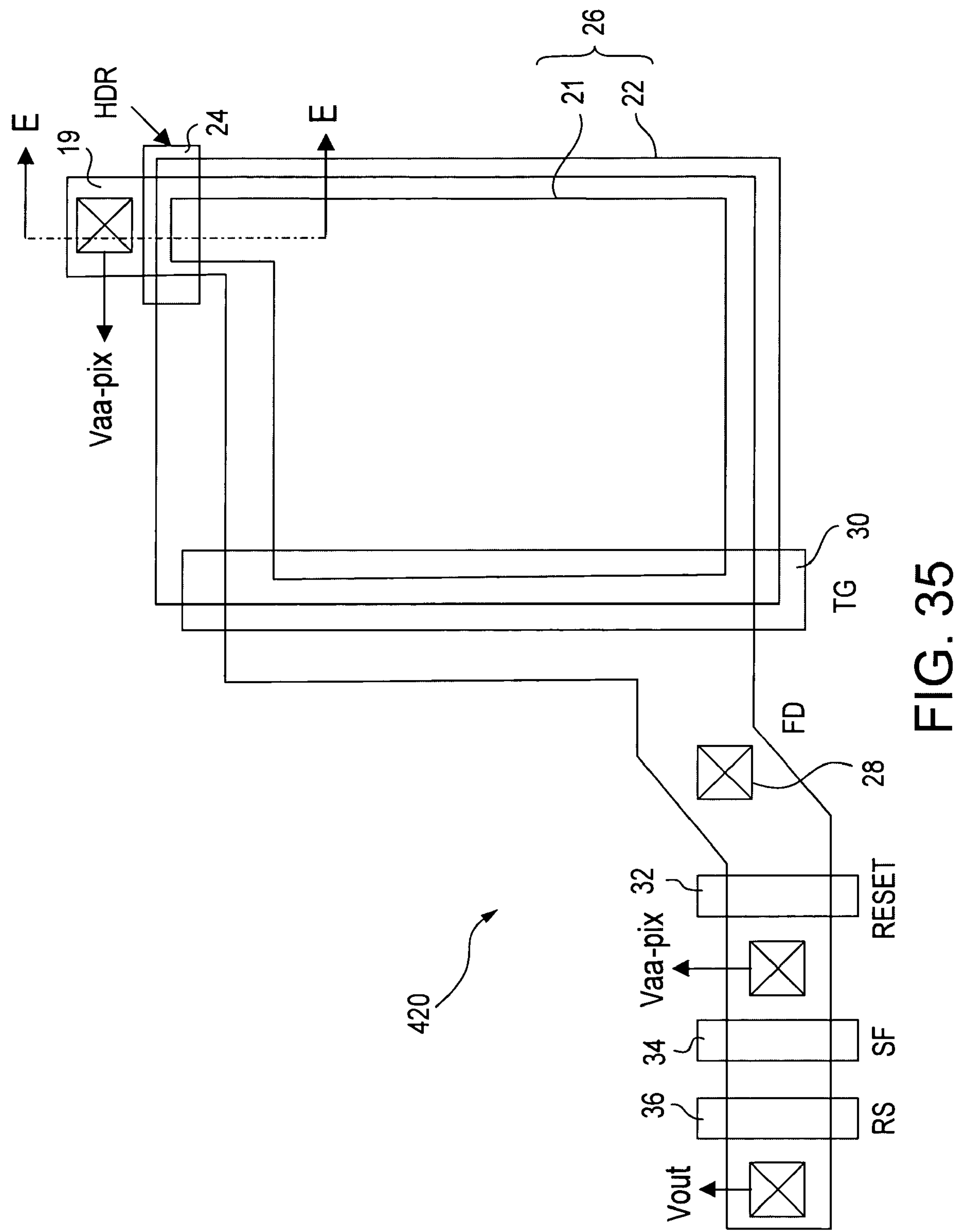

FIG. 35 is a plan view of another exemplary pixel cell 420 of the invention. In this illustrated embodiment, the HDR transistor 24 is located on a side of the photosensor 26 and arranged perpendicular to the transfer gate 30. FIGS. 5*a* to 5*c* are cross sectional views of the pixel cell 420 taken along line E-E, depicting various doping profiles that may be similar to the transfer gate 30 or the reset transistor 32, whichever profile provides the desired channel characteristics for the HDR transistor 24 of the pixel cell 420.

Figure 36:
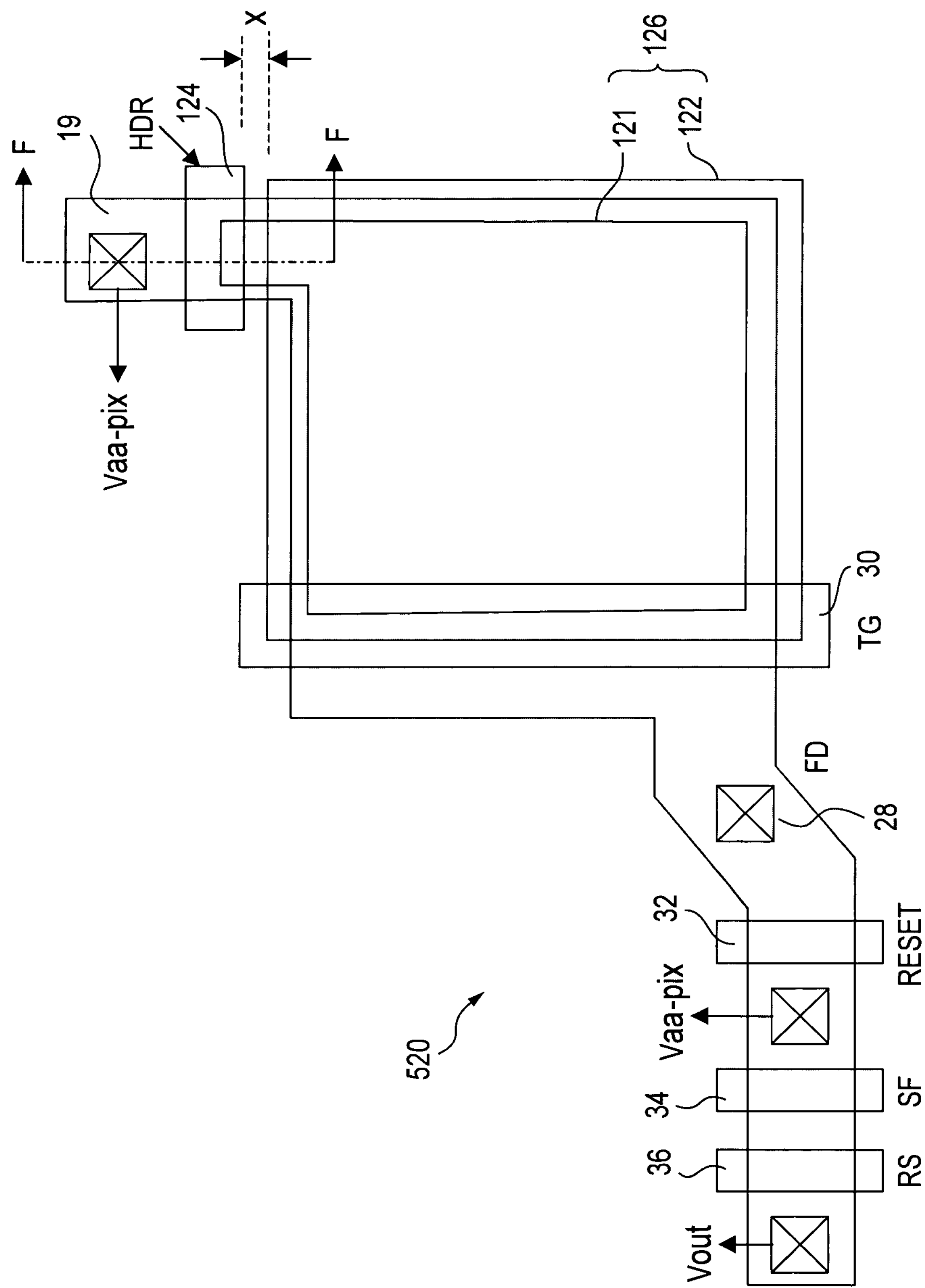
FIG. 36 is a plan view of an exemplary pixel cell according to another embodiment of the present invention.

FIG. 36 is a plan view of another exemplary pixel cell 520 of the invention. As with the embodiment illustrated in FIG. 35, the HDR transistor 124 is located on a side of the photosensor 126 and is arranged perpendicular to the transfer gate 30. However, the overlying layer 122 of the photosensor 126 is pulled back from the HDR transistor 124 by a distance X. FIGS. 16*a* to 16*c* are cross sectional views of the pixel cell 520 taken along line F-F, depicting various doping profiles that may be similar to the transfer gate 30 or the reset transistor 32, whichever profile provides the desired channel characteristics for the HDR transistor 124 of the pixel cell 520.

Figure 37:
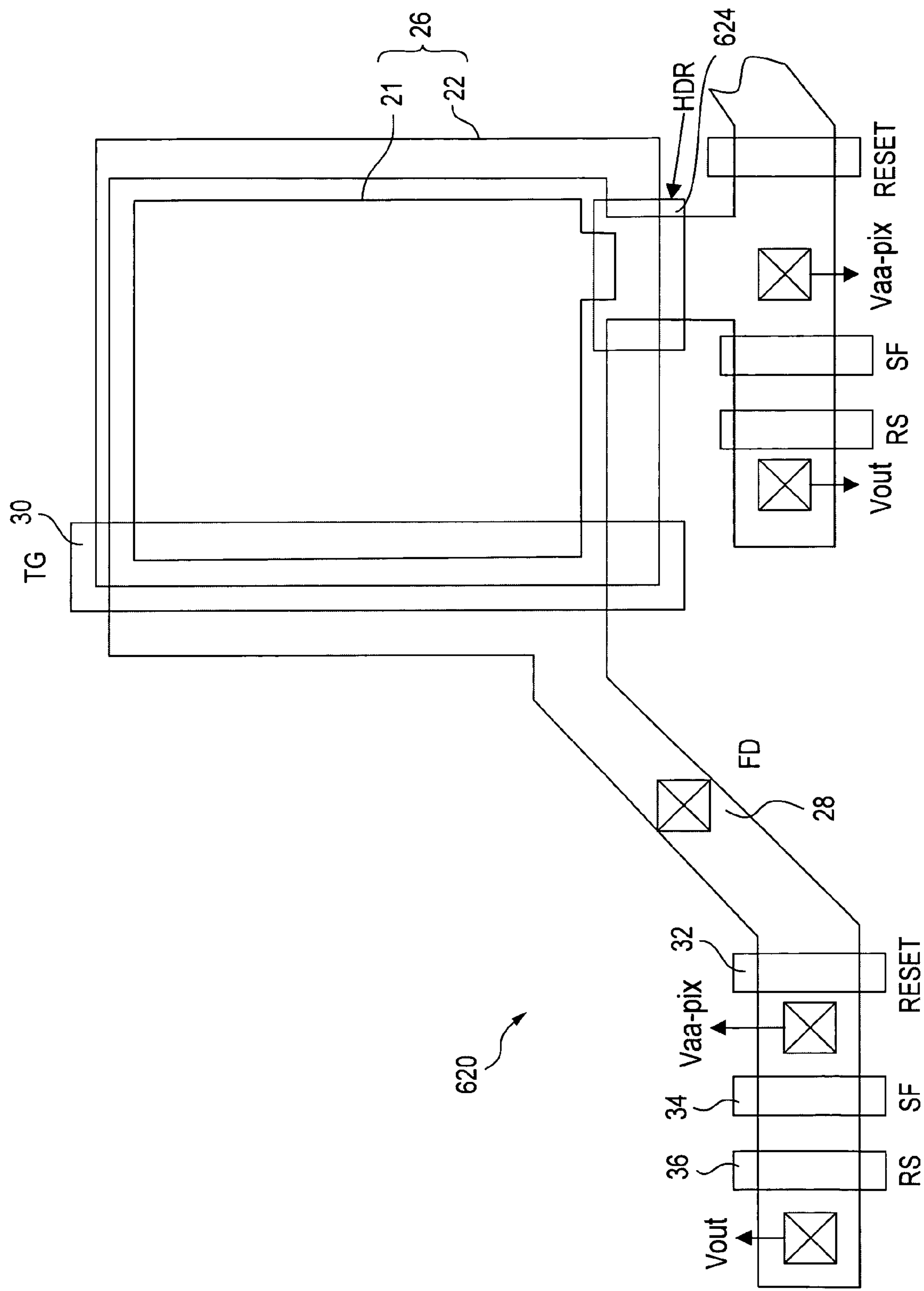
FIG. 37 is a plan view of an exemplary pixel cell according to another embodiment of the present invention.

FIG. 37 illustrates how, with the HDR transistor 624 located on a side of the photosensor 26 but arranged perpendicular to the transfer gate 30, there may be an additional advantage to this perpendicular configuration. In the plan view of pixel cell 620, the floating diffusion region 28 is physically near the array pixel voltage $V_{aa\text{-}pix}$ contact of the neighboring pixel cell (not shown in its entirety). This requires fewer metal connecting lines, thereby increasing incident light to the pixel cell 620 and improving pixel cell efficiency. As with the other above-described embodiments, this configuration may also be constructed such that the overlying layer 22 is pulled back from the HDR transistor 24 by a distance of X in order to reduce leakage through the HDR transistor 24.

Yet another way to control leakage is to modify the second masks (33, 233) described above prior to implanting dopants for the photosensors (26, 126, 226, 326, 726, 826). By providing less masking coverage over the HDR transistor, i.e., by shortening the mask from the photosensor side of the HDR transistor by a distance of Y, both the n-layer (n-doped region) and the overlying layer (p-doped region) of the photosensor are moved farther under the HDR transistor. This will increase the HDR transistor leakage. The cross section of devices according to this modified second mask are shown in FIGS. 38*a* to 38*d* and FIGS. 39*a* to 39*d*. FIGS. 38*a* to 38*d* illustrate cross sections of pixel cells with an HDR transistor 724 that is either on a side of a photosensor 726 that is the same as, or perpendicular to, a side of the photosensor 726 where a transfer gate 730 is located. FIGS. 39*a* to 39*d* illustrate cross sections of pixel cells with an HDR transistor 824 which is located on a side of a photosensor 826 that is opposite to a side where the transfer gate 830 is located.

Figure 38A:
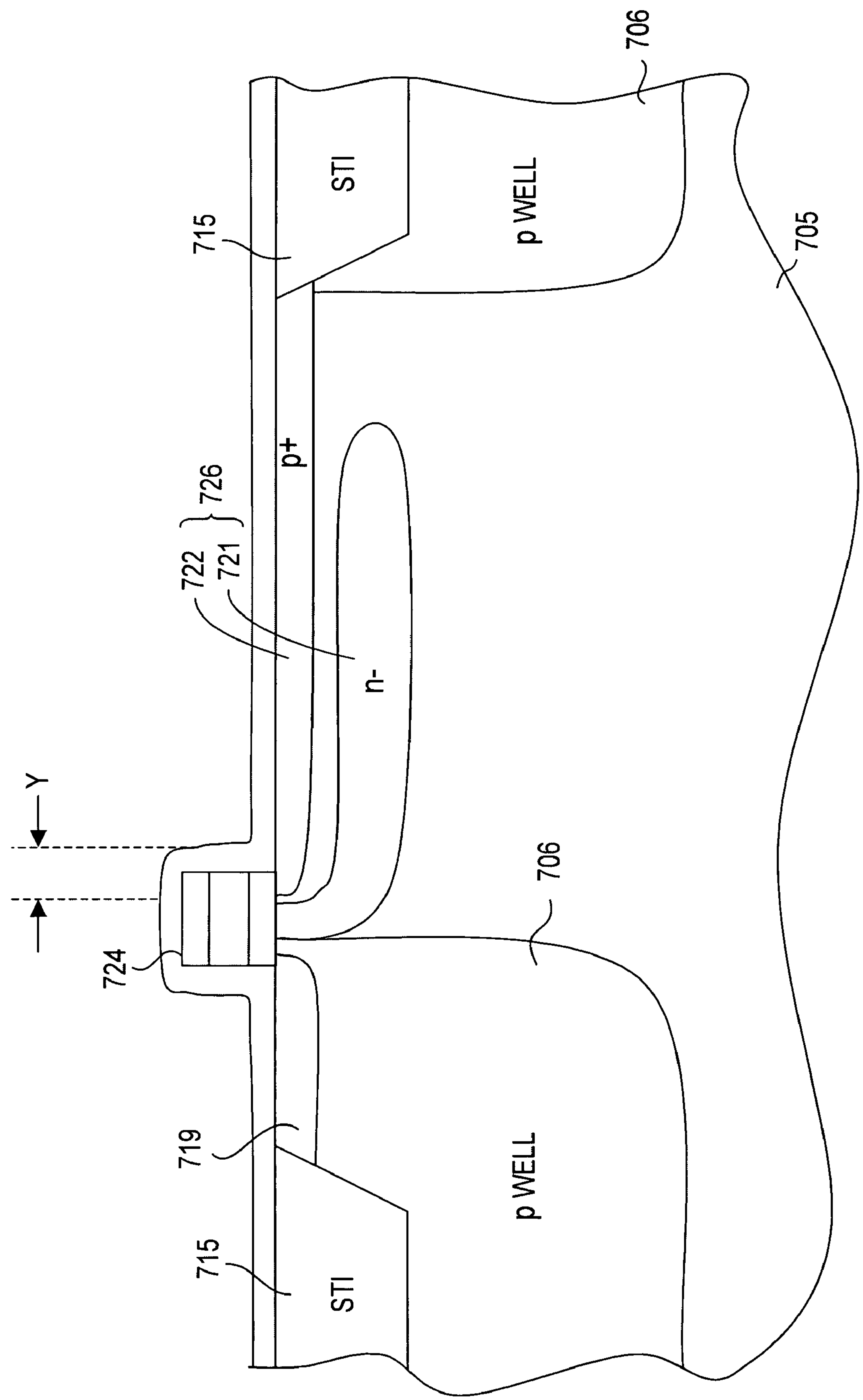
FIG. 38*a*-39*d* are cross sections of a pixel cell according to another embodiment of the present invention.

FIG. 38*a* illustrates a pixel cell with an HDR transistor 724 that has the photosensor 726 on one side and a charge collection region 719. The overlying layer 722 of the photosensor 726 has been shifted closer to the HDR transistor 724 by a distance Y. The insulating layer 725 has been blanket deposited over the photosensor 726, HDR transistor 724, and the charge collection region 719.

Figure 38B:
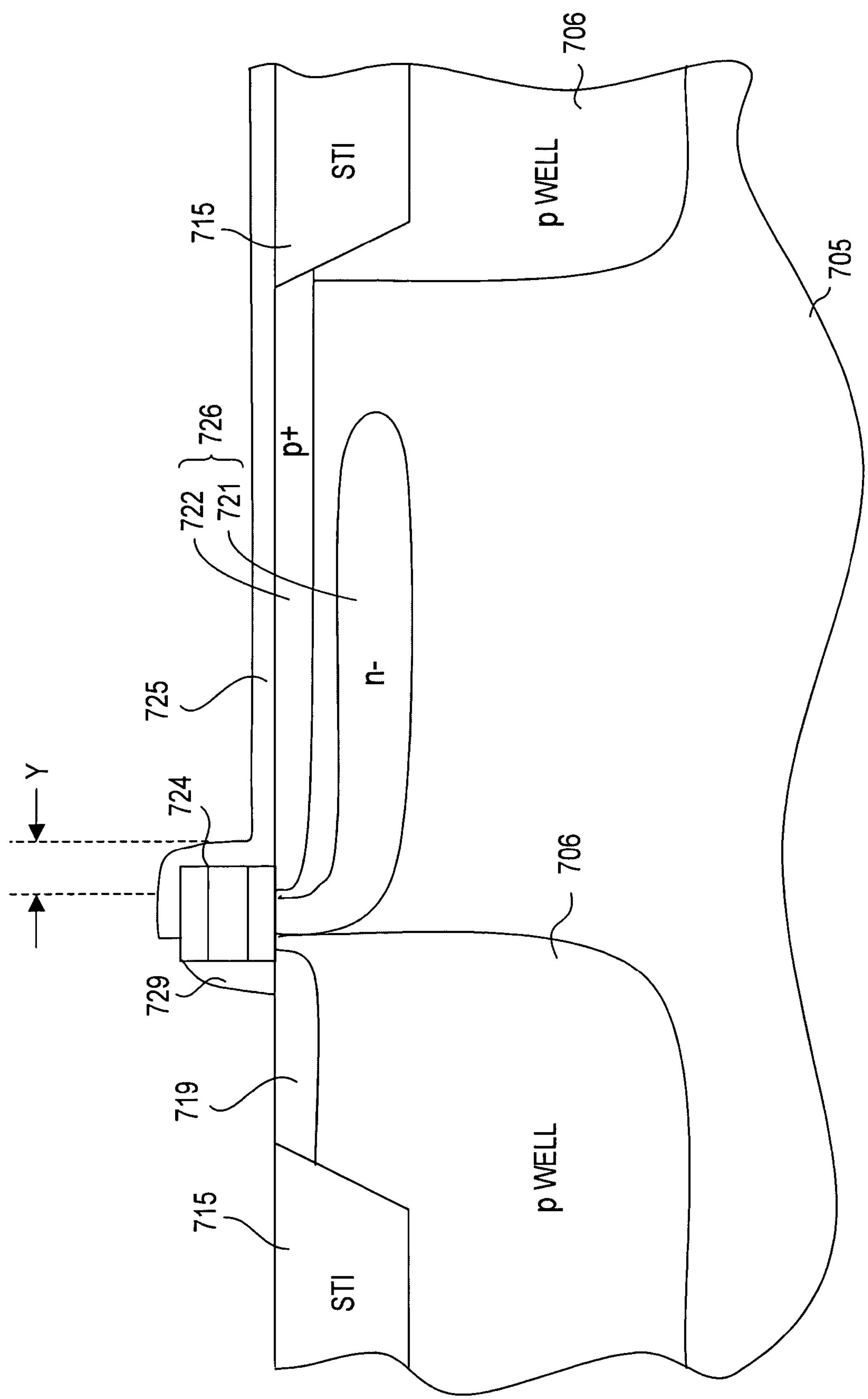

FIG. 38*b* illustrates the HDR transistor 724 having a charge collection region 719 and a shifted overlying layer 722 as illustrated in FIG. 38*a*. However, the insulating layer 725 is etched over the HDR transistor 724, and a spacer wall 729 is formed on the charge collection region 719 side of the HDR transistor 724.

Figure 38C:
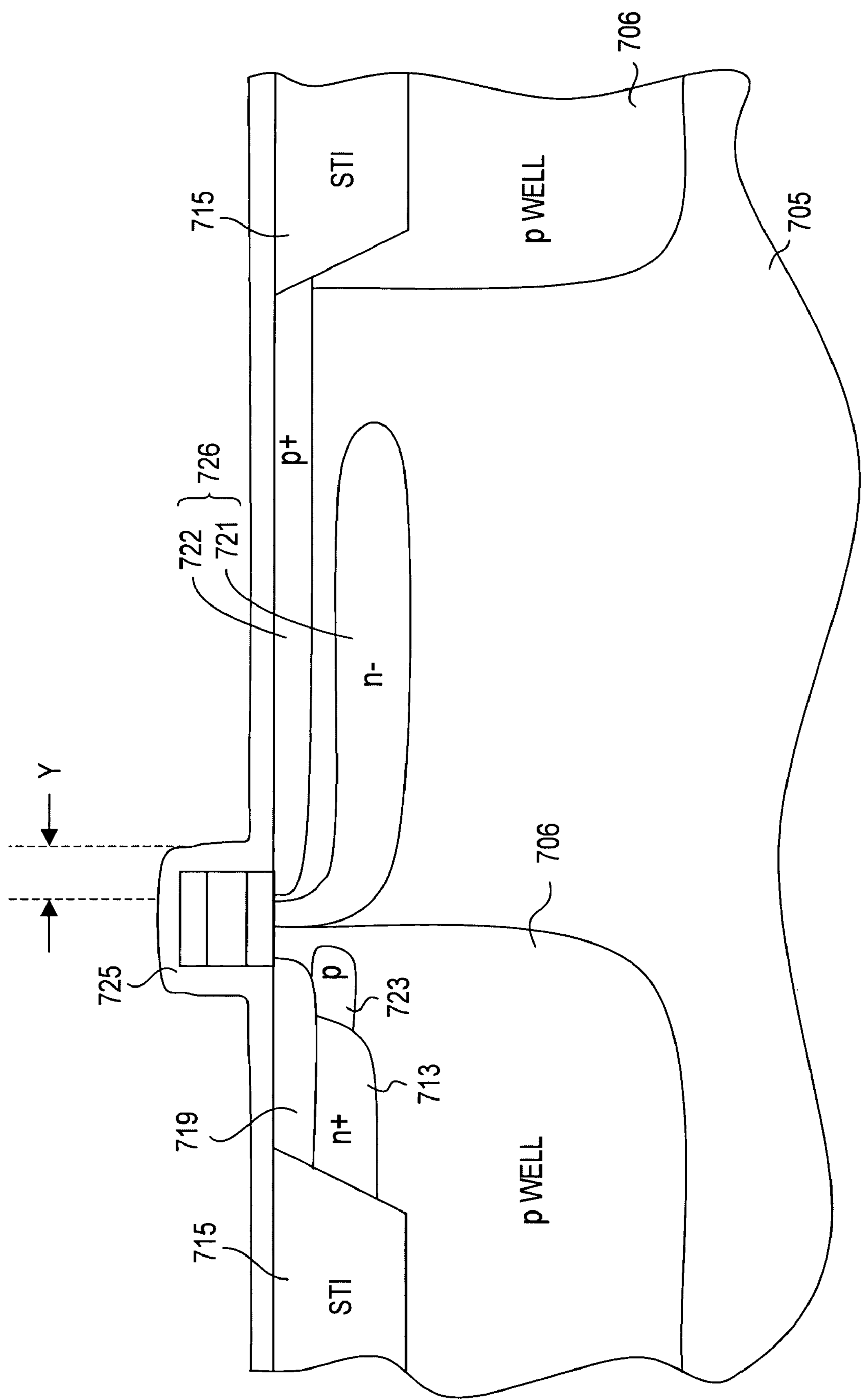

FIG. 38*c* illustrates the HDR transistor 724 having the photosensor 726 on one side and a charge collection region 719, a highly-doped drain region 713 and a punch-through protection implant 723 on a second side. As in FIG. 38*a*, the overlying layer 722 of the photosensor 726 has been shifted closer to the HDR transistor 724 by a distance Y. The insulating layer 725 is blanket deposited over the photosensor 726, HDR transistor 724, and the charge collection region 719.

Figure 38D:
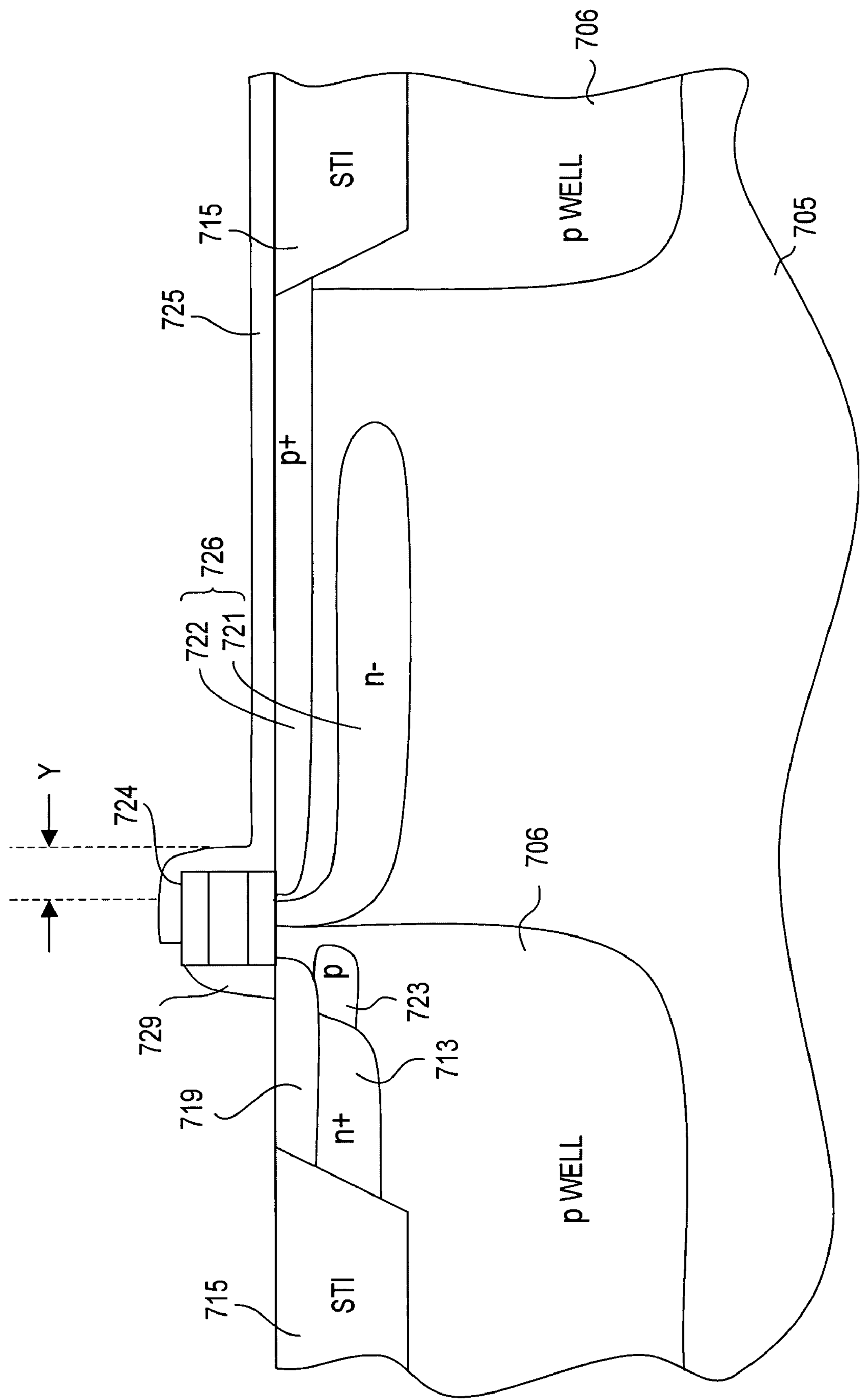

FIG. 38*d* illustrates the HDR transistor 724 having a charge collection region 719, highly-doped drain region 713, and punch-through protection implant 723 on one side of the gate stack and a shifted overlying layer 722 on the other side of the gate stack. The insulating layer 725 is etched over the HDR transistor 724, and a spacer wall 729 is formed on the charge collection region 719 side of the HDR transistor 724.

Figure 39A:
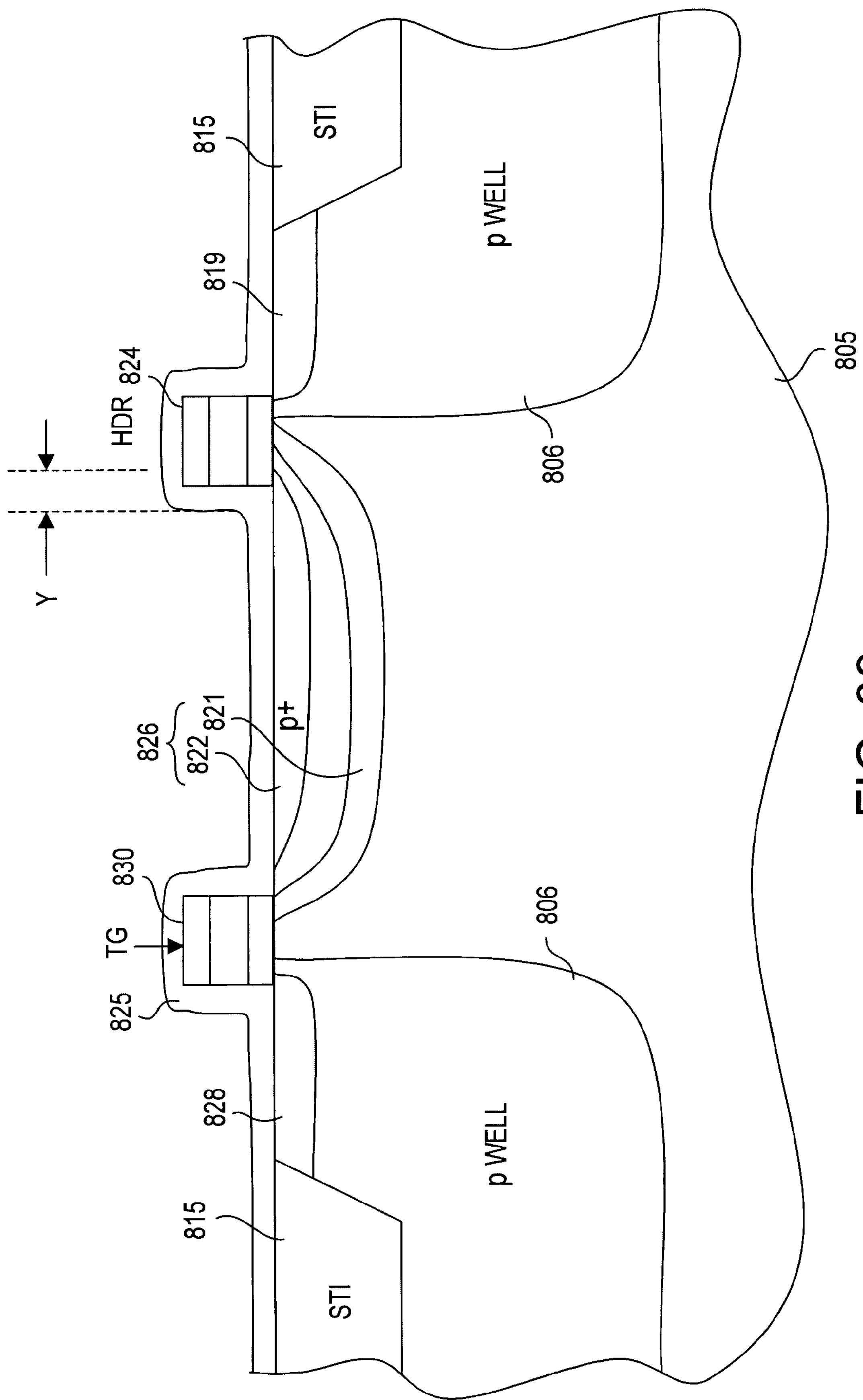

FIG. 39*a* illustrates a photosensor 826 having a transfer gate 830 with a floating diffusion region 828 on one side of the photosensor 826 and a HDR transistor 824 with a charge collection region 819 on the opposite side of the photosensor 826. The overlying layer 822 of the photosensor 826 has been shifted closer to the HDR transistor 824 by a distance Y. As described above, the floating diffusion region 828 may also comprise a punch-through protection implant and a highly-doped drain region (not shown). The transfer gate 830 and floating diffusion region 828 may have an insulating layer 825 blanket deposited over them or an insulating layer which has been etched back over the transfer gate 830 and a spacer wall on the floating diffusion region side of the transfer gate 830 as described above. However, for simplicity, the floating diffusion region 828 shall be described herein as a single lightly doped implant and the insulating layer shall be described as a blanket insulating layer 825.

Figure 39B:
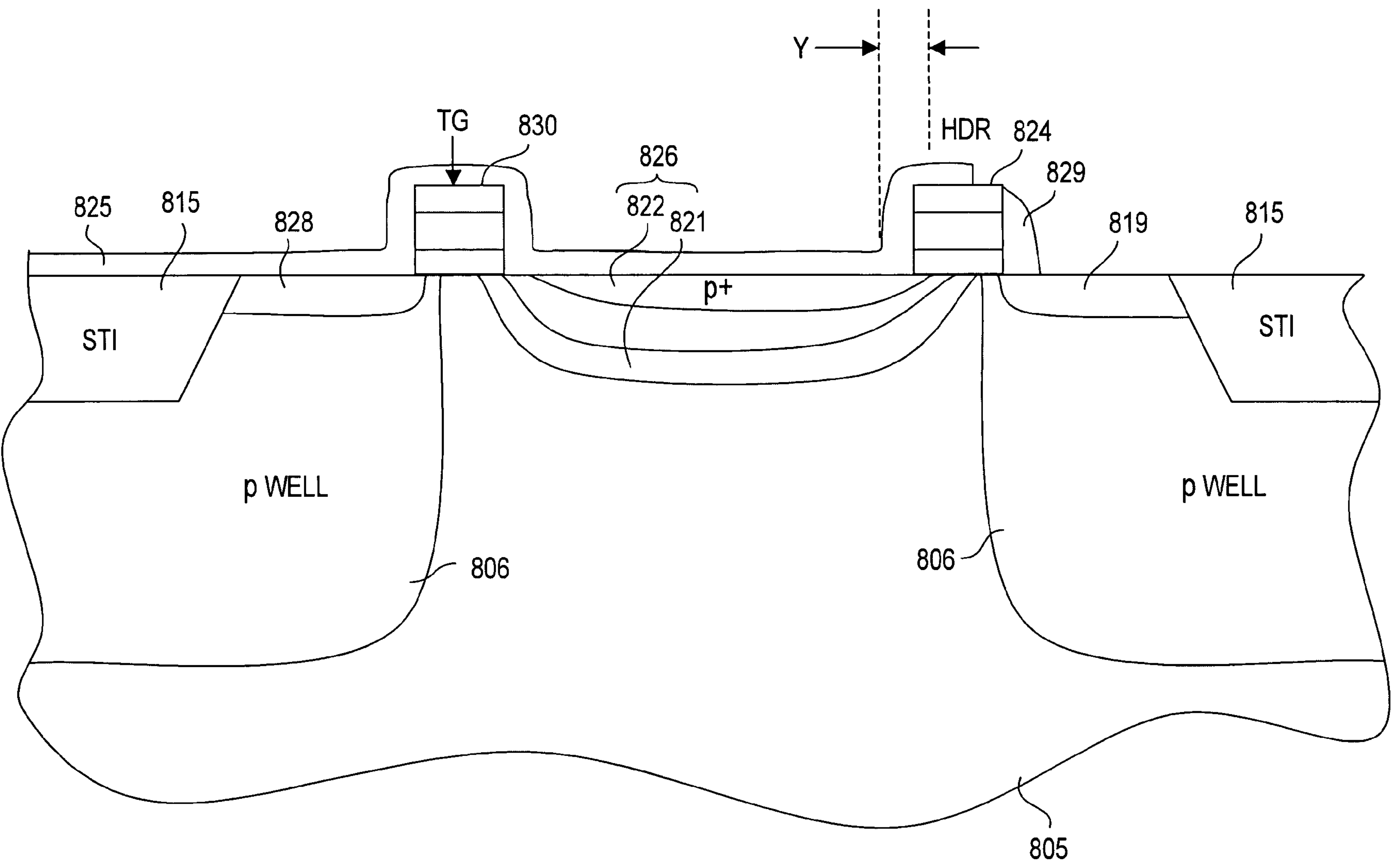

FIG. 39*b* illustrates the HDR transistor 824 having a charge collection region 819 on one side and a photosensor 826 having a shifted overlying layer 822 on the other, as illustrated in FIG. 38*a*. However, the insulating layer 825 is etched over the HDR transistor 824 and a spacer wall 829 is formed on the charge collection region 819 side of the HDR transistor 824.

Figure 39C:
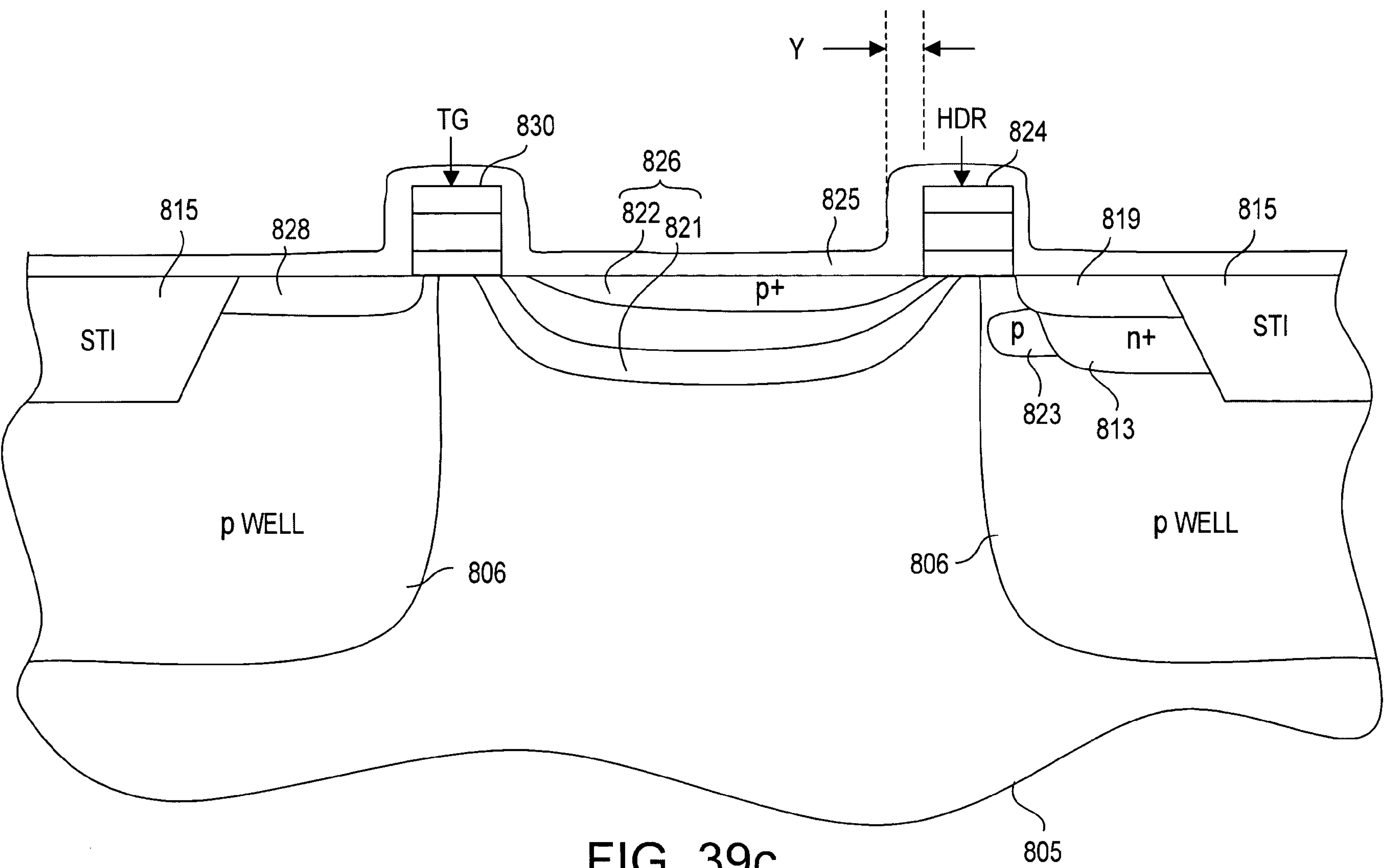

FIG. 39*c* illustrates the HDR transistor 824 having the photosensor 826 on one side and a charge collection region 819, a highly-doped drain region 813 and a punch-through protection implant 823 on the opposite side. As in FIG. 39*a*, the overlying layer 822 of the photosensor 826 has been shifted closer to the HDR transistor 824 by a distance Y. The insulating layer 825 is blanket deposited over the photosensor 826, HDR transistor 824, and the charge collection region 819.

Figure 39D:
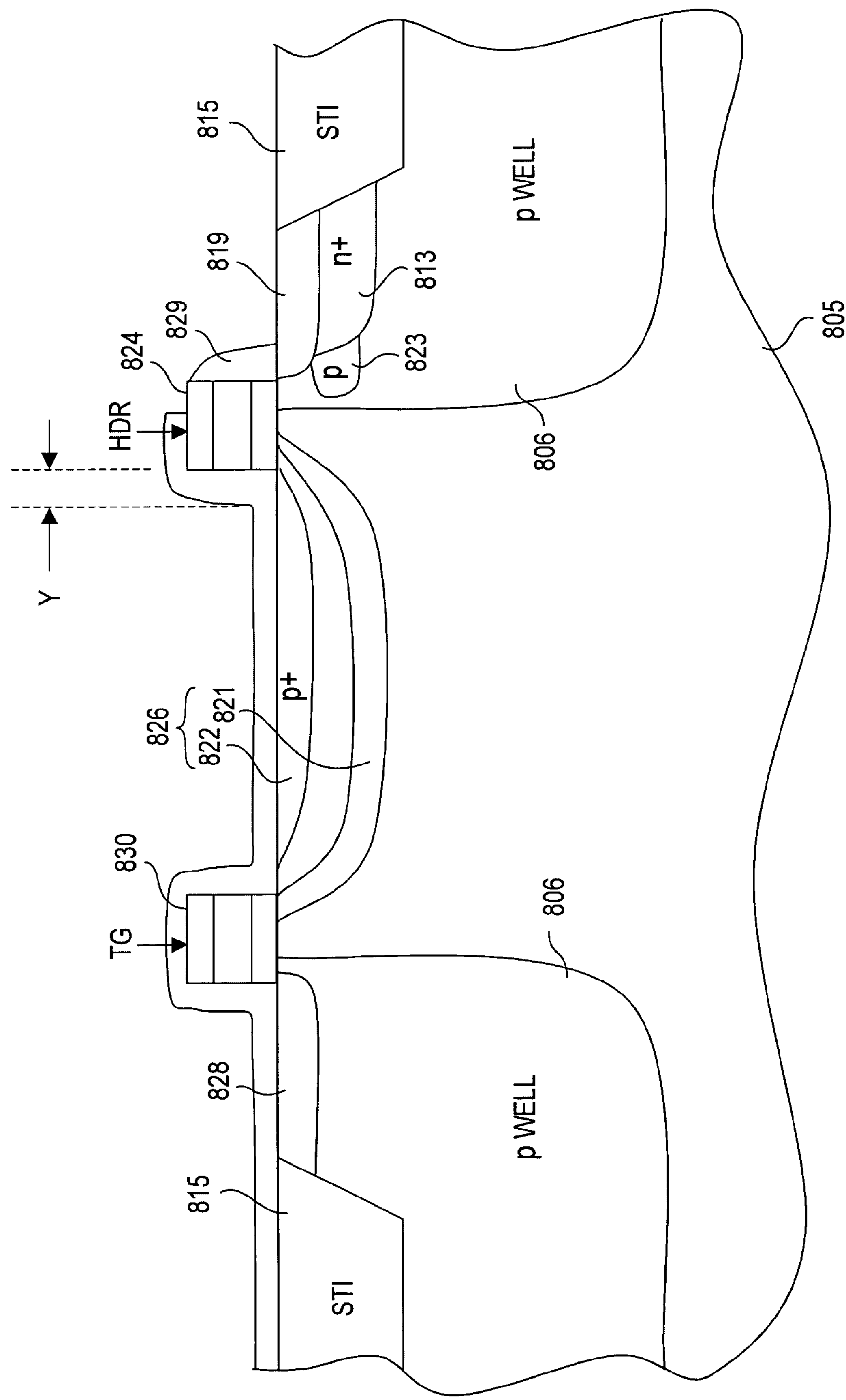

FIG. 39*d* illustrates the HDR transistor 824 having a charge collection region 819, a highly-doped drain region 813 and a punch-through protection implant 823, and a photosensor 826 with an overlying layer 822 shifted closer to the HDR transistor 824, as illustrated in FIG. 39*c*. However, the insulating layer 825 is etched over the HDR transistor 824 and a spacer wall 829 is formed on the charge collection region 819 side of the HDR transistor 824.

Conventional processing steps may be employed to form contacts and wiring to connect transistor gate and source and drain regions of the pixel cell of the present invention. For example, the entire surface may be covered with a passivation layer of, e.g., silicon dioxide, BSG, PSG, or BPSG, which is then planarized by chemical mechanical polishing. The passivation layer may then be etched to provide contact holes which are then metallized to provide contacts to the reset gate, transfer gate, source/drain regions and other pixel structures, as needed. Conventional multiple layers of conductors and insulators to other circuit structures may also be used to interconnect the internal structures of the pixel sensor cell and to connect the pixel cell structures to other circuitry associated with the pixel array.

Although the above embodiments have been described with reference to the formation of n-channel devices, it must be understood that the invention is not limited to this embodiment. Accordingly, the invention has equal applicability to p-channel devices formed within an n-type deep implanted region formed below a transistor array. Of course, the dopant and conductivity type of all structures will change accordingly.

Figure 1:
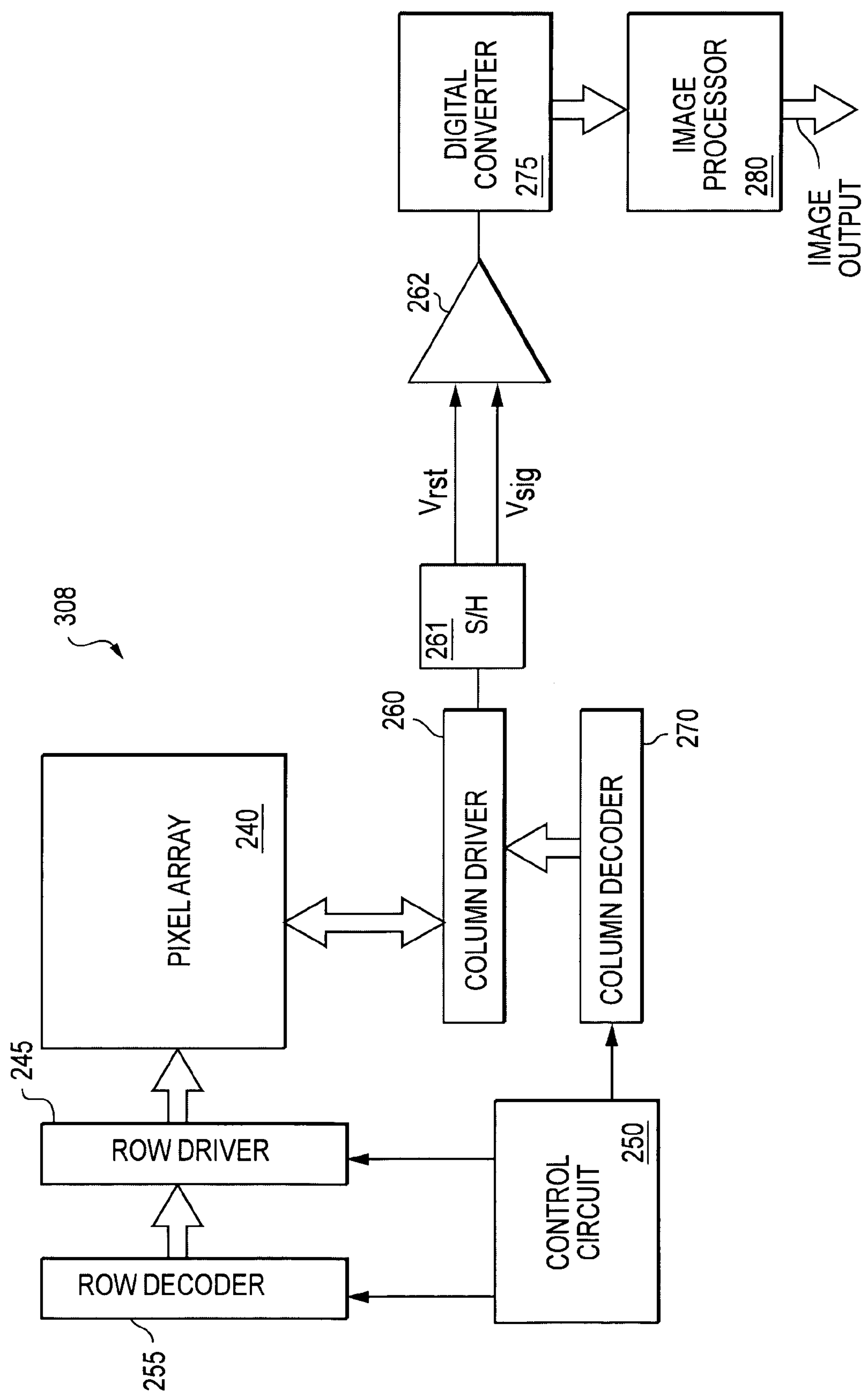
FIG. 1 is a block diagram of an imaging device.
Figure 2:
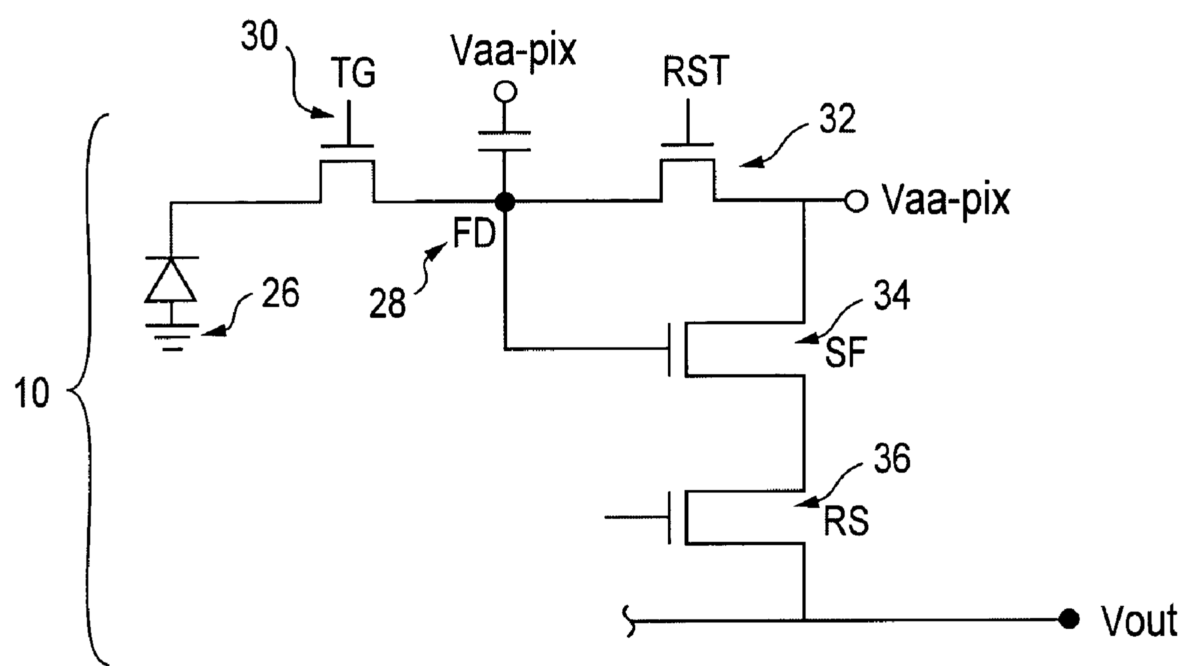
FIG. 2 is a schematic diagram of a four-transistor (4T) pixel.
Figure 41:
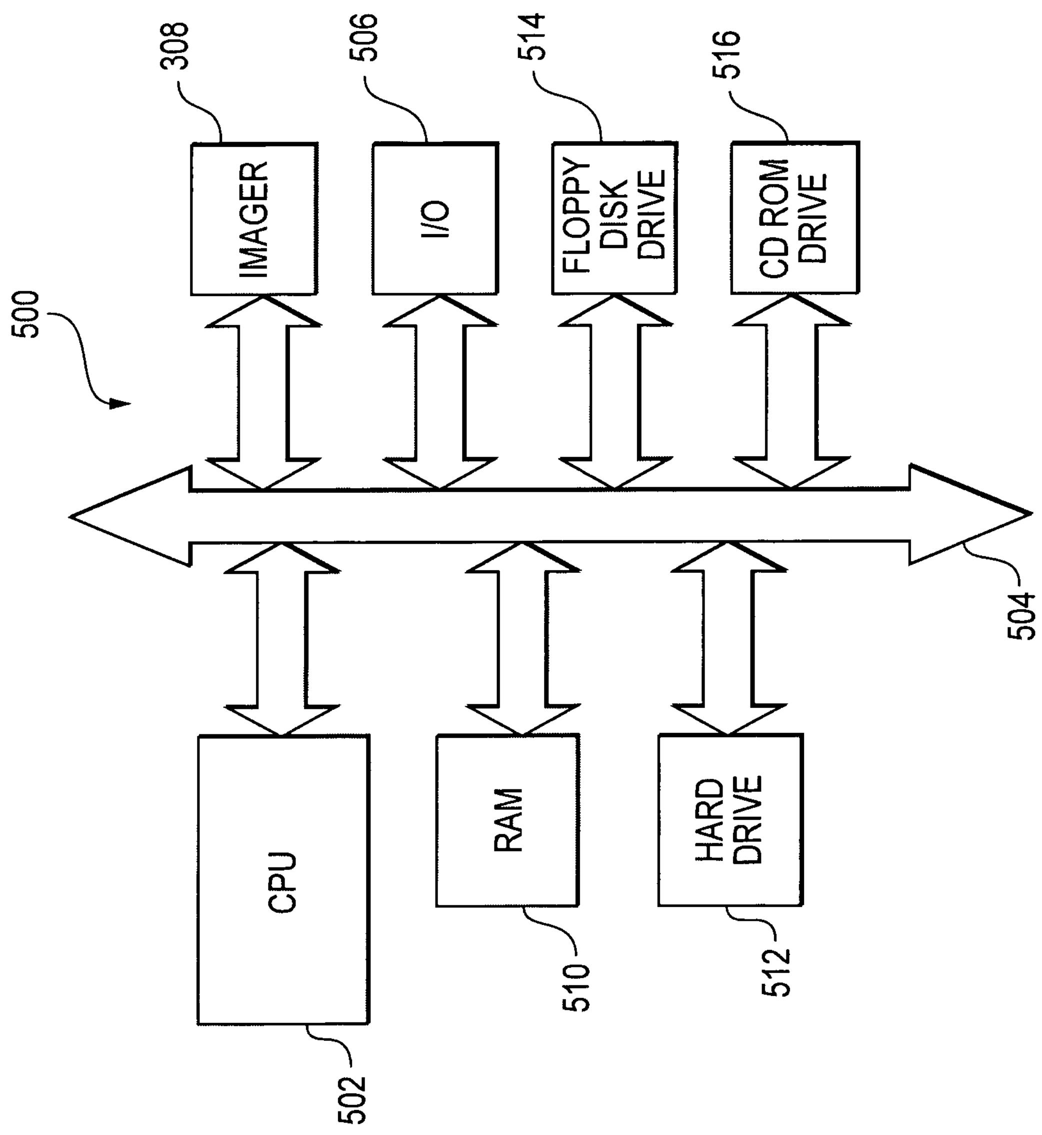
FIG. 41 shows a processor system incorporating at least one imager device constructed in accordance with an embodiment of the invention.

Five-transistor (5T) pixels of the present invention can be used in a pixel array 240 of the imager device 308 illustrated in FIG. 1. FIG. 41 shows a system 500, a typical processor-based system modified to include an imager device 308 as in FIG. 1 employing pixels of the present invention and an input device to the system 500. The imager device 308 may also receive control or other data from system 500 as well. Examples of processor-based systems, which may employ the imager device 308, include, without limitation, computer systems, camera systems, scanners, machine vision systems, vehicle navigation systems, video telephones, surveillance systems, auto focus systems, star tracker systems, motion detection systems, image stabilization systems, and others.

System 500 includes a central processing unit (CPU) 502 that communicates with various devices over a bus 504. Some of the devices connected to the bus 504 provide communication into and out of the system 500, illustratively including an input/output (I/O) device 506 and imager device 308. Other devices connected to the bus 504 provide memory, illustratively including a random access memory system (RAM) 510, hard drive 512, and one or more peripheral memory devices such as a floppy disk drive 514 and compact disk (CD) drive 516. The imager device 308 may be combined with a processor, such as a CPU, digital signal processor, or microprocessor, in a single integrated circuit. The imager device 308 may be a CCD imager or CMOS imager constructed in accordance with any of the illustrated embodiments.

The above description and drawings are only to be considered illustrative of exemplary embodiments which achieve the features and advantages of the invention. Modification of, and substitutions to, specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A pixel cell comprising:

a photosensor for producing photo-generated charges during an integration period, wherein said photosensor comprises a first layer of a first conductivity type formed over a second layer of a second conductivity type, said first conductivity type being different from said second conductivity type;

a transistor directly coupled to said photosensor for draining charges away from said photosensor to a doped region formed on a first side of said transistor, wherein said photosensor is formed on a second side of said transistor opposite to said first side of said transistor, said first layer of said photosensor having a position relative to a gate of said transistor such that said position affects an amount of charges being drained through said transistor; and a transfer transistor coupled to said photosensor for transferring charges from said photosensor after completion of said integration period.

2. The pixel cell of claim 1, wherein the pixel cell is a CMOS imager pixel cell,

3. The pixel cell of claim 2, wherein the CMOS imager pixel cell is one of 3T, 4T, 5T, 6T, or 7T architectures.

4. The pixel cell of claim 1, wherein the photosensor is one of a pn or np photodiode.

5. The pixel cell of claim 1, wherein the photosensor is a pinned photodiode.

6. The pixel cell of claim 5, wherein the pinned photodiode is a pnp or an npn photodiode.

7. The pixel cell of claim 1, wherein the photosensor is a photogate.

8. The pixel cell of claim 1, wherein the photosensor is a photoconductor.

9. The pixel cell of claim 1, wherein the transistor is an n-channel transistor.

10. The pixel cell of claim 1, wherein the transistor is a p-channel transistor.

11. The pixel cell of claim 1, wherein the doped region has a net n-type concentration.

12. The pixel cell of claim 1, wherein the doped region has a net p-type concentration.

13. The pixel cell of claim 1, wherein the doped region is coupled to a voltage source terminal.

14. The pixel cell of claim 3, wherein the CMOS imager architecture is a shared-row or a shared-column architecture, or both.

15. The pixel cell of claim 1, wherein said transistor for draining charges is operable to reset said photosensor.

16. The pixel cell of claim 1, further comprising a circuit for supplying a voltage to said gate of said transistor during at least a portion of said integration period.

17. The pixel cell of claim 1, further comprising a circuit for supplying a voltage to said doped region during at least a portion of said integration period.

18. The pixel cell of claim 1, further comprising a circuit for supplying a voltage of greater than 0.0 V to said gate of said transistor during at least a portion of said integration period.

19. The pixel cell of claim 1, further comprising a circuit for supplying a voltage to said gate of said transistor after said integration period.

20. The pixel cell of claim 1, further comprising a circuit for supplying a voltage to said gate of said transistor before said integration period.

21. The pixel cell of claim 1, wherein said transistor has a doping profile of a transfer transistor.

22. The pixel cell of claim 1, wherein said transistor has a doping profile of a reset transistor.

23. The pixel cell of claim 1, wherein said doped region comprises a first implanted region of a first dopant concentration adjacent to a second implanted region of a second dopant concentration, said second implanted region having a greater depth than said first implanted region.

24. The pixel cell of claim 1, wherein said transfer transistor is located on a side of said photosensor which is opposite to a side where said transistor is located.

25. The pixel cell of claim 1, wherein said transfer transistor is formed on a side of said photosensor which is perpendicular to a side where said transistor is located.

26. The pixel cell of claim 1 wherein said transistor is positioned such that said transistor and said transfer transistor are on a same side of said photosensor.

27. The pixel cell of claim 1, wherein said first layer of said photosensor is directly adjacent to said transistor.

28. The pixel cell of claim 1, wherein said first layer of said photosensor is displaced from said gate of said transistor by a distance.

29. The pixel cell of claim 1, wherein a portion of said first layer of said photosensor is positioned in a channel region under said gate of said transistor.

30. The pixel cell of claim 1, wherein a portion of said second layer of said photosensor is positioned in a channel region under said gate of said transistor.

31. The pixel cell of claim 5, wherein said second layer of said pinned photodiode is a charge collection region.

32. An imaging device comprising a pixel array, at least one pixel cell of said array comprising:

a photosensor for accumulating charge during an integration period, wherein said photosensor comprises a first layer formed above a second layer, a conductivity type of said first layer being different from a conductivity type of said second layer;

a transistor directly coupled to said photosensor for controlling an amount of charges being drained away from said photosensor, wherein said amount of charges being drained is controlled at least by a position of said first layer of said photosensor relative to a gate of said transistor, said photosensor being formed on a first side of said transistor;

a doped region formed on a second side of said transistor opposite to said first side, wherein said doped region comprises a first implanted region of a first dopant concentration adjacent to a second implanted region of a second dopant concentration; and a transfer transistor coupled to said photosensor for transferring charges from said photosensor to a floating diffusion region.

33. The device of claim 32, wherein the pixel cell is one of 3T, 4T, 5T, 6T, or 7T architectures.

34. The device of claim 32, wherein the architecture of said device is a shared row or a shared column architecture, or both.

35. The device of claim 32, further comprising a circuit for supplying a voltage to said gate of said transistor during at least a portion of said integration period.

36. The device of claim 32, further comprising a circuit for supplying a voltage to said doped region during at least a portion of said integration period.

37. The device of claim 32, further comprising a circuit for supplying a voltage of greater than 0.0 V to said gate of said transistor during at least a portion of said integration period.

38. The device of claim 32, further comprising a circuit for supplying a voltage to said gate of said transistor at an end of said integration period.

39. The device of claim 32, further comprising a circuit for supplying a voltage to said gate of said transistor before said integration period.

40. The device of claim 32, wherein said transistor has a doping profile of a transfer transistor.

41. The device of claim 32, wherein said transistor has a doping profile of a reset transistor.

42. The device of claim 32, wherein said transfer transistor and said transistor are formed on a same side of said photo sensor.

43. The device of claim 32, wherein said transfer transistor is formed on a side of said photosensor which is perpendicular to a side of said photosensor where said transistor is formed.

44. The device of claim 32, wherein said transfer transistor is formed on a side of said photosensor which is opposite to a side of said photosensor where said transistor is formed.

45. The device of claim 32, wherein said first layer of said photosensor is directly adjacent to said transistor.

46. The device of claim 32, wherein said first layer of said photosensor is displaced from said gate of said transistor by a distance.

47. The device of claim 32, wherein a portion of said first layer of said photosensor is positioned under said gate of said transistor.

48. The device of claim 32, wherein said second implanted region of said doped region is below said first implanted region of said doped region.

49. An imaging device comprising an array of pixels, each pixel comprising:

a pinned photodiode for producing photo-generated charges during an integration period, said pinned photodiode comprising a first layer of a first conductivity type overlying a second layer of a second conductivity type;

a transfer transistor coupled to said pinned photodiode for transferring charges from said pinned photodiode after completion of said integration period, said transfer transistor being on a first side of said pinned photodiode;

a transistor directly coupled to said pinned photodiode for draining charges away from said pinned photodiode, said transistor being formed on a second side of said pinned photodiode, wherein a portion of said first layer of said pinned photodiode is formed below a gate of said transistor such that an amount of charges being drained away through said transistor is affected; and a drain region on a side of said transistor opposite to said pinned photodiode.

50. The device of claim 49, further comprising a circuit for supplying a voltage to said gate of said transistor during at least a portion of said integration period.

51. The device of claim 49, further comprising a circuit for supplying a voltage to said drain region during a portion of said integration period.

52. The device of claim 49, further comprising a circuit for supplying a voltage to said gate of said transistor to drain more charges away from said pinned photodiode during one portion of said integration period than another portion of said integration period.

53. The device of claim 49, further comprising a circuit for supplying a voltage to said gate of said transistor to drain less charges away from said pinned photodiode during one portion of said integration period than another portion of said integration period.

54. The device of claim 49, further comprising a circuit for supplying a voltage to said gate of said transistor to drain all of the charges away from said pinned photodiode after said integration period.

55. The device of claim 49, wherein said first side of said pinned photodiode is the same as said second side of said pinned photodiode.

56. The device of claim 49 wherein said first side of said pinned photodiode is opposite to said second side of said pinned photodiode.

57. The device of claim 49, wherein said first side of said pinned photodiode is perpendicular to said second side of said pinned photodiode.

* * * * *